United States Patent
Tsuchi

(10) Patent No.: US 7,154,332 B2
(45) Date of Patent: Dec. 26, 2006

(54) DIFFERENTIAL AMPLIFIER, DATA DRIVER AND DISPLAY DEVICE

(75) Inventor: Hiroshi Tsuchi, Tokyo (JP)

(73) Assignees: Nec Corporation, Tokyo (JP); Nec Electronics Corporation, Kanagawa (JP)

( * ) Notice: Subject to any disclaimer, the term of this patent is extended or adjusted under 35 U.S.C. 154(b) by 178 days.

(21) Appl. No.: 10/893,980

(22) Filed: Jul. 20, 2004

(65) Prior Publication Data

US 2005/0040889 A1   Feb. 24, 2005

(30) Foreign Application Priority Data

Jul. 23, 2003 (JP) ............................. 2003-278124
Jul. 15, 2004 (JP) ............................. 2004-209037

(51) Int. Cl.
*H03F 3/45* (2006.01)

(52) U.S. Cl. ....................... 330/255; 330/269

(58) Field of Classification Search ................ 330/255, 330/69, 257, 263, 269
See application file for complete search history.

(56) References Cited

U.S. PATENT DOCUMENTS 5,311,145 A   5/1994 Huijsing et al.

| | | | |
|---|---|---|---|
| 6,107,883 A * | 8/2000 | Xu | 330/253 |
| 6,208,208 B1 * | 3/2001 | Komatsu et al. | 330/255 |
| 6,911,858 B1 * | 6/2005 | Mori | 327/307 |

FOREIGN PATENT DOCUMENTS

| | | |
|---|---|---|
| JP | 6-326529 | 11/1994 |
| JP | 2001-156559 | 6/2001 |

OTHER PUBLICATIONS

Analog/Digital Hybrid System LSI (low voltage low power dissipation circuit technology), Baihuukan, p. 253.

\* cited by examiner

*Primary Examiner*—Henry Choe
(74) *Attorney, Agent, or Firm*—Young & Thompson

(57) ABSTRACT

A differential amplifier includes a differential amplifying stage and an output amplifying stage. The output amplifying stage includes a first transistor for pull-up, a second transistor for pull-down, a capacitor element, and switches. The first transistor for pull-up is connected across an output terminal and a high potential side power supply VDD and has a control terminal to which is connected a first differential output. The second transistor for pull-down is connected across the output terminal and a low potential side power supply VSS and has a control terminal to which is connected a second differential output. The switches interchangeably connect the capacitor element across the output terminal and the control terminal of the first transistor for pull-up or across the output terminal and the control terminal of the second transistor for pull-down.

57 Claims, 51 Drawing Sheets

FIG. 2

|  | ONE DATA OUTPUT PERIOD T1 (CHARGING) | ONE DATA OUTPUT PERIOD T2 (DISCHARGE) |
|---|---|---|
| SWITCH 111 | ON | OFF |
| SWITCH 112 | OFF | ON |

FIG . 6

|  | ONE DATA OUTPUT PERIOD T1 (CHARGING) | ONE DATA OUTPUT PERIOD T2 (DISCHARGE) |
|---|---|---|
| SWITCH 212, 213 | OFF | ON |
| SWITCH 211, 214 | ON | OFF |

FIG. 7

|  | ONE DATA OUTPUT PERIOD T1 (CHARGING) | ONE DATA OUTPUT PERIOD T2 (DISCHARGE) |
|---|---|---|
| SWITCH 212, 213 | ON | OFF |
| SWITCH 211, 214 | OFF | ON |

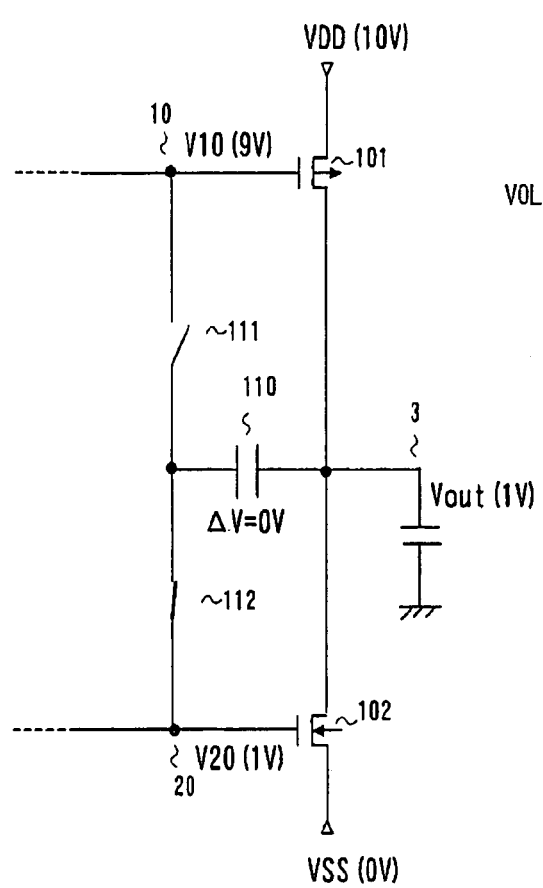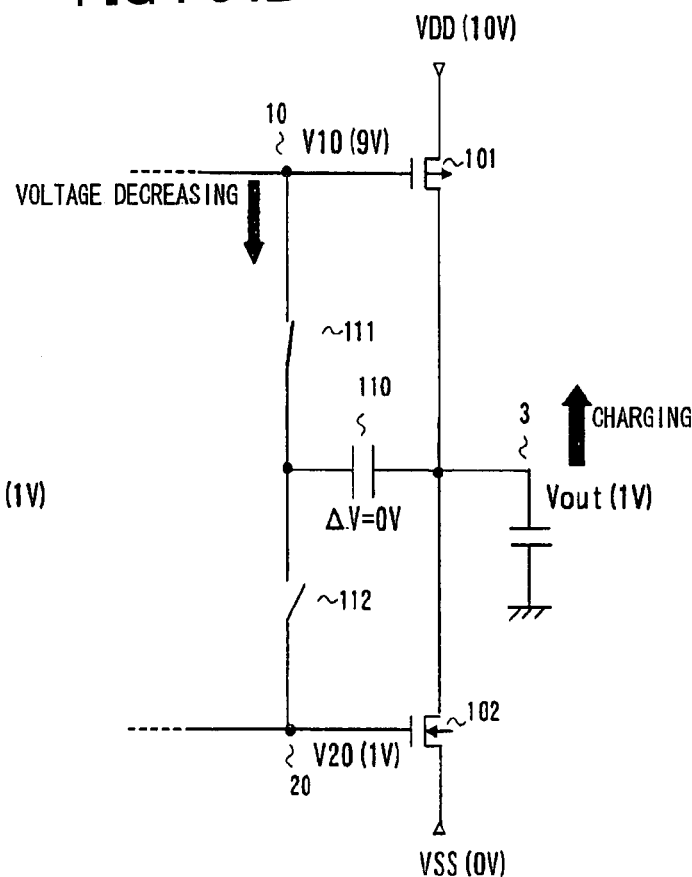

DIFFERENTIAL AMPLIFIER, DATA DRIVER AND DISPLAY DEVICE

FIELD OF THE INVENTION

This invention relates to a differential amplifier and a display device employing the same.

BACKGROUND OF THE INVENTION

Recently, as a display device, a liquid crystal display device (LCD), featured by a thin thickness, a light weight and low power dissipation, has come into extensive use, and is widely used for a display unit of mobile equipment, such as mobile phone, PDA (personal digital assistant) or a notebook PC (personal computer). However, the technique for enlarging the display size of the display device or coping with a moving picture has made progress, such that a stationary large-size display device or a large display size liquid crystal television receiver has now been offered to the market. As the liquid crystal display device, a liquid crystal display device of an active matrix driving system, capable of high definition display, is currently used.

FIG. 28 illustrates a liquid crystal display device. It is noted that FIG. 28 shows only an equivalent circuit of the main structure connected to a pixel of the display unit. Referring to FIG. 28, the liquid crystal display device of the active matrix driving system is briefly described. In general, a display unit 960 of a liquid crystal display device of the active matrix driving system is made up by a semiconductor substrate, a counter substrate, having a transparent electrode 966 formed on its entire surface, and a liquid crystal enclosed between the semiconductor substrate and the counter substrate. The semiconductor substrate carries plural transparent electrodes 964 and plural thin-film transistors (TFTs), arranged in a matrix configuration. In the case of, for example, a color SXGA panel, the display unit 960 is formed by 1280×3 pixel rows and 1024 pixel columns. For image display, the TFT 963, having a switching function, is controlled by a scanning signal, the grayscale voltage, corresponding to a video signal, is applied to the pixel electrode 964 when the TFT 963 is turned on, the transmittance of the liquid crystal is changed, based on the potential difference between the pixel electrode 964 and the counter substrate electrode(common electrode) 966, and the electric potential difference is maintained for a preset interval by a capacitance 965 of the liquid crystal. On the semiconductor substrate, a plurality of data lines 962 each supplying plural level voltages (grayscale voltage) to be applied to the pixel electrode 964, and a plurality of scanning lines 961 each supplying a scanning signal are interconnected in a lattice form. In the case of the aforementioned color SXGA panel, the there are provided 1280×3 data lines and 1024 scanning lines. The data line and the scanning line represent a significant capacitive load by the capacitance generated at the intersection and the capacitance of the liquid crystal sandwiched between the substrates. Meanwhile, the scanning signal is supplied by a gate driver 970 to the scanning line 961, while the grayscale voltage is supplied to each pixel electrode 964 via a data line 962 from the data driver 980. Re-writing of one frame data occurs every frame period (1/60 second) and each scanning line sequentially selects each pixel row, while each data line supplies the grayscale voltage during the selection period. It is noted that, while the gate driver 970 only has to supply at least binary-level scanning signals, while the data driver 980 has to drive the data line, as a large capacitive load, with the grayscale voltage of a high voltage accuracy, at a high speed. Hence, a differential amplifier of a high driving ability is preferentially used for the buffer unit of the data driver 980. For this differential amplifier, a rail-to-rail differential amplifier, in which the power supply voltage range is substantially coincident with the dynamic range (driving voltage range) is used for reducing the power dissipation (for example, see the Patent Publications 1 and 2 and the Non-Patent Publication 1).

A conventional rail-to-rail differential amplifier is hereinafter explained. FIG. 29 shows a differential amplifier disclosed in for example the following Patent Publication 1. The Patent publication 1 is referred to in the Patent publication 2. The differential amplifier, shown in FIG. 29, is introduced in detain in the Non-Patent publication 1. The differential amplifier, shown in FIG. 29, is now described briefly.

Referring to FIG. 29, this differential amplifier has a differential amplifying stage made up by an N-channel differential pair 711, 712, driven by a current source 710, a P channel differential pair 721, 722, driven by a current source 720, a cascode current mirror circuit 71, formed by vertical transistor pairs 713, 714 and 715, 716, a cascode current mirror circuit 72, formed by vertical transistor pairs 723, 724 and 725, 726, and floating current sources 73 and 74, formed by transistors 731, 732 and 741, 742. The differential amplifier includes an output amplifying stage formed by a push-pull stage constituted by transistors 101 and 102. VDD and VSS denote the high potential side power supply and the low potential side power supply, respectively. An output of the N-channel differential pair 711, 712 is supplied to a current mirror circuit 71 (connection nodes of the transistor pair 713, 714 and a transistor pair 715, 716), while an output of the P-channel differential pair 721, 722 is entered to a current mirror circuit 72 (connection nodes of the transistor pair 723, 724 and a transistor pair 725, 726). The current mirrors 71 and 72 are connected by floating current sources 73 and 74. The control terminal of the transistor 101 of the output amplifying stage is connected to a connection node (terminal 10) of the drain of the transistor 716 as the first differential output terminal and the floating current source 74, while the control terminal of the transistor 102 is connected to a connection node (terminal 20) of the drain of the transistor 726 as the first differential output terminal and the floating current source 74. The gates of the transistors 731, 732, 741 and 742, as the floating current sources, are supplied with bias voltages V1, V2, V3 and V4, respectively. The gates of the transistors 712 and 722 are connected to the input terminal 1 to form a non-inverting input terminal, while the gates of the transistors 711 and 721 are connected to the input terminal 2 to form an inverting input terminal. The non-inverting input terminal 1 and the inverting input terminal 2 are supplied with voltages VinP and VinN, respectively.

The operation of the differential amplifier, shown in FIG. 29, is explained. The differential amplifier is in a steady state when the voltage VinP of the non-inverting input terminal is equal to the voltage VinN of the inverting input terminal. In the steady state, the current flowing through the transistors of the differential transistor pair of the same polarity is equal. The two current paths flowing from the current mirror circuit 71 through the floating current sources 73 and 74 to the current mirror circuit 72 are controlled to be constant by the floating current sources 73 and 74, respectively.

If the voltage VinP of the non-inverting input terminal is higher than the voltage VinN of the inverting input terminal, the current flowing through the N-channel differential pair 711, 712 is such that the current flowing through the transistor 711 is decreased, while the current flowing through the transistor 712 is increased. As the current flowing through the transistor 711 is decreased, the current through the transistor 713 is decreased and, by the current mirror circuit 71, the current flowing through the transistors 714 and 716 is decreased. At this time, the floating current source 74 tends to cause the same current as the steady state current from the connection node with the transistor 716 (terminal 10) towards the connection node with the transistor 726. Thus, the gate voltage of the transistor 101 is pulled down, such that the charging current from the power supply VDD to the output terminal 3 is increased by the transistor 101. On the other hand, the current flowing through the P channel differential pair 721, 722 is such that, when the voltage VinP of the non-inverting input terminal is higher than the voltage VinN of the inverting input terminal, the current flowing through the transistor 721 is increased, while that flowing through the transistor 721 is decreased. With the current flowing through the transistor 721 increasing, the current through the transistor 723 is increased and, by the current mirror circuit 72, the current flowing through the transistors 724 and 726 is increased. At this time, the floating current source 74 tends to cause the same constant current as the steady state current to flow from the connection node with the transistor 716 towards the connection node with the transistor 726. Thus, the gate voltage of the transistor 102 is pulled down, such that the discharge current from the output terminal 3 to the power supply VSS is decreased by the transistor 102, and hence the output voltage Vout is increased.

When the voltage VinP of the non-inverting input terminal becomes lower than the voltage VinN of the inverting input terminal, the current flowing through the transistors of the N-channel differential pair 711, 712 is such that the current flowing through the transistor 711 is increased, while that flowing through the transistor 712 is decreased. With the current flowing through the transistor 711 increasing, the current through the transistor 713 is increased and, by the current mirror circuit 71, the current flowing through the transistors 714 and 716 is increased. At this time, the floating current source 74 tends to cause the same constant current as the steady state current to flow from the connection node with the transistor 716 towards the connection node with the transistor 726. Thus, the gate voltage of the transistor 101 is pulled up, such that the charging current from the power supply VDD to the output terminal 3 is decreased by the transistor 101. On the other hand, the current flowing through the P channel differential pair 721, 722 when the voltage VinP of the non-inverting input terminal is lower than the voltage VinN of the inverting input terminal is such that the current flowing through the transistor 721 is decreased, while that flowing through the transistor 722 is increased. With the current flowing through the transistor 721 decreasing, the current through the transistor 723 is also decreased and, by the current mirror circuit 72, the current flowing through the transistors 724 and 726 is decreased. At this time, the floating current source 74 tends to cause the same constant current as the steady state current to flow from the connection node with the transistor 716 towards the connection node with the transistor 726. Thus, the gate voltage of the transistor 102 is pulled up, such that the discharge current from the output terminal 3 to the power supply VSS is increased by the transistor 102, and hence the output voltage Vout is decreased.

In case the differential amplifier shown in FIG. 29 is used as a buffer unit of the data driver, the inverting input terminal 2 and the output terminal 3 are connected common in a voltage follower configuration. The grayscale voltage, corresponding to the video signal, is supplied to the non-inverting input terminal 1 of the differential amplifier. The grayscale voltage is subjected to current amplification and output at the output terminal 3 to drive the data line.

In the following Patent publication 2, the structure shown in FIG. 30 is proposed as a high slew rate differential amplifier employing the differential amplifier shown in FIG. 29. FIG. 30 depicts a differential amplifier designed to achieve high speed as the increase of the power dissipation is suppressed to the smallest value possible.

Referring to FIG. 30, the high slew rate differential amplifier circuit is featured by including subsidiary current source circuits 75, 76, in parallel with the current sources 710, 720 of the differential stage. The subsidiary current source circuit 75 includes a series connection of a current source 750 and a transistor 751. The gate of the transistor 751 is connected common to the gate of the transistor 102 of the push-pull output stage. The subsidiary current source circuit 76 includes a series connection of a current source 760 and a transistor 761. The gate of the transistor 761 is connected common to the gate of the transistor 101 of the push-pull output stage. Turning to the operation of the subsidiary current source circuits 75, 76, the gate voltages of the transistors 101 and 102 of the push-pull output stage are changed during the charging and discharging operations of the transistors 101 and 102 of the push-pull output stage. That is, the transistors 751 or 761 are turned on to increase the current flowing through the differential stage by an amount corresponding to that of the current sources 750 or 760. Thus, the current flowing through the differential stage is increased only at the time of the charging or discharging operations, as the current consumption under the steady state with the constant output is suppressed, thereby enabling the high speed operation.

[Patent Document 1]
Japanese Patent Kokai Publication No. JP-A-6-326529 (FIG. 1)

[Patent Document 2]
Japanese Patent Kokai Publication No. JP-P2001-156559A (FIG. 1)

[Non-Patent Document 1]
'Analog/Digital Hybrid System LSI (low voltage low power dissipation circuit technology)', Baihuukan, pp. 253

SUMMARY OF THE DISCLOSURE

Recently, the liquid crystal display device tends to be of fine-size and large display surface and, in keeping up therewith, the load capacitance of the data line is increasing. In a stationary large surface display device, the useful life of the battery is not crucial and hence a high speed operation rather than the suppression of the power dissipation is required of the differential amplifier used in a buffer unit of the data driver, in keeping with the increase in the definition or in the display surface.

It is therefore an object of the present invention to provide a differential amplifier capable of performing a sufficiently high-speed operation against the data line load of the increased capacitance imposed by the increased size of the display device.

On the other hand, in the large surface display device for mobile use, such as notebook PC, the useful life of the battery also plays an important role, and hence a high speed operation under suppression of power dissipation is required of the differential amplifier used in the buffer unit of the data driver. However, the conventional differential amplifier suffers from a drawback that, if the high operating speed is to be realized as the stable operation is maintained, the power dissipation is increased. The reason is that, as discussed in the Patent Publication 2, the slew rate in driving the external load by the differential amplifier in need of the large dynamic range is proportional to the current intensity of the differential pair and inversely proportional to the capacitance of the phase compensation capacity.

Thus, there persists a problem that, even though the current flowing through the differential pair needs to be increased or the phase compensation capacity needs to be decreased to improve the slew rate, the current consumption is increased if the current through the differential pair is increased, while stability is lost if the phase compensation capacity is decreased.

With the structure shown in FIG. 30 (the aforementioned Patent Publication 2), the time period during which the current supplied to the differential pair is increased is limited to the charging time duration or the discharge time duration to suppress the increase in the power dissipation to the possible minimum to achieve a high slew rate.

However, even with the differential amplifier, shown in FIG. 30, the average value of the current consumption is increased, if the charging and discharging operations are carried out frequently, thus increasing the power dissipation. In particular, if the liquid crystal display device is to be improved in definition or increased in size, not only the load capacitance but also the driving frequency of the data line is increased, as a result of which the charging and discharging operations are carried out frequently to increase the power dissipation.

It is therefore another object of the present invention to provide a differential amplifier capable of operating at a high speed, against a data line load of a high capacitance, caused by the tendency to high definition display and a large display surface of the liquid crystal display device, as the power dissipation is suppressed. It is a further object of the present invention to provide a differential amplifier capable of operating at a high speed, even if the charging and discharging operations are carried out frequently, as the power dissipation is suppressed.

It is yet another object of the present invention to provide a differential amplifier, capable of decreasing the power dissipation, for a medium to small-size liquid crystal display device, with not so high data line load capacitance or driving frequency, as a preset driving speed is maintained.

The above and other objects are attained by an amplifying circuit in accordance with one aspect of the present invention, which is a differential amplifier comprising a differential amplifying stage including a non-inverting input terminal, an inverting input terminal, a first differential output terminal and a second differential output terminal, and an output amplifying stage including an output terminal. The output amplifying stage further includes: a first transistor connected across the output terminal and a first power supply and having a control terminal connected to the first differential output terminal, a second transistor connected across the output terminal and a second power supply and having a control terminal connected to the second differential output terminal, a capacitor element, and a capacitor connection control circuit for interchangeably switching at least between a first connection state in which the capacitor element is connected across the output terminal and the control terminal of the first transistor and a second connection state in which the capacitor element is connected across the output terminal and the control terminal of the second transistor.

In the differential amplifier, according to the present invention, the connection of the capacitor element is changed over when the differential output signals of the differential amplifying stage are changed and before the differential output signals from the differential amplifying stage to the control terminals of the first and second transistors are finally determined, whereby the voltage at the control terminal of the one of the first and second transistors which is changed over from an off state to an on state is changed in a direction which turns the one transistor on, thereby accelerating the charging or the discharging by the one transistor.

In the differential amplifier, according to the present invention, the state of connection of the capacitor element across the output terminal and one of the control terminals of the two transistors of the push-pull output stage of the differential amplifier is switched to the state of connection of the capacitor element across the output terminal and the other of the control terminals of the two transistors, and vice versa, thereby producing the bootstrap action to realize high speed driving without increasing the power dissipation.

In the differential amplifier, according to the present invention, the capacitor connection control circuit includes means for switching, in a controlled manner, between a first connection state in which a first terminal and a second terminal of the capacitor element are connected to a control terminal of the first transistor and to the output terminal, respectively, and a second connection state in which the first terminal and the second terminal of the capacitor element are connected to a control terminal of the second transistor and to the output terminal, respectively.

In the differential amplifier, according to the present invention, the capacitor connection control circuit includes means for switching, in a controlled manner, between a first connection state in which a first terminal and a second terminal of the capacitor element are connected to a control terminal of the first transistor and to the output terminal, respectively, and a second connection state in which the first terminal and the second terminal of the capacitor element are connected to the output terminal and to the control terminal of the second transistor, respectively.

According to the present invention, the capacitor element performs phase compensation in addition to the bootstrap action.

According to the present invention, the capacitor connection control circuit includes, as explained hereinafter as a preferred embodiment, a first capacitor element (110), a first switch (111) inserted across a first terminal of the first capacitor element and a control terminal (10) of the first transistor (101), and a second switch (112) inserted across the first terminal of the first capacitor element (110) and a control terminal (20) of the second transistor (102), a second terminal of the capacitor element is connected to the output terminal, the first switch and the second switch are turned on and off, respectively, during the charging period of the output terminal, and the first switch and the second switch are turned off and on, respectively, during the discharging period of the output terminal.

According to the present invention, the capacitor connection control circuit includes, as explained hereinafter as a preferred embodiment, a first capacitor element (210), a first switch (211) inserted across a first terminal of the first capacitor element and a control terminal (10) of the first transistor (101), a second switch (212) inserted across a second terminal of the first capacitor element and a control terminal (20) of the second transistor (102), a third switch (213) inserted across the first terminal of the first capacitor element (210) and the output terminal (3) and a fourth switch (214) inserted across the second terminal of the first capacitor element and the output terminal (3), wherein, during the charging period of the output terminal, the first and fourth switches are turned on and the second and third switches are turned off, and,during the discharging period of the output terminal, the first and fourth switches are turned off and the second and third switches are turned on.

According to the present invention, the capacitor connection control circuit includes, as explained hereinafter as a preferred embodiment, a first capacitor element (210), a first switch (211) inserted across a first terminal of the first capacitor element and a control terminal (10) of the first transistor (101), a second switch (212) inserted across a second terminal of the first capacitor element and a control terminal (20) of the second transistor (102), a third switch (213) inserted across the first terminal of the first capacitor element (210) and the output terminal (3) and a fourth switch (214) inserted across the second terminal of the first capacitor element and the output terminal (3), wherein, during the charging period of the output terminal, the first and fourth switches are turned off and the second and third switches are turned on and, during the discharging period of the output terminal, the first and fourth switches are turned on and the second and third switches are turned off.

According to the present invention, the differential amplifying stage includes a first constant current source connected to a high potential side power supply, a first differential pair composed by a transistor pair of a first conductivity type, driven by the first constant current source, and differentially receiving the voltage from an input pair constituting the non-inverting input terminal and the inverting input terminal, a first load circuit connected to an output pair of the first differential pair, a second constant current source connected to a low potential side power supply, a second differential pair composed by a transistor pair of a second conductivity type, driven by the second constant current source, and differentially receiving the voltage from an input pair forming the non-inverting input terminal and the inverting input terminal, and a second load circuit connected to an output pair of the second differential pair. Output terminals of the first and second load circuits are the second and first differential output terminals of the differential amplifying stage. There may be provided coupling means, such as a floating current source, interconnecting the respective output terminals of the first and second load circuits. Specifically, the first and second load circuits are formed by first and second current mirror circuits, formed by transistors of the second and first conductivity types. Or, the first load circuit is formed by a first cascode type current mirror circuit formed by transistors of the second conductivity type, the second load circuit is formed by a second cascode type current mirror circuit formed by transistors of the first conductivity type, input terminals of the first and second cascode type current mirror circuits are coupled together via a first floating current source, output terminals of the first and second cascode type current mirror circuits are coupled together via a second floating current source, and control terminals of said second and first transistors of the output amplifying stage are connected to a connection node of the output terminal of the first cascode type current mirror circuit and the second floating current source and to a connection node of the output terminal of the second cascode type current mirror circuit and the second floating current source.

According to the present invention, a capacitor element may be provided apart from the aforementioned first capacitor element, there may be provided second and third capacitor elements, each having one terminal connected to the output terminal and having the other terminal connected to one of control terminals of said first and second transistors of the output amplifying stage, or each having one terminal connected to the output terminal and having the other terminal connected to one of output pairs comprising the aforementioned second and first differential pairs.

A data driver of the display device, according to a further aspect of the present invention, as means for solving the above problem, includes the aforementioned differential amplifier as a buffer unit.

A data driver in a further aspect of the present invention comprises the aforementioned differential amplifier according to the present invention, as a buffer unit, wherein the control for connection switching between the first connection state and the second connection state is managed depending on a polarity signal.

A display device in a further aspect of the present invention comprises the aforementioned differential amplifier according to the present invention, as a data line driving circuit.

A differential amplifier in accordance with still another aspect of the present invention may comprises:

a differential amplifying stage including: a non-inverting input terminal; an inverting input terminal; a first differential output terminal; and a second differential output terminal; and an output amplifying stage including: an output terminal; a first transistor connected across said output terminal and a first power supply for charging said output terminal based on a signal from said first differential output terminal;

a second transistor connected across said output terminal and a second power supply for discharging said output terminal based on a signal from said second differential output terminal;

a capacitor element; and a capacitor connection control circuit for interchangeably switching at least between a first connection state in which said capacitor element is connected across said output terminal and said first differential output terminal and a second connection state in which said capacitor element is connected across said output terminal and said second differential output terminal.

A differential amplifier in accordance with yet another aspect of the present invention may comprises: a differential amplifying stage; output stage; at least a capacitor element; and a capacitor connection control circuit;

wherein said differential amplifying stage comprises:

a first current source connected to a high potential side power supply;

a first differential pair composed by a transistor pair of a first conductivity type, driven by said first current source, and differentially receiving the voltage from an input pair constituting said non-inverting input terminal and the inverting input terminal;

a first load circuit connected to an output pair of said first differential pair and constituted by a first cascode current mirror circuit;

a second current source connected to a low potential side power supply;

a second differential pair composed by a transistor pair of a second conductivity type, driven by said second current source, and differentially receiving the voltage from an input pair constituting said non-inverting input terminal and the inverting input terminal; and a second load circuit connected to an output pair of said second differential pair and constituted by a second cascode current mirror circuit;

an output amplifying stage including:

wherein said output stage comprises:

a first transistor connected across said output terminal and a first power supply for charging the output terminal based on an output of said second load circuit; and a second transistor connected across said output terminal and a second power supply for discharging the output terminal based on an output of said first load circuit; and wherein said capacitor connection control circuit for interchangeably switches at least between a first connection state in which said capacitor element is connected to one of connection nodes at which adjacent current mirror circuits provided in said second cascode current mirror circuit are connected each other, and a second connection state in which said capacitor element is connected to one of connection nodes at which adjacent current mirror circuits provided in said first cascode current mirror circuit are connected each other.

The meritorious effects of the present invention are summarized as follows.

According to the present invention, the state of connection of the capacitor element across the output terminal and one of the control terminals of the two transistors of the push-pull output stage of the differential amplifier is switched to the state of connection of the capacitor element across the output terminal and the other of the control terminals of the two transistors, and vice versa, thereby producing the bootstrap action to realize high speed driving without increasing the power dissipation.

Moreover, according to the present invention, the power dissipation may be decreased in the differential amplifier having a preset driving ability.

In addition, according to the present invention, the high-speed operation may be achieved, as the power dissipation is suppressed, even if the charging and discharging operations are carried out frequently.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 shows an example of switch on/off control in the first embodiment of the present invention.

FIG. 6 shows an example of switch on/off control in the second embodiment of the present invention.

FIG. 7 shows another example of switch on/off control in the second embodiment of the present invention.

FIG. 32A illustrates the connection and the voltage directly previous to switching (discharging period) and FIG. 32B illustrates the connection and the voltage following the switching (charging period).

FIG. 33B shows the voltage waveform at a control terminal of the push-pull output stage in FIG. 33A.

FIGS. 34A and 34B illustrate the operation of the embodiment of FIG. 1 by switch control of FIG. 2, where FIG. 34A illustrates the connection and the node voltage previous to switching (stable state of the discharging operation) and FIG. 34B illustrates the connection and the node voltage directly after switching to the charging operation.

FIG. 36B shows the voltage waveform of the control terminal of the push-pull output stage of FIG. 36A.

FIG. 37A illustrates the connection and the node voltage previous to switching (stable state of the discharging operation) and FIG. 37B illustrates the connection and the node voltage directly after switching to the charging operation.

FIG. 39B shows the voltage waveform of the control terminal of the push-pull output stage of FIG. 39A.

FIG. 40A illustrates the connection and the node voltage previous to switching (stable state of the discharging operation) and FIG. 40B illustrates the connection and the node voltage directly after switching to the charging operation.

FIG. 42B shows the voltage waveform of the control terminal of the push-pull output stage of FIG. 42A.

FIG. 44B shows the voltage waveform of the control terminal of the push-pull output stage of FIG. 44A.

FIG. 45B shows the voltage waveform of the control terminal of the push-pull output stage of FIG. 45A.

FIG. 46B shows the voltage waveform of the control terminal of the push-pull output stage of FIG. 46A.

PREFERRED EMBODIMENTS OF THE INVENTION

Figure 1:
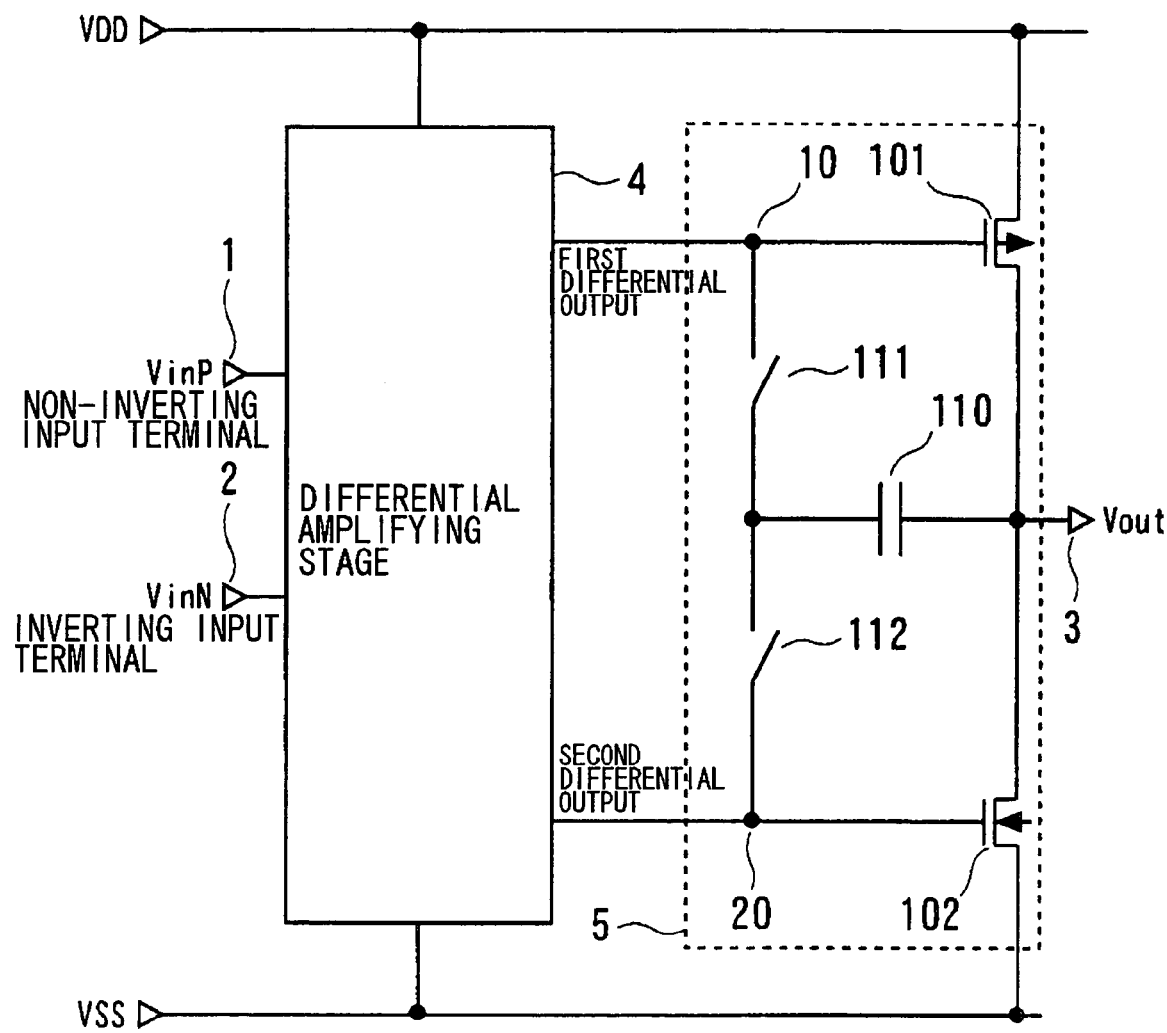
FIG. 1 shows the configuration of a first embodiment of the present invention.

The best mode for carrying out the present invention is now explained. The differential amplifier, according to a preferred embodiment of the present invention, is made up by a differential amplifying stage 4, including a non-inverting input terminal 1, an inverting input terminal 2, a first differential output terminal 10 and a second differential output terminal 20, and an output amplifying stage 5, including a P-channel transistor 101, connected across an output terminal 3 and a high potential side power supply VDD, and having a control terminal connected to the first differential output terminal 10, an N-channel transistor 102, connected across the output terminal 3 and a low potential side power supply VSS and having a control terminal connected to the second differential output terminal 20, and a capacitor element 110, having one end connected to the output terminal 3 and having the other end connected through switches 111 and 112 to the terminals 10 and 20. The differential amplifying stage 4 differentially receives signal voltages, applied to the input terminals 1, 2, to send a differentially amplified output to the differential output terminals 10 and 20. The output amplifying stage 5 is able to charge or discharge the output terminal 3, by the transistors 101 and 102, based on voltage changes at the differential output terminals 10 and 20. The capacitor element 110 and the switches 111 and 112 form a capacitor connection control circuit. To the output terminal 3 is connected an external load, not shown.

In the above differential amplifier, the capacitor element 110 is controlled so as to be changed over between a connection state in which the capacitor element 110 is connected across the terminal 10 and the output terminal 3 and a connection state in which the capacitor element 110 is connected across the terminal 20 and the output terminal 3. That is, the switches 111 and 112 are controlled at least so that, when one of the switches is on, the other switch is off. Specifically, during a data output period T1 for charging, the switches 111 and 112 are turned on and off, at the beginning of the output period, respectively, whereas, during another data output period T2 for discharge, the switches 111 and 112 are turned off and on, at the beginning of the output period, respectively.

Thus, during the data output period T1, the terminal 10 is pulled towards the low potential side, simultaneously with the switching of the connection of the capacitor element 110, so that the transistor 101 is instantly in operation to carry out a charging operation to a certain extent directly after the start of the data output period T1.

On the other hand, during the data output period T2, the terminal 20 is pulled towards the high potential side, simultaneously with the switching of the connection of the capacitor element 110, so that the transistor 102 is instantly in operation to carry out a discharging operation to a certain extent directly after the start of the data output period T2. Meanwhile, after the momentary charging or discharging operation, the transistors 101 and 102 are in operation, responsive to the output of the differential amplifying stage 4, to perform the usual differential amplifier operation. This sort of the operation is that of a bootstrap.

That is, the present invention realizes the speedup of the differential amplifier by taking advantage of the bootstrap in the output stage. By forcibly carrying out a charging operation or a discharging operation, at the beginning of an output period, by exploiting the bootstrap, high-speed driving may be achieved against a large dynamic range. In this manner, the high-speed operation may be achieved without increasing the current consumption.

It is noted that the capacitor element 110 not only exerts the speedup operation by bootstrap but also acts as a phase compensation capacitance to assure a stabilized output.

In another preferred embodiment of the differential amplifier, according to the present invention, a differential amplifying stage 4 includes a non-inverting input terminal 1, an inverting input terminal 2, a first differential output terminal 10 and a second differential output terminal 20, while an output amplifying stage 6 includes a P-channel transistor 101, an N-channel transistor 102 and a capacitor element 210. The P-channel transistor 101 is connected across the output terminal 3 and the high potential side power supply VDD and has a control terminal connected to the first differential output terminal 10, while the N-channel transistor 102 is connected across the output terminal 3 and the low potential side power supply VSS and has a control terminal connected to the second differential output terminal 20. The capacitor element 210 has one end connected via switches 211, 213 to the terminal 10 and to the output terminal 3, while having its other end connected via switches 212, 214 to the terminal 20 and to the output terminal 3. The differential amplifying stage 4 differentially receives signal voltages, applied to the input terminals 1, 2, to send a differentially amplified output to the differential output terminals 10 and 20. The output amplifying stage 6 is able to charge or discharge the output terminal 3, by the transistors 101 and 102, based on voltage changes at the differential output terminals 10 and 20. The capacitor element 210 and the switches 211 to 214 form a capacitor connection control circuit. To the output terminal 3 is connected an external load, not shown.

In the above differential amplifier, the capacitor element 210 is controlled so as to be changed over between a connection state in which the capacitor element 210 is connected across the terminal 10 and the output terminal 3 and a connection state in which the capacitor element 210 is connected across the terminal 20 and the output terminal 3. That is, the set of the switches 211 and 214 and the set of the switches 212 and 213 are controlled so that, when one of the sets is on, the other set is off. Specifically, during a data output period T1, or charging, the switches 211 and 214 are turned on, while the switches 212 and 213 are turned off. Thus, during the data output period T1, the terminal 10 is pulled towards the low potential side, simultaneously with the switching of the connection of the capacitor element 210, so that the transistor 101 is instantly in operation to carry out a charging operation to a certain extent directly after the start of the data output period T1. On the other hand, during the data output period T2, the terminal 20 is pulled towards the high potential side, simultaneously with the switching of the connection of the capacitor element 210, so that the transistor 102 is instantly in operation to carry out a discharging operation to a certain extent directly after the start of the data output period T2. Meanwhile, after the momentary charging or discharging operation, the transistors 101 and 102 are in operation, responsive to the output of the differential amplifying stage 4, to perform the usual differential amplifier operation. This sort of the operation is that of a bootstrap. That is, the present invention provides a speedup means for the differential amplifier exploiting the bootstrap. By forcibly carrying out a charging operation or a discharging operation, at the beginning of an output period, by exploiting the bootstrap, high-speed driving may be achieved against a large dynamic range. In this manner, the high-speed operation may be achieved without increasing the current consumption. Meanwhile, in the present embodiment, a similar favorable effect may be realized by interchanging the control for the set of the switches 211 and 214 and that for the set of the switches 212 and 213. It is noted that the capacitor element 210 not only exerts the speedup operation by bootstrap but also acts as a phase compensation capacitance to assure a stabilized output.

Meanwhile, in the driving of the external load, the driving accompanied by large voltage changes is time-consuming, while that accompanied by small voltage changes is inherently not time-consuming. Hence, in each of the above embodiments, the connection state of the capacitor element 110 or the capacitor element 210 may be changed during the driving accompanied by large voltage changes for speedup by exploiting bootstrap, while the connection state of the capacitor element 110 or the capacitor element 210 may not be changed for driving during the driving accompanied by small voltage changes.

Moreover, in each of the above embodiments, there is no necessity of increasing the current consumption during the charging and discharging operations, and hence the speedup may be achieved, as the power dissipation is suppressed, even though the charging and discharging operations are carried out frequently.

[Embodiment]

For more detailed explanation of the above-described embodiments, preferred embodiments of the present invention are now explained with reference to the drawings, in which the devices of the same structure or functional blocks performing the same functions are depicted by the same reference numerals. In the respective drawings, the transistors are insulated gate transistors, unless otherwise specified.

Referring to FIG. 1, a differential amplifier of a first embodiment of the present invention, is made up by a differential amplifying stage 4, including a non-inverting input terminal 1, an inverting input terminal 2, a first differential output terminal 10 and a second differential output terminal 20, and by an output amplifying stage (output driving stage) 5, including a P-channel transistor 101, connected across an output terminal 3 and a high potential side power supply VDD, and having a gate connected to the first differential output terminal 10, an N-channel transistor 102, connected across the output terminal 3 and a low potential side power supply VSS, and having a gate connected to the second differential output terminal 20, and a capacitor element 110, having one end connected to the output terminal 3 and having the other end connected via switches 111 and 112 to the terminals 10 and 20, respectively. The differential amplifying stage 4 differentially receives signal voltages, applied to the input terminals 1, 2, to send a differentially amplified output to the differential output terminals 10 and 20. The output amplifying stage 5 is able to charge or discharge the output terminal 3, by the transistors 101 and 102, based on voltage changes at the differential output terminals 10 and 20. The capacitor element 110 and the switches 111 and 112 form a capacitor connection control circuit. To the output terminal 3 is connected an external load (data line load), not shown. Instead of being a metal capacitance (interconnect capacitance), or gate capacitance, the capacitor element 110 may be provided with any suitable capacitive element.

Referring to FIG. 2 which illustrates the controlling method for the above differential amplifier, during a data output period T1 for charging, the switches 111 and 112 are turned on and off, at the beginning of the output period, respectively, whereas, during another data output period T2 for discharge, the switches 111 and 112 are turned off and on, at the beginning of the output period respectively.

The operation by the above control is explained. First, the operation at the time of transition from the output period T2 to the output period T1 is explained.

During the data output period T2, the capacitor element 110 is connected across the terminal 20 and the output terminal 3. It is assumed that, when the output period T2 is nearing its end, the state of a stable output has been reached. The gate-to-source voltage of each of the transistors 101 and 102 then is stabilized at a voltage close to a threshold voltage. The potentials of the terminals 10 and 20 are V10 and V20, respectively. On the other hand, since the discharging operation is taking place during the output period T2, it is assumed that the output voltage Vout=Vout2 is low and electric charge for maintaining the potential difference between the voltage Vout2 and the voltage V20 is stored in the capacitor element 110.

When the output period transfers to the output period T1, from this state, the one end of the capacitor element 110, connected to the terminal 20, is instantly connected to the terminal 10, such that the capacitor element 110 is switched to a state in which it is connected across the terminal 10 and the output terminal 3. Directly after switching the connection, the capacitor element 110 tends to maintain the potential difference, while the output terminal 3, connected to the large capacitance load (data line), tends to hold the voltage Vout2. Thus, the potential of the terminal 10, which is poor in the potential holding ability, is subjected to a voltage decreasing action which tends to decrease the voltage to a voltage V20 at one end of the capacitor element 110 directly before the connection switching. Hence, the potential at the terminal 10 is instantaneously pulled down, by the connection switching, so that the gate-to-source voltage of the transistor 101 is enlarged to produce a momentary charging operation for the output terminal 3. This is the bootstrap action by the connection switching of the capacitor element 110. Meanwhile, the voltage decreasing action of the terminal 10 becomes progressively moderate by, for example, the supply of electric charge from the differential amplifying stage 4 to the terminal 10 or the rise of the output voltage Vout caused by fluctuations at the terminal 10.

On the other hand, the differential amplifying stage 4 commences its operation, with the start of the output period T1, in dependence upon the differential voltage between the voltage at the non-inverting input terminal VinP and the inverting input terminal VinN. However, there is a response delay until an output thereof reaches the differential output terminals 10 and 20. The result is that the operation start timing of the output amplifying stage 5 by the output of the differential amplifying stage 4 is delayed as compared to that of the bootstrap charging which is in operation instantaneously with the start of the time T1, such that the charging operation by the output of the differential amplifying stage 4 is predominant over the bootstrap charging only when the bootstrap charging has proceeded partway. Consequently, the operation during transition from the output period T2 to the output period T1 of the differential amplifier is such that, with the start of the output period T1, the charging operation for the output terminal 3 occurs instantaneously by the bootstrap action to raise the output voltage Vout a certain value, after which there occurs the charging operation corresponding to the differential voltage of the non-inverting input terminal VinP and the inverting input terminal VinN.

Next, the operation at the time of transition from the output period T1 to the output period T2 is explained. During the output period T1, the capacitor element 110 is connected across the terminal 10 and the output terminal 3. It is assumed that, when the output period T1 is nearing its end, the state of a stable output has been reached. The gate-to-source voltage of each of the transistors 101 and 102 then is stabilized at a voltage close to a threshold voltage. The potentials of the terminals 10 and 20 are V10 and V20, respectively. On the other hand, since the charging operation is taking place during the output period T1, it is assumed that the output voltage Vout=Vout1 is high and electric charge for maintaining the potential difference between the voltage Vout1 and the voltage V10 is stored in the capacitor element 110.

When the output period undergoes transition from this state to the output period T2, the one end of the capacitor element 110, connected to the terminal 10, is instantly connected to the terminal 20, such that the capacitor element 110 is switched to a state in which it is connected across the terminal 20 and the output terminal 3. Directly after this switching connection, the capacitor element 110 tends to maintain the potential difference, while the output terminal 3, connected to the large capacitance load (data line), tends to hold the voltage Vout1. Thus, the potential of the terminal 20, which is poor in the potential holding ability, is subjected to a voltage increasing action which tends to pull up the voltage to a voltage V10 at one end of the capacitor element 110 directly before the connection switching.

Hence, the potential at the terminal 20 is instantaneously pulled up, by the connection switching, so that the gate-to-source voltage of the transistor 102 is enlarged to produce a momentary discharging operation for the output terminal 3. This is the bootstrap action by the connection switching of the capacitor element 110. Meanwhile, the voltage pull-up action of the terminal 20 is progressively moderated by, for example, the supply of electric charge from the differential amplifying stage 4 to the terminal 20 and the lowering of the output voltage Vout caused by fluctuations at the terminal 20.

On the other hand, the differential amplifying stage 4 commences its operation, with the start of the output period T2, in dependence upon the differential voltage between the voltage at the non-inverting input terminal VinP and the inverting input terminal VinN. However, there is a response delay until an output thereof reaches the differential output terminals 10 and 20. The result is that the operation start timing of the output amplifying stage 5 by the output of the differential amplifying stage 4 is delayed as compared to that of the bootstrap discharging which is in operation instantaneously with the start of the time T2, such that the discharging operation by changes in the output of the differential amplifying stage 4 is predominant over the bootstrap discharging only when the bootstrap discharging has proceeded partway. Consequently, the operation from the output period T1 to the output period T2 of the differential amplifier of FIG. 1 is such that, with the start of the output period T2, the discharging operation for the output terminal 3 occurs instantaneously by the bootstrap action to pull down the output voltage Vout a certain quantity, after which the discharging operation corresponding to the differential voltage of the non-inverting input terminal VinP and the inverting input terminal VinN is performed.

Thus, with the differential amplifier, described above with reference to FIG. 1, the bootstrap action occurs by the switch control of FIG. 2, such that the charging and discharging operation speedier than that possible with the conventional system may be achieved. Meanwhile, the speedup by the bootstrap action is more effective with the driving to a larger amplitude in which voltage changes of the output terminal voltage before and after switching between the charging and discharge are larger. Conversely, the speedup by the bootstrap action is not required with the driving to a smaller amplitude in which voltage changes of the output terminal voltage are smaller. In such case, the state of the switches is not changed to maintain the connection state of the capacitor element 110. The bootstrap action is then not produced and the driving at a smaller amplitude may be carried out by of the usual differential amplifier operation.

Moreover, with the differential amplifier, shown in FIG. 1, the high-speed operation may be realized, as the power dissipation is suppressed, even though the charging/discharging operations are carried out frequently.

Figure 32A:
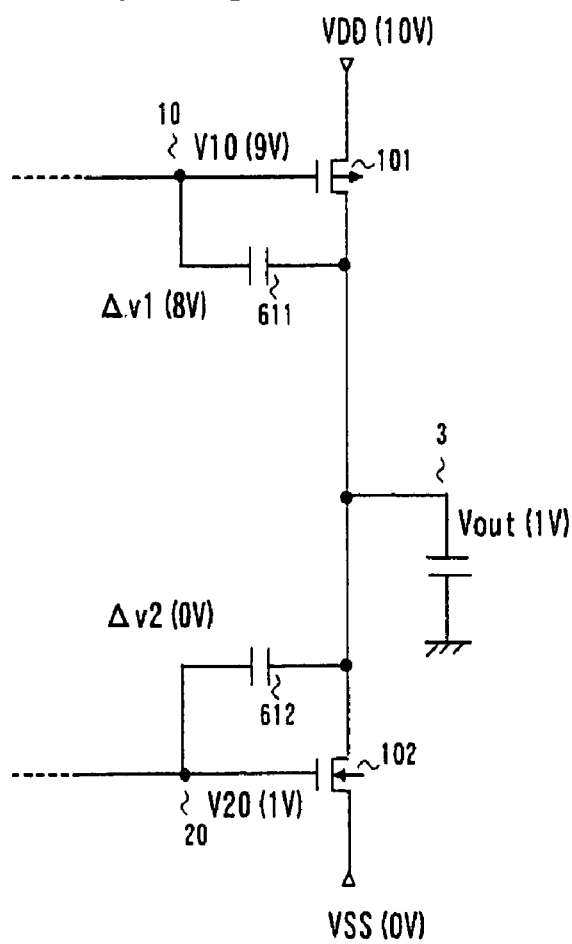
FIGS. 32A and 32B illustrate the operation of a comparative example in which the connection of a phase capacitor is fixed, where
Figure 32B:
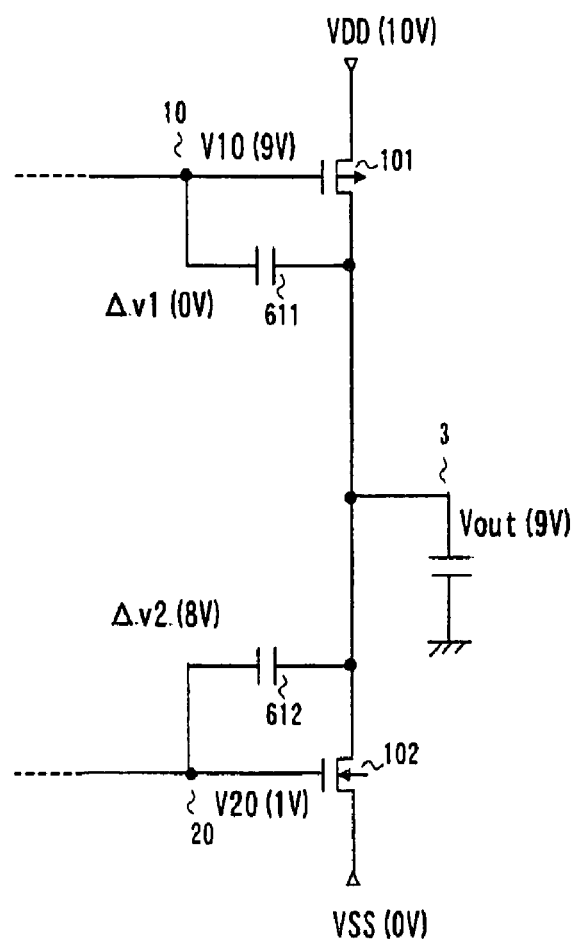

The principle of the present invention is now explained in detail, taking the circuit structure with fixed connection of a phase compensation capacitance as a comparative example. FIGS. 32A and 32B illustrate, in a circuit structure in which a capacitance 611 is connected across the output terminal 3 and the gate of the transistor 101 and in which a capacitance 612 is connected across the output terminal 3 and the gate of the transistor 102, the operation of charging the output voltage Vout of the output terminal 3 from 1V to 9V. Specifically, FIGS. 32A and 32B show typical node voltages for the output terminal voltage of 1V and for the output terminal voltage of 9V following the charging, respectively. As may be seen from FIG. 32A, in the stable state of the discharging operation, directly before switching to charging, the output voltage Vout is in the low potential state, the voltage V10 is 9V and the voltage V20 is 1V, with the output terminal voltage Vout=1V. Hence, the terminal-to-terminal voltages ΔV1, ΔV2 of the capacitances 611, 612 are 8V and 0V, respectively.

During the charging period following the switching from the discharging period, a differential amplifying stage, such as 4, of FIG. 1, is in operation. Due to changes in the output thereof, the voltage V10 of the terminal 10 is pulled down to turn on the transistor 101 to raise the output terminal voltage Vout. The stable state of the charging operation, shown in FIG. 32(B), is then reached. In this stable state of the charging operation, the output terminal voltage Vout is changed to 9V, the voltage V10 of the terminal 10 reverts to 9V and the terminal-to-terminal voltages ΔV1 and ΔV2 of the capacitances 611, 612 become equal to 0V and 8V, respectively. Both the capacitances 611, 612 experience marked changes in the terminal-to-terminal voltages of from 0V to 8V and from 8V to 0V. The electric charge are supplied from the differential amplifying stage, such as 4, of FIG. 1, via terminals 10 and 20. The larger the capacitance values of the capacitances 611, 612, the larger is the quantity of electric charge from the differential amplifying stage and the longer is the time that is needed. Thus, the charge supplying ability of the differential amplifying stage determines the slew rate.

The above applied for a case in which the capacitances 611, 612 are connected across an intermediate connection node point of the multi-cascode current mirror and the output terminal 3.

Figure 33A:
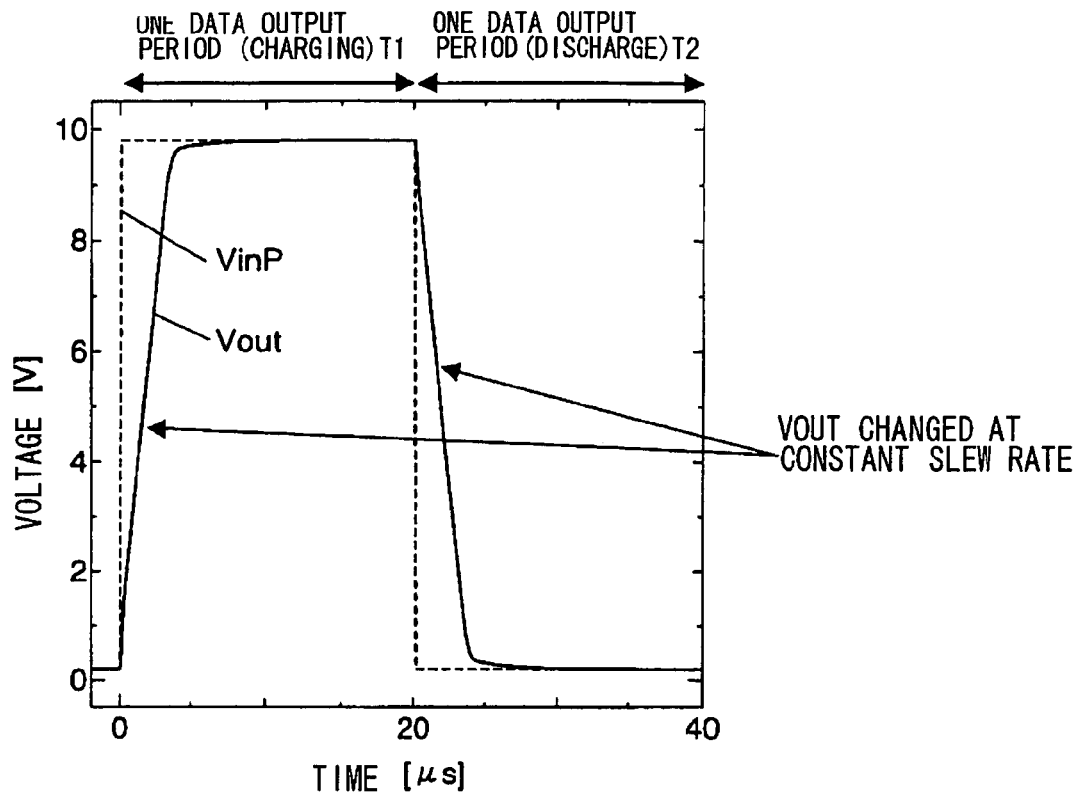
FIGS. 33A and 33B show an input/output waveform of the conventional technique, where
Figure 33B:
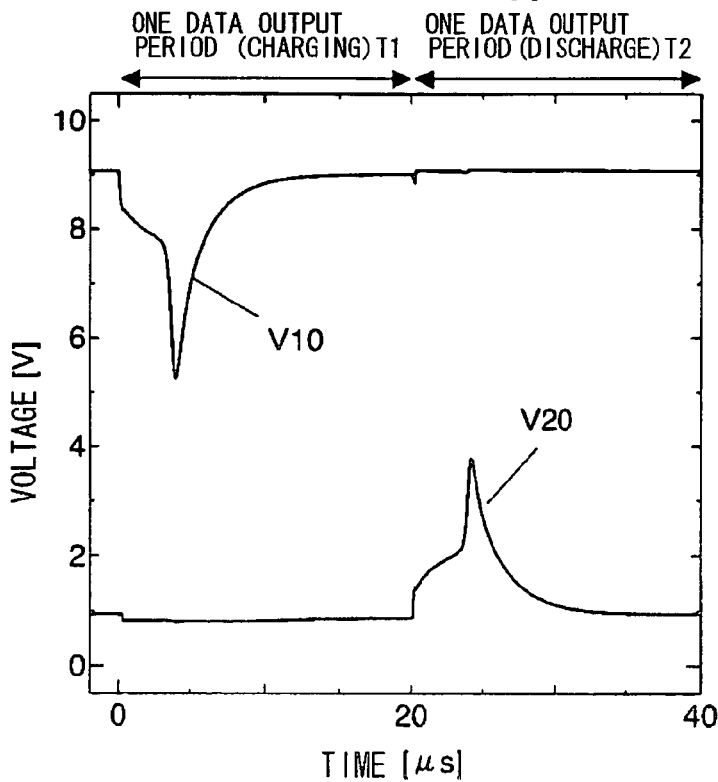

FIG. 33A shows the input/output waveform of the comparative example. Meanwhile, the output waveform is an output waveform relative to an input signal VinP when the output terminal voltage Vout is fed back as an inverted input terminal voltage VinN. The output signal Vout rises and decays with a constant slew rate, by output changes of the differential amplifying stage, against the rise and the fall of the input signal VinP. In the comparative example in which the phase capacitor is connected fixedly, the charging/discharge of the phase capacitor and changes in the output terminal voltage Vout occur gradually, responsive to an output from the differential amplifying stage, by a time-consuming operation. FIG. 33B shows voltage waveforms V10 and V20 at the control terminals 10 and 20 of a push-pull output stage in the comparative example having the fixedly connected phase capacitor. After the start of the output period (charging period) T1, the voltage V10 falls from 9V to turn on the transistor 101. In the stable state, the voltage reverts to 9V, with the voltage V20 remaining at 1V. After switching to the output period (discharging period) T2, the voltage V20 rises from 1V to turn on the transistor 102. In the stable state, the voltage V10 reverts to 1V, with the voltage V10 remaining at 9V.

Figure 35:
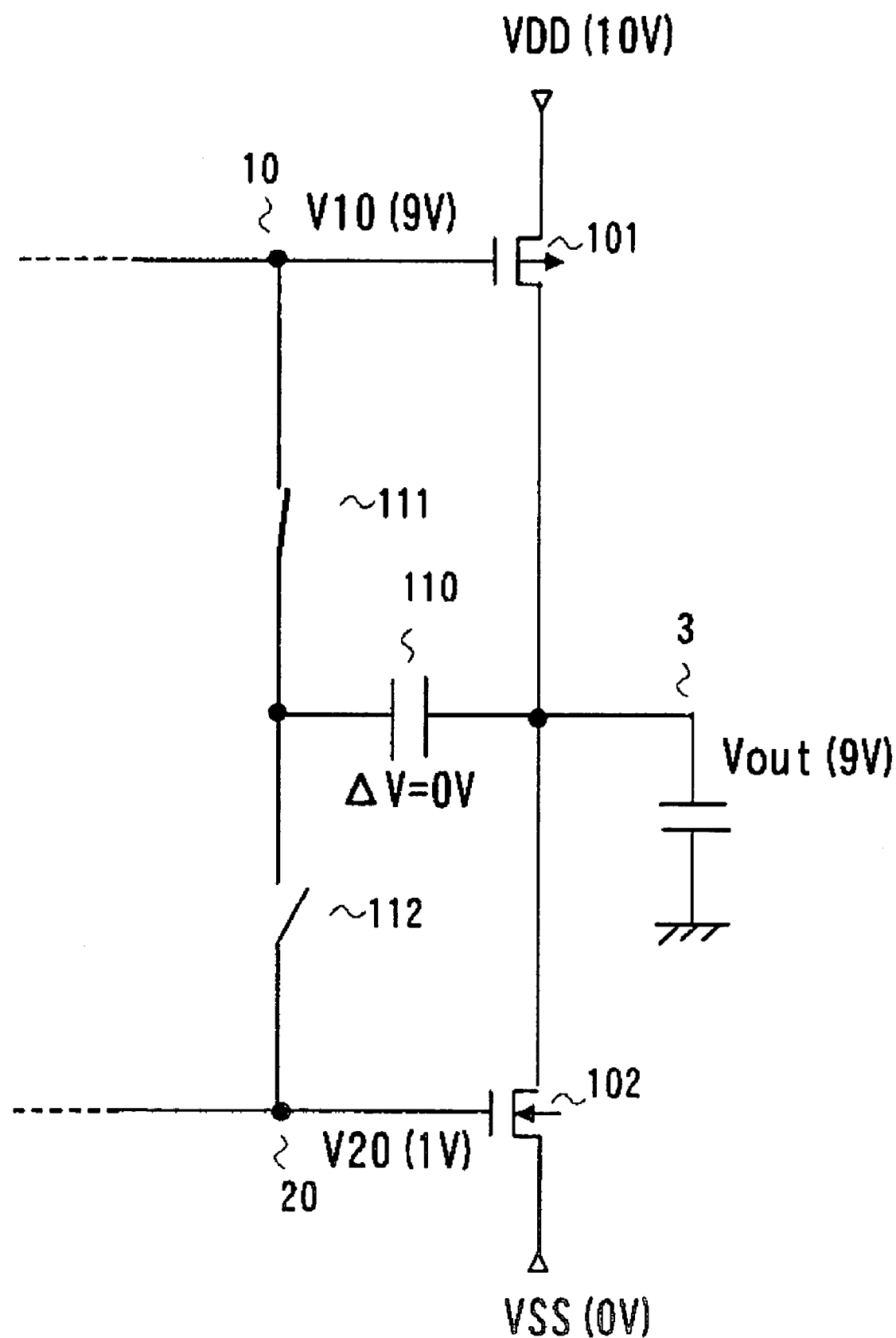
FIG. 35 illustrates the operation of the embodiment of FIG. 1, and specifically illustrates the connection and the node voltage following the switching (stable state of the charging operation).

The operation of the present invention is now explained by way of contrasting to the above-described comparative example. FIGS. 34 and 35 illustrate the operation for the case in which the switch control shown in FIG. 2 is performed in the circuit of FIG. 1. That is, these figures illustrate the operation of the present embodiment in charging the output terminal voltage Vout from 1V to 9V. In the stable state of the discharging operation immediately before the switching to the charging period, since the switch 111 is off (open) and the switch 112 is on (close), while the output terminal voltage Vout is 1V and the voltage V20 of the terminal 10 is 1V, the terminal-to-terminal voltage of the capacitor element 110 ΔV is 0V, while the voltage V10 of the terminal 10 is 9V.

Directly after switching from this state to the charging period, shown in FIG. 34(B), the switches 111 and 112 are turned on and off, respectively, such that the voltage V10 (9V) of the terminal 10 is changed to a low side, under the voltage decreasing action by the capacitor element 110 (refer to an arrow labeled 'voltage decreasing action' in the drawing). Responsive to the falling terminal voltage V10, the output terminal voltage Vout is increased acutely, due to the rapid charging by the transistor 101, and the stable state of the charging operation, shown in FIG. 35, is reached. In this stable state of the charging operation, the output terminal voltage Vout is changed to 9V, while the voltage V10 at the terminal 10 reverts to 9V. The terminal-to-terminal voltage ΔV of the capacitor element 110 is 0V. In the course of transition from the state immediately following the switching to the stable state of the charging, the terminal-to-terminal voltage ΔV of the capacitor element 110 is not changed appreciably, even granting that it is slightly changed as a result of changes in the terminal voltage V10 or the output terminal voltage Vout. The reversion of the changes in the terminal-to-terminal voltage ΔV of the capacitor element 110 to ΔV=0V of the stable state of the charging operation is taken charge of by an output of the differential amplifying stage (4 of FIG. 1) that is in operation partway during the rise of the output terminal voltage Vout. The stable state tends to be restored by the electric charge being sent via terminal 10 to the capacitor element 110. The terminal voltage V20 is subjected to a slight boost action through the parasitic capacitance of the transistor 102 or the switch 112, due to rapid rise of the output terminal voltage Vout, as a result of which the transistor 102 is turned on to produce transient short-circuit current. However, such boost action is usually small enough such that the effect on the power dissipation is small.

As described above, the mechanism of the high-speed operation of the present invention is that the connection state of the capacitor element 110 is switched before output changes from the differential amplifying stage 4 of FIG. 1 become effective, to cause the stable state following changes of the output terminal voltage Vout to be approached instantaneously, and that only the output terminal voltage Vout can be changed without scarcely changing the terminal-to-terminal voltage $\Delta V$ of the capacitor element 110, thereby realizing the high-speed operation.

In the stable state of the charging operation, in the charging period, following the switching from the discharging period, the terminal-to-terminal voltage $\Delta V$ of the capacitor element 110 is again 0V, and enters into a stable state, so that only a small amount of the electric charge supplied from the differential amplifying stage 4 of FIG. 1 to the capacitor element 110 suffices. Thus, with the present invention, a high-speed operation may be realized without increasing the current consumption of the differential amplifying stage 4.

Figure 3:
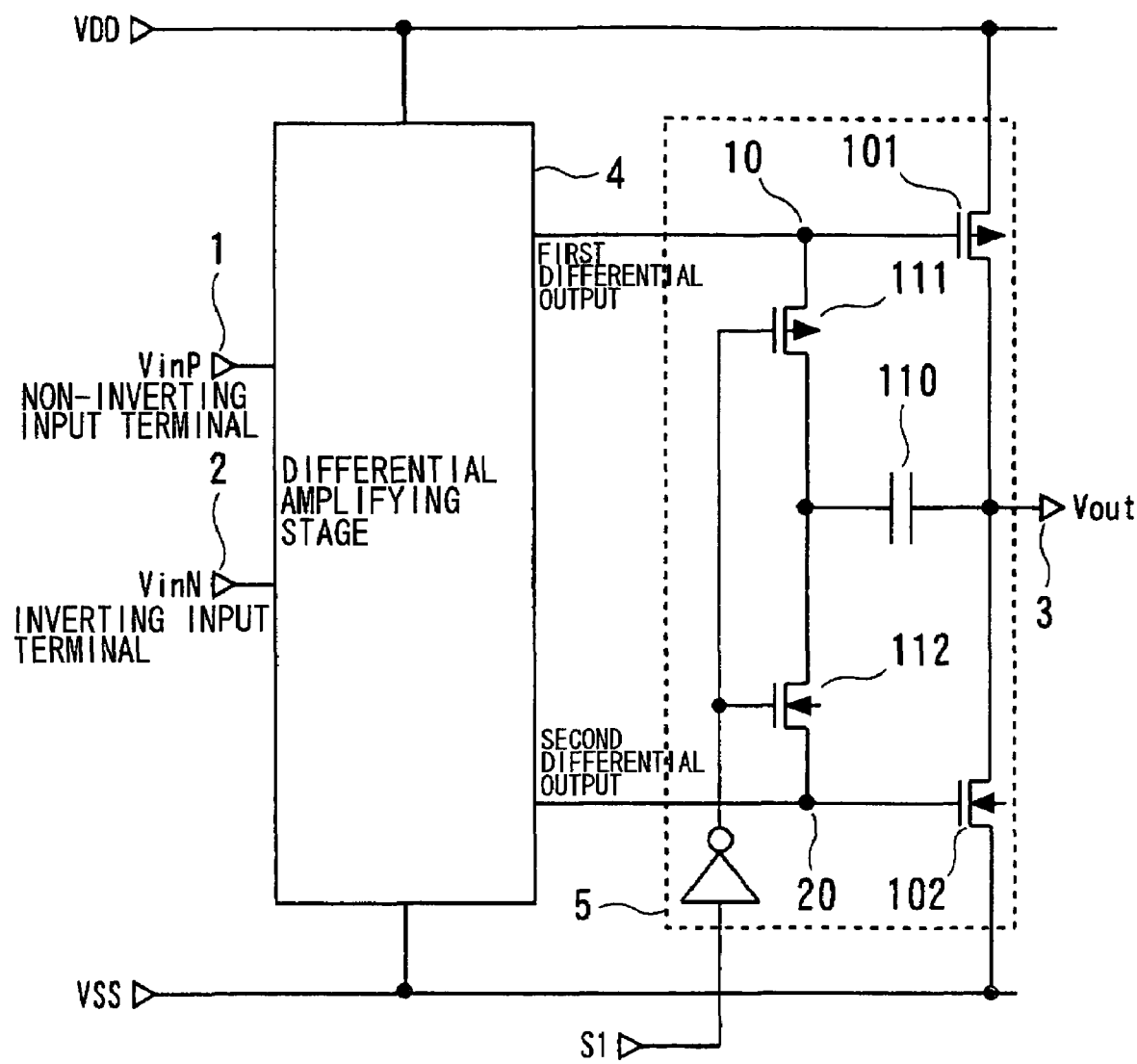
FIG. 3 shows a concrete configuration of the first embodiment of the present invention.

The present embodiment, shown in FIG. 1, is explained in more detail by referring to its specified example. FIG. 3 shows a specified example of the embodiment shown in FIG. 1. Referring to FIG. 3, the switches 111 and 112 in the output amplifying stage 5 are formed by a P-channel transistor and an N-channel transistor, respectively, and an inverted version of an external signal S1 is entered to a gate of each of these switches. The external signal S1 is controlled in a manner shown in FIG. 4.

Figure 4:
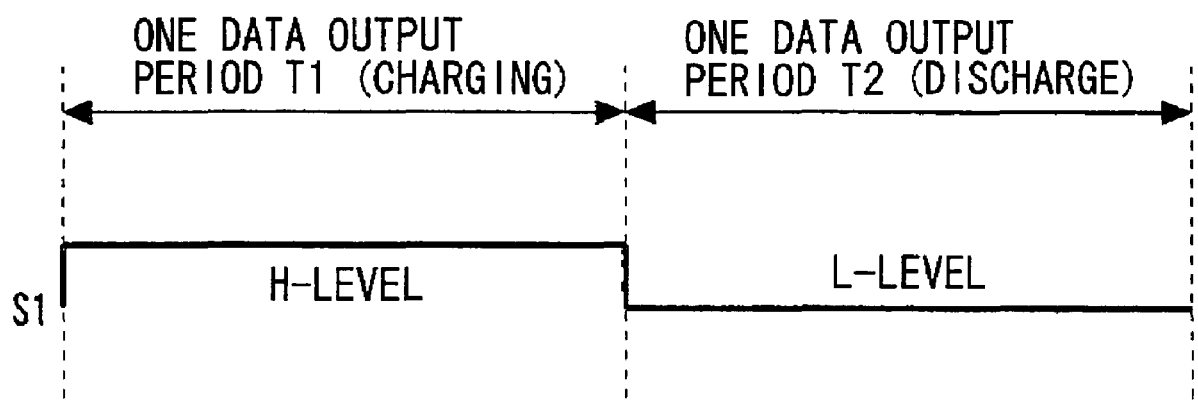
FIG. 4 shows the timing of a signal S1 in the concrete configuration of the first embodiment of the present invention.

Referring to FIG. 4, the external signal S1 is changed from the low level to the high level, at the time of start of a given data output period T1 for charging, while being changed from the high level to the low level, at the time of start of a given data output period T2 for discharge. This causes the switches 111 and 112 to be turned on and off, respectively, during the output period T1, while causing the switches 111 and 112 to be turned off and on, respectively, during the output period T2, thus realizing the same operation and result as those shown in FIGS. 1 and 2.

Figure 5:
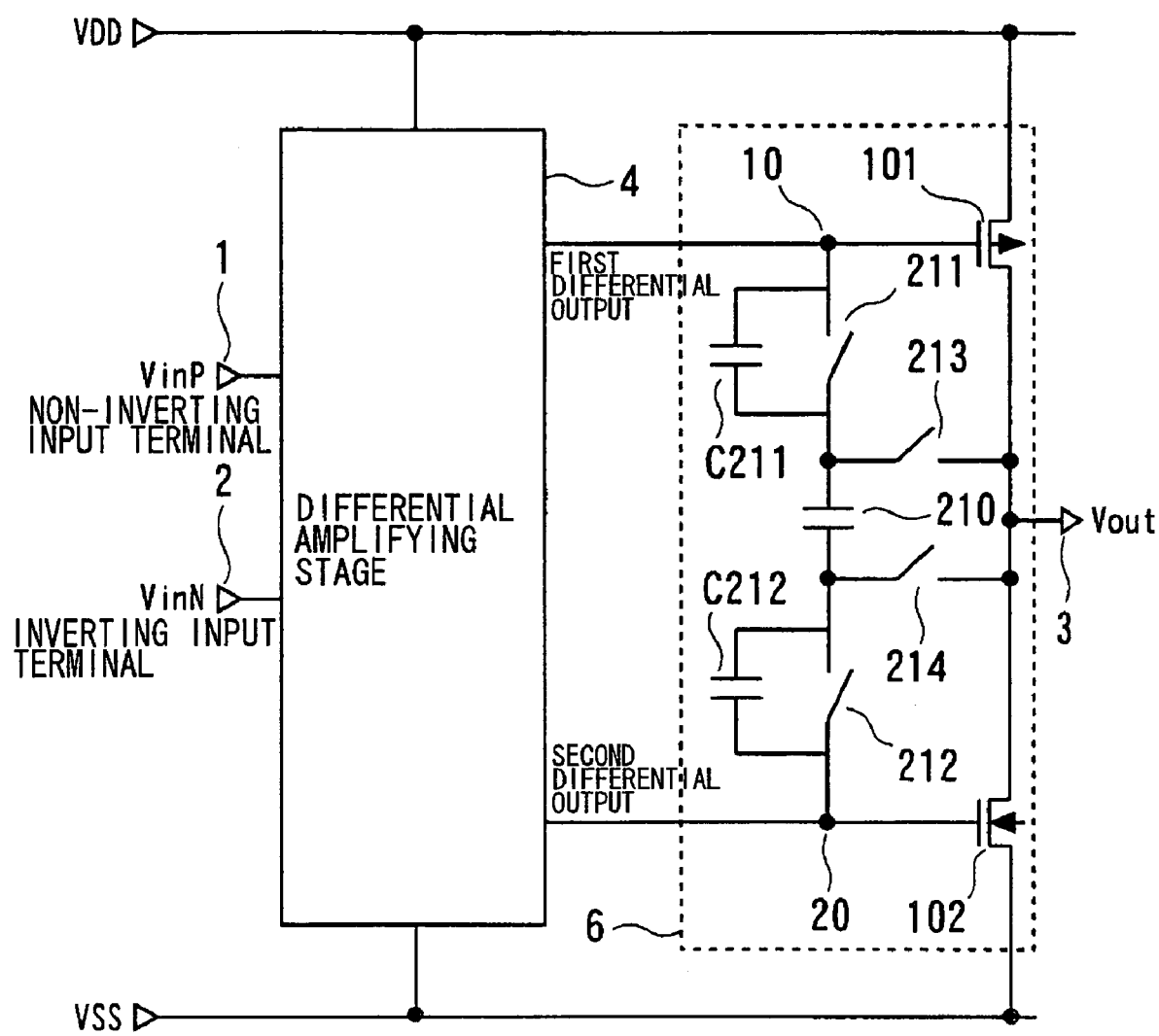
FIG. 5 shows the configuration of a second embodiment of the present invention.

FIG. 5 is a diagram showing the configuration of a differential amplifier according to a second embodiment of the present invention. Referring to FIG. 5, the differential amplifier according to the second embodiment of the present invention is made up of a differential amplifying stage 4 and an output amplifying stage 6. The differential amplifying stage 4 includes a non-inverting input terminal 1, an inverting input terminal 2, a first differential output terminal 10 and a second differential output terminal 20. The output amplifying stage 6 includes a P-channel transistor 101, connected across an output terminal 3 and the high potential side power supply VDD and having a gate connected to the first differential output terminal 10, an N-channel transistor 101, connected across the output terminal 3 and the low potential side power supply VSS and having a gate connected to the second differential output terminal 20, and a capacitor element 210, having one end connected via switches 211, 213 to the terminal 10 and to the output terminal 3, respectively, and having the other end connected via switches 212, 214 to the terminal 20 and to the output terminal 3, respectively. The differential amplifying stage 4 differentially receives signal voltages, applied to the input terminals 1, 2, to send a differentially amplified output to the differential output terminals 10 and 20. The output amplifying stage 6 is able to charge or discharge the output terminal 3, by the transistors 101 and 102, based on voltage changes at the differential output terminals 10 and 20. The capacitor element 210 and the switches 211 and 212, 213 and 214 form a capacitor connection control circuit. In case the switches 211 and 212 are formed by transistors, parasitic capacitances are generated across both ends of the switches. These parasitic capacitances are labeled C211, C212, respectively. To the output terminal 3 is connected an external load (data line load), not shown. Instead of being a metal capacitance (interconnect capacitance) or a gate capacitance, the capacitor element 210 may be provided with any suitable capacitive element. The parasitic capacitances C211 and C212 may be usual capacitor elements.

FIG. 6 illustrates a first controlling method of the differential amplifier shown in FIG. 5. Referring to FIG. 6, control is so managed that the switches 211 and 214 are turned on and the switches 212 and 213 are turned off at the time of start of a given data output period T1 for charging, while the switches 211 and 214 are turned off and the switches 212 and 213 are turned on, at the time of start of a given data output period T2 for discharge.

The operation by the above-described switching control is hereinafter explained. First, the operation at the time of transition from the output period T2 to the output period T1 is explained.

During the data output period T2, the capacitor element 210 is connected across the terminal 20 and the output terminal 3. It is assumed that, when the output period T2 is nearing its end, the state of a stable output has been reached. The gate-to-source voltage of each of the transistors 101 and 102 then is stabilized at a voltage close to a threshold voltage. The potentials of the terminals 10 and 20 are V10 and V20, respectively, as in the case of FIG. 1, explained above. On the other hand, since the discharging operation is taking place during the output period T2, it is assumed that the output voltage Vout=Vout2 is low, and that electric charge for maintaining the potential difference between the voltage Vout2 and the voltage V20 (Vout2−V20) is stored in the capacitor element 210.

When the output period undergoes transition from this state to the output period T1, at the beginning of the output period T1, the one end of the capacitor element 210, connected to the output terminal 3, is instantly connected to the terminal 10 and the other end of the capacitor element 210, connected to the terminal 20, is instantly connected to the output terminal 3, such that the capacitor element 210 is switched to a condition in which it is connected across the terminal 10 and the output terminal 3. Directly after switching the connection, the capacitor element 210 tends to maintain the potential difference, while the output terminal 3, connected to the large capacitance load (data line), tends to hold the voltage Vout2. Thus, the potential of the terminal 10, which is poor in the potential holding ability, is subjected to a voltage decreasing action which tends to decrease the potential to a voltage equal to the voltage Vout2 added by the potential difference of the capacitor element 210 (Vout2−V20), that is, a voltage (2Vout2−V20). Hence, the potential at the terminal 10 is instantaneously pulled down, by the connection switching, so that the gate-to-source voltage of the transistor 101 is enlarged to produce a momentary charging action for the output terminal 3. This is the bootstrap action by the connection switching of the capacitor element 210. The parasitic capacitances C211 and C212 are now explained. The parasitic capacitance C211 has its both ends shorted immediately after the connection switching of the capacitor element 210 and hence is not in operation. On the other hand, the state of the parasitic capacitance C212 is changed, immediately after the connection switching of the parasitic capacitance C210, from the state of zero potential difference to a state in which the parasitic capacitance is connected across the terminal 20 and the output terminal 3. However, since the potential difference between the voltage V20 and the voltage Vout2 is only small, no such action is produced which will vary the potential at the terminal 20 appreciably, so that, in the switch control of FIG. 6, the action on the capacitor element 210 from the parasitic capacitances C211 and C212 is sufficiently small. Meanwhile, the voltage decreasing action of the terminal 10 directly after the connection switching of the capacitor element 210 is progressively moderated by, for example, the supply of electric charge from the differential amplifying stage 4 to the terminal 10 or the rise of the output voltage Vout caused by fluctuations at the terminal 10.

On the other hand, the differential amplifying stage 4 commences its operation, with the start of the output period T1, in dependence upon the differential voltage between the voltage at the non-inverting input terminal VinP and that at the inverting input terminal VinN. However, there is a response delay until an output thereof is transmitted to the differential output terminals 10 and 20. The result is that the operation start timing of the output amplifying stage 6 by the output of the differential amplifying stage 4 is delayed as compared to that of the bootstrap charging which is in operation instantaneously with the start of the time T1, such that the charging operation by the output of the differential amplifying stage 4 is predominant over the bootstrap charging only when the bootstrap charging has proceeded partway. Consequently, the operation from the output period T2 to the output period T1 of the differential amplifier of FIG. 5 is such that, with the start of the output period T1, the charging operation for the output terminal 3 occurs instantaneously by the bootstrap action to raise the output voltage Vout a certain quantity, after which the charging operation corresponding to the differential voltage of the non-inverting input terminal VinP and the inverting input terminal VinN is performed.

Next, the operation at the time of transition from the output period T1 to the output period T2 is explained. During the output period T1, the capacitor element 210 is connected across the terminal 10 and the output terminal 3. It is assumed that, when the output period T1 is nearing its end, the state of a stable output has been reached. The gate-to-source voltage of each of the transistors 101 and 102 then is stabilized at a voltage close to a threshold voltage. The potentials of the terminals 10 and 20 are V10 and V20, respectively. On the other hand, since the charging operation is taking place during the output period T1, it is assumed that the output voltage Vout=Vout1 is high and that electric charge for maintaining the potential difference between the voltage Vout1 and the voltage V10 (V10−Vout1) are stored in the capacitor element 210. When the output period undergoes transition from this state to the output period T2, at the beginning of the output period T2, the one end of the capacitor element 210, connected to the output terminal 3, is instantly connected to the terminal 20, and the other end of the connected to the capacitor element 210, connected to the terminal 10, is instantly connected to the output terminal 3, such that the capacitor element 210 is switched to a state in which it is connected across the terminal 20 and the output terminal 3. Directly after switching the connection, the capacitor element 210 tends to maintain the potential difference, while the output terminal 3, connected to the large capacitance load (data line), tends to hold the voltage Vout1. Thus, the potential of the terminal 20, which is poor in the potential holding ability, is subjected to a voltage increasing operation which tends to pull up the potential of the terminal 20 to a voltage equal to the voltage Vout1 reduced by the potential difference (terminal-to-terminal voltage) of the capacitor element 210 (=V10−Vout1), that is, to a voltage (=2Vout1−V10). Hence, the potential at the terminal 20 is instantaneously pulled up, by the connection switching, under the operation dependent on the voltage Vout1, so that the gate-to-source voltage of the transistor 102 is enlarged to produce a momentary discharging operation for the output terminal 3. This is the bootstrap operation by the connection switching of the capacitor element 210. The parasitic capacitances C211 and C212 are now explained. The parasitic capacitance C212 has its both ends shorted immediately after the connection switching of the capacitor element 210 and hence is not in operation. On the other hand, the state of the parasitic capacitance C211 is changed, immediately after the connection switching of the parasitic capacitance C210, from the state of zero potential difference across its both ends to a state in which the parasitic capacitance is connected across the terminal 10 and the output terminal 3. However, since the potential difference between the voltage V10 and the voltage Vout1 is only small, no such action is produced which will vary the potential at the terminal 10 appreciably, so that, in the switch control of FIG. 6, the action exerted on the capacitor element 210 from the parasitic capacitances C211 and C212 is sufficiently small. Meanwhile, the voltage decreasing action of the terminal 20 directly after the connection switching of the capacitor element 210 is progressively moderated by, for example, the supply of electric charge from the differential amplifying stage 4 to the terminal 20 and the fall of the output voltage Vout caused by fluctuations at the terminal 20. On the other hand, the differential amplifying stage 4 commences its operation, with the start of the output period T2, in dependence upon the differential voltage between the voltage at the non-inverting input terminal VinP and that at the inverting input terminal VinN. However, there is a response delay until an output thereof is transmitted to the differential output terminals 10 and 20. The result is that the operation start timing of the output amplifying stage 6 by the output of the differential amplifying stage 4 is delayed as compared to that of the bootstrap discharging which is in operation instantaneously with the start of the time T2, such that the discharging operation by the output of the differential amplifying stage 4 is predominant over the bootstrap discharging only when the bootstrap discharging operation has proceeded partway. Consequently, the operation as from the output period T1 until the output period T2 of the differential amplifier of FIG. 5 is such that, with the start of the output period T2, the discharging operation for the output terminal 3 occurs instantaneously by the bootstrap operation to pull down the output voltage Vout a certain quantity, after which there occurs the discharging operation corresponding to the differential voltage of the non-inverting input terminal VinP and the inverting input terminal VinN.

Figure 37A:
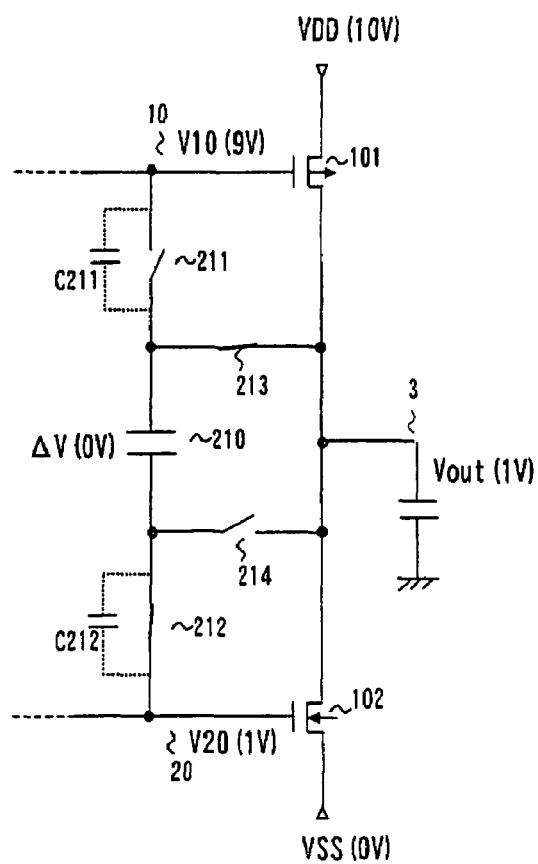
FIGS. 37A and 37B illustrate the operation of the embodiment of FIG. 5 by switch control of FIG. 2, where
Figure 37B:
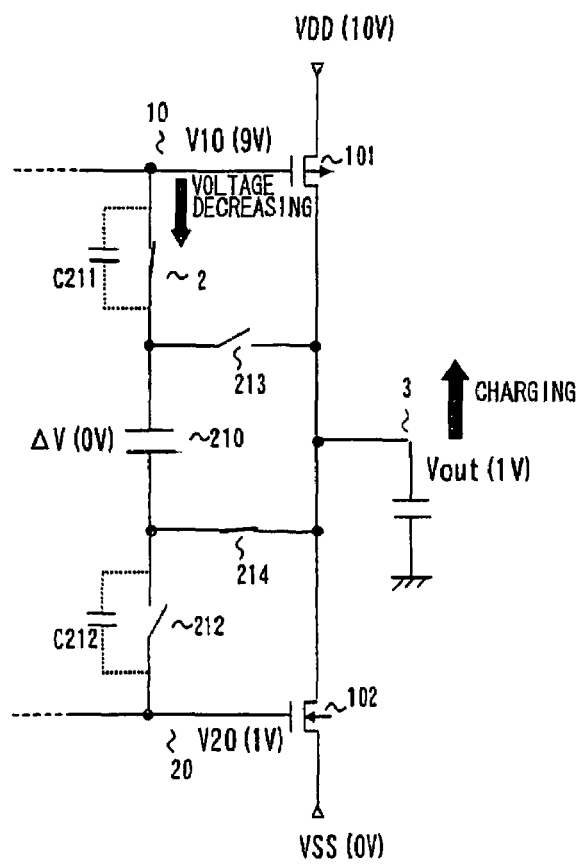
Figure 38:
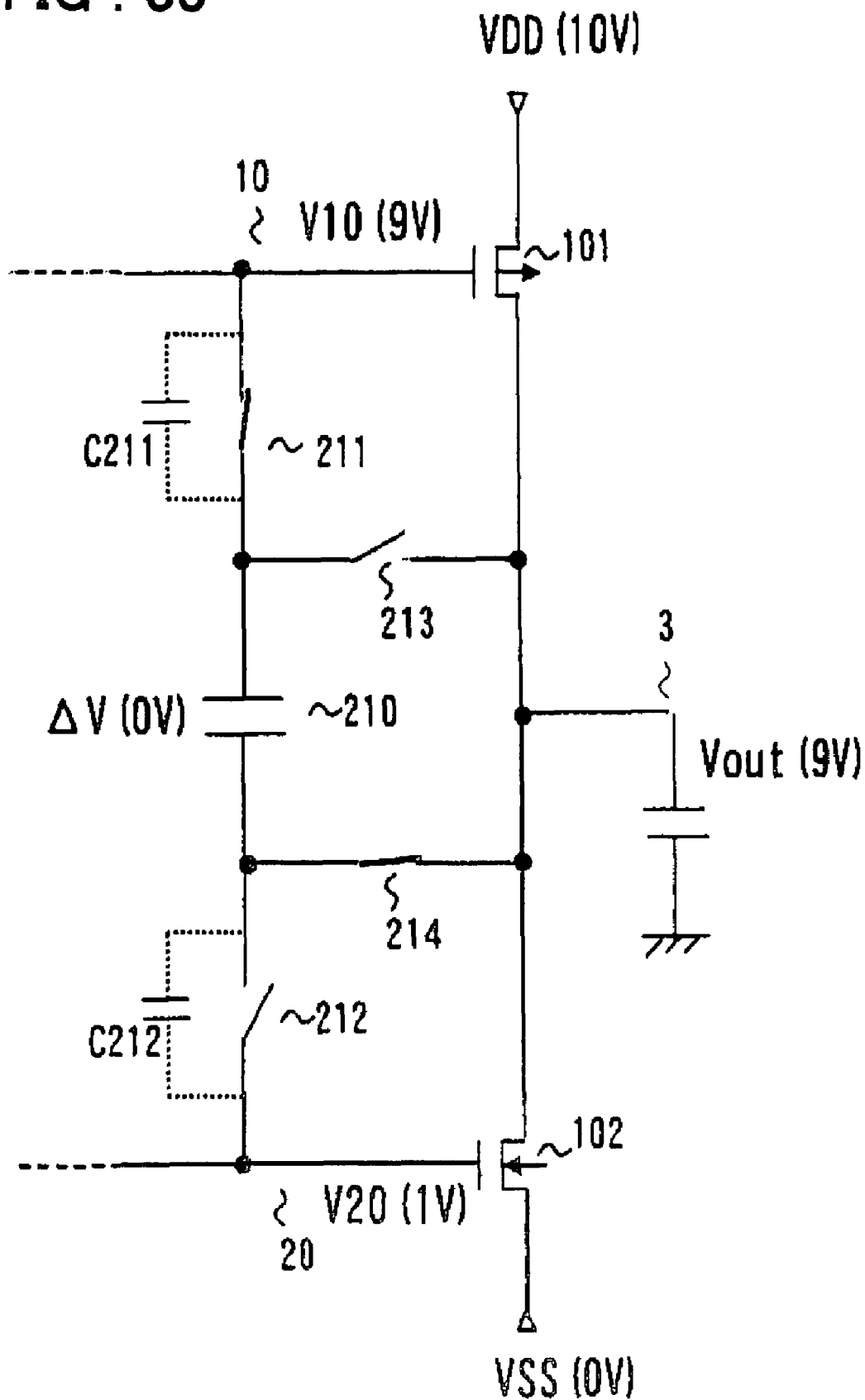
FIG. 38 illustrates the operation of the embodiment of FIG. 1, and specifically illustrates the connection and the node voltage following the switching (stable state of the charging operation).

FIGS. 37 and 38 illustrate the operation of the differential amplifier of FIG. 5 by the switch control shown in FIG. 6, specifically, the operation of charging the output terminal voltage Vout from 1V to 9V. FIG. 37A shows a stable state of the discharging operation immediately before transition to the charging period. As shown in FIG. 37A, the output voltage Vout is in the low potential state, the switches 211 and 212 are turned off and on, respectively, with the terminal-to-terminal voltage $\Delta V$ of the capacitor element 210 being 0V. Referring to FIG. 37B, the voltage V10 is subjected to the voltage pull-down action by the capacitor element 210, directly after the switching (at the time of start of the charging period), and the voltage V10 is changed to the low voltage side, so that the output terminal voltage Vout is increased acutely, due to the rapid charging by the transistor 101. Thus, the stable state of the charging operation, shown in FIG. 38, is reached. In this stable state of the charging operation, the output voltage Vout is changed to 9V, while the voltage V10 of the terminal 10 reverts to 9V. The terminal-to-terminal voltage $\Delta V$ of the capacitor element 210 is 0V. In the course of transition from the state immediately following the switching to the stable state of the charging, the terminal-to-terminal voltage $\Delta V$ of the capacitor element 210 is not changed appreciably, even granting that it is slightly changed as a result of changes in the terminal voltage V10 or in the output terminal voltage Vout. The reversion of the changes in the terminal-to-terminal voltage $\Delta V$ of the capacitor element 210 to $\Delta V=0V$ corresponding to the stable state of the charging operation is taken charge of by an output of the differential amplifying stage (4 of FIG. 5) that is in operation partway during the rise of the output terminal voltage Vout. The stable state tends to be restored by the electric charge being sent via terminal 10 to the capacitor element 210. The terminal voltage V20 is subjected to a slight boost action through the parasitic capacitance C212 or an auxiliary capacitance of the transistor 102, due to rapid rise of the output terminal voltage Vout, thus producing the transient short-circuit current. However, such boost action is usually small enough such that the effect on the power dissipation is small.

As described above, the mechanism of the high-speed operation of the present invention is that the connection state of the capacitor element 210 is switched before output changes from the differential amplifying stage 4 of FIG. 5 become effective, to cause the stable state following change of output to be approached instantaneously, that is that only the output terminal voltage Vout can be changed without scarcely changing the terminal-to-terminal voltage of the capacitor element 210, thereby realizing the high-speed operation.

In the stable state of the charging operation, in the charging period, following the switching from the discharging period, the terminal-to-terminal voltage $\Delta V$ of the capacitor element 210 again enters into a stable state at 0V, so that only a small amount of the electric charge supplied from the differential amplifying stage 4 of FIG. 5 to the capacitor element 210 suffices. Thus, with the present invention, a high-speed operation may be realized without increasing the current consumption of the differential amplifying stage 4.

Another controlling method in a differential amplifier shown in FIG. 5 is now explained. FIG. 7 shows a second controlling method of the differential amplifier shown in FIG. 5. Referring to FIG. 7, control is managed, in an output period T1 for charging, so that switches 211 and 214 are turned off and switches 212 and 213 are turned on at the beginning of an output period for charging, and so that the switches 211 and 214 are turned on and the switches 212 and 213 are turned off at the beginning of the output period T2 for discharge. That is, FIG. 7 performs switching control which is the reverse of that of FIG. 6. With this switching control, the effect derived is similar to that in the case of FIG. 6. However, the operation of the control method slightly differs from that in the case of switch control of FIG. 6.

The operation by the above-described switching control is hereinafter explained. First, the operation at the time of transition from the output period T2 to the output period T1 is explained.

During the data output period T2, the capacitor element 210 is connected across the terminal 10 and the output terminal 3. It is assumed that, when the output period T2 is nearing its end, the state of a stable output has been reached. The gate-to-source voltage of each of the transistors 101 and 102 then is stabilized at a voltage close to a threshold voltage. The potentials of the terminals 10 and 20 are V10 and V20, respectively, as in the case of FIG. 1, explained above. On the other hand, since the discharging operation is taking place during the output period T2, it is assumed that the output voltage Vout=Vout2 is low and electric charge for maintaining the potential difference between the voltage V10 and the voltage Vout2 (V10−Vout2) is stored in the capacitor element 210. The switch 211 is on, with the parasitic capacitance C211 being such that the potential difference across the ends thereof is zero.

When the output period undergoes transition from this state to the output period T1, at the beginning of the output period T1, the one end of the capacitor element 210, connected to the terminal 10, is instantly connected to the output terminal 3, while the other end of the capacitor element 210, connected to the output terminal 3, is instantly connected to the terminal 20, such that the capacitor element 210 is switched to a condition in which it is connected across the terminal 20 and the output terminal 3. The switch 211 is turned off, and the voltages V10, Vout2 are instantaneously applied to one and the other end of the parasitic capacitance C211, respectively. Directly after connection switching, the parasitic capacitance C211 and the capacitor element 210 tend to hold the potential difference, while the output terminal 3, connected to a load of large capacitance (data line), tends to hold the voltage Vout2. Thus, the potential of the terminal 10, poor in the potential holding ability, is subjected to a voltage decreasing action of pulling the potential down to the voltage Vout2, through the parasitic capacitance C211, while the potential of the terminal 20 is subjected to a voltage decreasing action of pulling the potential down to a voltage equal to the voltage Vout2 reduced by the potential difference of the capacitor element 210 (V10−Vout2), that is, a voltage (2Vout2−V10).

Hence, on connection switching, the potential of the terminal 10 is instantaneously pulled down, by the action dependent on the voltage Vout2. This increases the gate-to-source voltage of the transistor 101 to produce the transient charging operation for the output terminal 3. Although the potential of the terminal 20 is also pulled down, this merely turns the transistor 102 off without affecting the output voltage. This is the bootstrap by connection switching of the capacitor element 210 in the present embodiment. The parasitic capacitance C212 has its both ends shorted immediately after the connection switching of the capacitor element 210 and hence is not in operation. Meanwhile, the voltage decreasing action of the terminal 10 becomes progressively moderate by, for example, the supply of electric charge from the differential amplifying stage 4 to the terminal 10 or the rise of the output voltage Vout caused by fluctuations at the terminal 10.

On the other hand, the differential amplifying stage 4 commences its operation, with the start of the output period T1, in dependence upon the differential voltage between the voltage at the non-inverting input terminal VinP and that at the inverting input terminal VinN. However, there is a response delay until an output thereof reaches the differential output terminals 10 and 20. The result is that the operation start timing of the output amplifying stage 5 by the output of the differential amplifying stage 4 is delayed as compared to that of the bootstrap charging which is in operation instantaneously with the start of the time T1, such that the charging operation by the output of the differential amplifying stage 4 is predominant over the bootstrap charging only when the bootstrap charging has proceeded partway. Consequently, the operation from the output period T2 to the output period T1 of the differential amplifier is such that, with the start of the output period T1, the charging operation for the output terminal 3 occurs instantaneously by the bootstrap operation to raise the output voltage Vout a certain quantity, after which there occurs the charging operation corresponding to the differential voltage of the non-inverting input terminal VinP and the inverting input terminal VinN.

Next, the operation at the time of transition from the output period T1 to the output period T2 is explained. During the output period T1, the capacitor element 210 is connected across the terminal 20 and the output terminal 3. It is assumed that, when the output period T1 is nearing its end, the state of a stable output has been reached. The gate-to-source voltage of each of the transistors 101 and 102 then is stabilized at a voltage close to a threshold voltage. The potentials of the terminals 10 and 20 are V10 and V20, respectively. On the other hand, since the charging operation is taking place during the output period T1, it is assumed that the output voltage Vout=Vout1 is high and that electric charge for maintaining the potential difference between the voltage Vout1 and the voltage V20 (Vout1−V20) is stored in the capacitor element 210. The switch 212 is on and the state of the parasitic capacitance C212 is such that the potential difference across its both ends is zero.

When the output period undergoes transition from this state to the output period T2, at the beginning of the output period T2, the one end of the capacitor element 210, connected to the terminal 20, is instantly connected to the output terminal 3, such that the other end of the capacitor element 210, so far connected to the output terminal 3, is instantaneously connected to the terminal 10, such that the capacitor element 210 is switched to a condition in which it is connected across the terminal 10 and the output terminal 3. The switch 212 is turned off, and the voltages V20 and Vout1 are instantaneously applied to the one and the other end of the parasitic capacitance C212. Directly after switching the connection, the parasitic capacitance C212 and the capacitor element 210 tend to maintain the potential difference, while the output terminal 3, connected to the large capacitance load (data line), also tends to hold the voltage Vout1. Consequently, the potential of the terminal 20, poor in the potential holding ability, is subjected to a voltage increasing action of pulling the potential up to the voltage Vout1, through the parasitic capacitance C212, while the potential of the terminal 10 is subjected to a voltage boost action of pulling the potential up to a voltage equal to the voltage Vout1 added by the potential difference of the capacitor element 210 (Vout1−V20), that is, a voltage (2Vout1−V20).

Thus, on connection switching, the potential of the terminal 20 is instantaneously pulled up, by the action dependent on the voltage Vout1. This increases the gate-to-source voltage of the transistor 102 to produce the transient discharging operation for the output terminal 3. Although the potential of the terminal 10 is also pulled up, this merely turns the transistor 101 off without affecting the output voltage. This is the bootstrapping action by connection switching of the capacitor element 210. The parasitic capacitance C211 has its both ends shorted immediately after the connection switching of the capacitor element 210 and hence is not in operation. Meanwhile, the voltage boost action of the terminal 20 becomes progressively moderate by, for example, the supply of electric charge from the differential amplifying stage 4 to the terminal 20 and the fall of the output voltage Vout caused by fluctuations at the terminal 20.

On the other hand, the differential amplifying stage 4 commences its operation, with the start of the output period T2, in dependence upon the differential voltage between the voltage at the non-inverting input terminal VinP and the inverting input terminal VinN. However, there is a response delay until an output thereof is transmitted to the differential output terminals 10 and 20. The result is that the operation start timing of the output amplifying stage 6 by the output of the differential amplifying stage 4 is delayed as compared to that of the bootstrap discharging, which is in operation instantaneously with the start of the time T2, such that the discharging operation by the output of the differential amplifying stage 4 is predominant over the bootstrap discharging only when the bootstrap discharging has proceeded partway. Consequently, the operation from the output period T1 to the output period T2 of the differential amplifier of FIG. 5 is such that, with the start of the output period T2, the discharging operation for the output terminal 3 occurs instantaneously by the bootstrap operation to pull down the output voltage Vout a certain quantity, after which there occurs the discharging operation corresponding to the differential voltage of the non-inverting input terminal VinP and that of the inverting input terminal VinN.

Figure 40A:
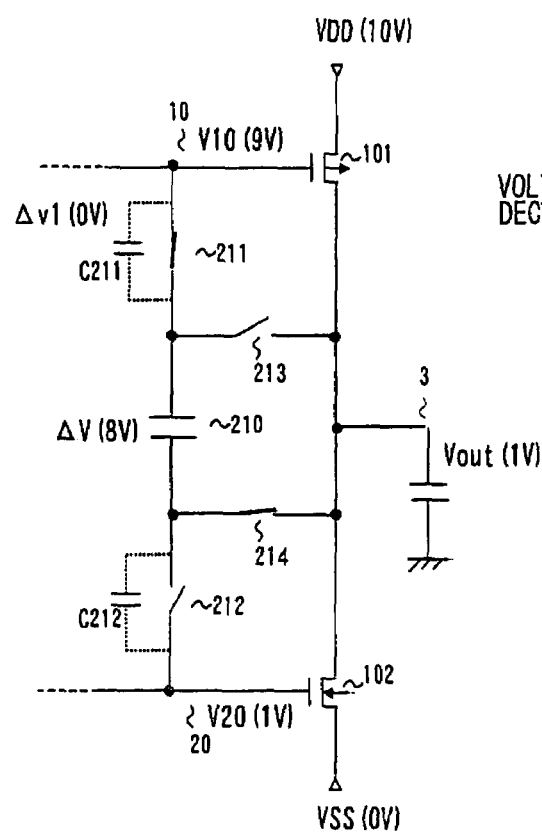
FIGS. 40A and 40B illustrate the operation of the embodiment of FIG. 5 by switch control of FIG. 9, where
Figure 40B:
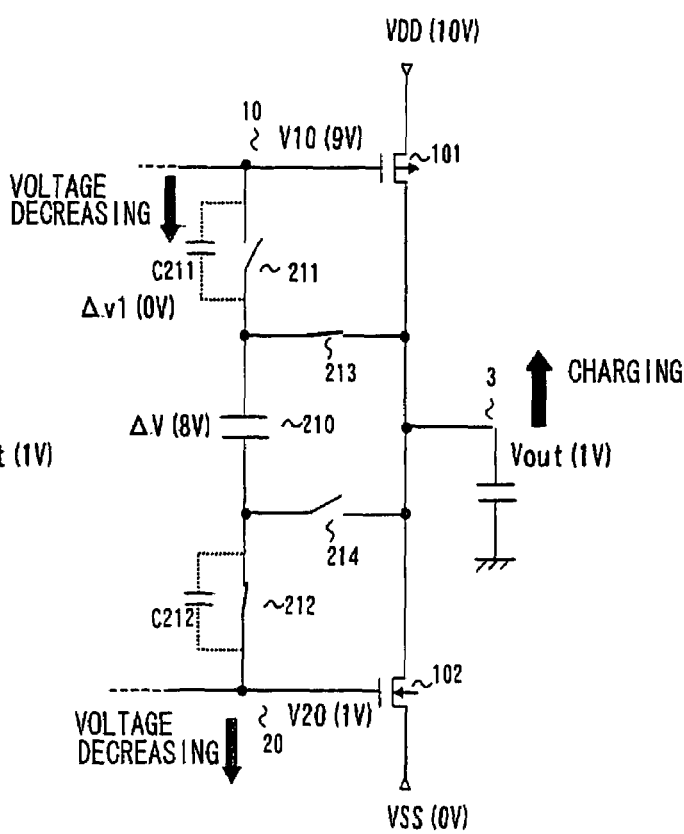
Figure 41:
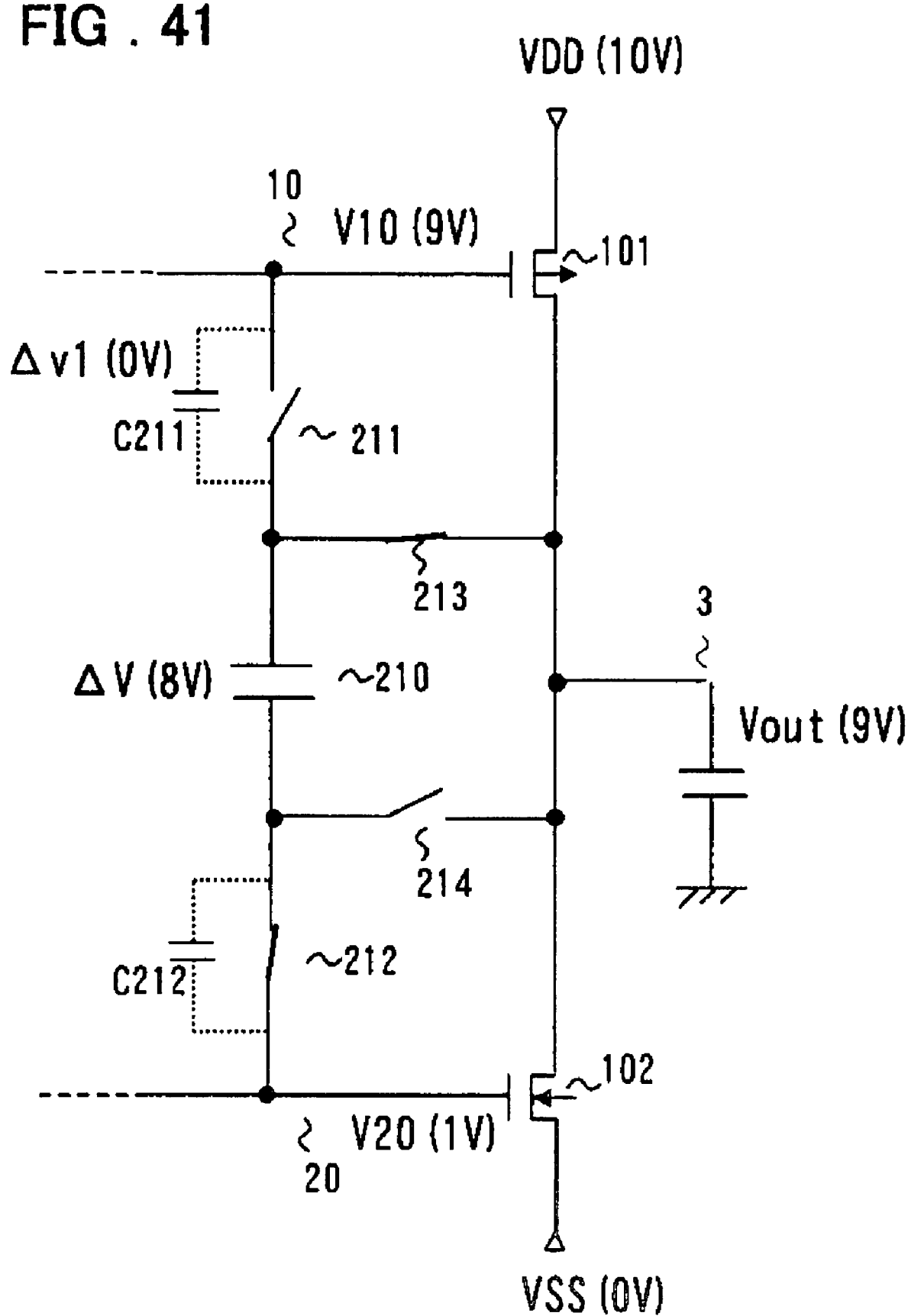
FIG. 41 illustrates the operation of the embodiment of FIG. 5, by switch control of FIG. 7, and specifically illustrates the connection and the node voltage following the switching (stable state of the charging operation).

FIGS. 40 and 41 illustrate the operation of the differential amplifier of FIG. 5 by the switch control shown in FIG. 7, specifically, the operation of charging the output terminal voltage Vout from 1V to 9V. As shown in FIG. 40A, in the stable discharge state directly previous to the connection switching to the charging operation, the output voltage Vout is in the low potential state, the switches 211 and 212 are turned on and off, respectively, with the terminal-to-terminal voltage ΔV of the capacitor element 210 being 8V, and with the terminal-to-terminal voltage ΔV1 of the parasitic capacitance C211 being 0V. Responsive to the voltage pull-down action by the parasitic capacitance C211, the terminal voltage V10 is changed to the low voltage side, directly after the transition to the charging period, as shown in FIG. 40(B), such that the output terminal voltage Vout is increased acutely, due to the rapid charging by the transistor 101. Although the terminal voltage V20 is subjected by the parasitic capacitance C210 to the voltage decreasing action, this voltage decreasing action does not affect changes in the output terminal voltage Vout. The stable state of the charging operation, shown in FIG. 41, is reached. In this stable state of the charging operation, the output terminal voltage Vout is changed to 9V, while the terminal-to-terminal voltages V10, V20 of the terminals 10 and 20 revert to 9V and 1V, respectively. The terminal-to-terminal voltage ΔV of the capacitance 210 is 8V, while the terminal-to-terminal voltage ΔV1 of the parasitic capacitance C211 is 0V. In the course of transition from the state immediately following the switching to the stable state of the charging, the terminalto-terminal voltages ΔV of the capacitor element 210 or ΔV1 of the parasitic capacitance C211 is not changed appreciably, even granting that it is subjected to slight voltage changes as a result of changes in the terminal voltages V10, V20 or in the output terminal voltage Vout. The reversion of the changes in the terminal-to-terminal voltages ΔV orΔV1 of the capacitor element 210 or the parasitic capacitance C211 to ΔV=8V or ΔV1=0V, corresponding to the stable state of the charging operation, is taken charge of by an output of the differential amplifying stage (4 of FIG. 5) that is in operation partway during the rise of the output terminal voltage Vout. The stable state tends to be restored by the electric charge being sent via terminals 10 and 20 to the capacitor element 210 or to the parasitic capacitance C211. The terminal voltage V20 is subjected to a voltage decreasing action through the capacitance 210, despite rapid rise of the output terminal voltage Vout, thus producing no short-circuit current.

As described above, the mechanism of the high-speed operation of the present invention is that the connection state of the capacitor element 210 is switched before output changes from the differential amplifying stage 4 of FIG. 5 become effective, to cause the stable state following output changes to be approached instantaneously, and that only the output terminal voltage Vout can be changed without scarcely changing the terminal-to-terminal voltage of the capacitor element 210, thereby realizing the high-speed operation.

In the stable state of the charging operation, in the charging period, following the switching from the discharging period, the terminal-to-terminal voltage ΔV of the capacitor element 210 enters into a stable state, at ΔV=8V, so that only a small amount of the electric charge supplied from the differential amplifying stage 4 of FIG. 5 to the capacitor element 210 suffices. Moreover, since the parasitic capacitance C211 is of a small capacitance value, an extremely small amount of the electric charge supplied from the differential amplifying stage 4 to the capacitor element C211 suffices. Thus, with the present invention, a high-speed operation may be realized without increasing the current consumption of the differential amplifying stage 4.

With the differential amplifier of FIG. 5, described above, in which the bootstrap operation is produced by switch control shown in FIGS. 6 and 7, the charging and discharging operations of a higher speed than is possible with the conventional system may be achieved. Such high-speed operation is possible without increasing the current consumption. It is noted that the high operating speed by the bootstrap operation is effective in the driving of large amplitudes, while being unneeded in the driving of small amplitudes. In the latter case, the switch state is not changed and the connection state of the capacitor element 210 may be maintained, whereby the bootstrap operation is not produced and the driving of small amplitudes may be performed with the usual differential amplifier. On the other hand, with the differential amplifier, shown in FIG. 5, the high-speed operation may be realized, as the power dissipation is suppressed, even though the charging/discharging operations are carried out frequently.

The differential amplifier shown in FIG. 5 differs from that shown in FIG. 1 in that, in FIG. 1, the action on the potential of the terminals 10 and 20, changed with the bootstrap, is a constant operation not dependent on the output voltage, whereas, in FIG. 5, the action is dependent on the output voltage immediately before connection switching (Vout1 or Vout2).

If, with the differential amplifier, shown in FIG. 1, connection switching is performed in driving with a small amplitude, it may be an occurrence that the output voltage is appreciably changed by the bootstrap operation, thus producing overshoot or undershoot.

Conversely, with the differential amplifier, shown in FIG. 5, the overshoot or the undershoot, due to the bootstrap operation, may be suppressed to a small value even in the case of driving with a small amplitude.

The reason therefor is now explained, taking an example of the voltage decreasing action to the potential of the terminal 10 in the bootstrap operation of the differential amplifier, shown in FIG. 5, under switching control shown in FIG. 6. The potential of the terminal 10, immediately following the connection switching during transition from the output period T2 to the output period T1, is subjected to the voltage decreasing action to the voltage (2Vout2−V20), as discussed above.

This voltage decreasing action depends on the output voltage Vout2, immediately previous to the connection switching (output period T2). For example, if the voltage Vout2 is equipotential to V20, the potential of the terminal 10 immediately following the connection switching is subjected to the voltage decreasing action to the voltage V20.

On the other hand, if the voltage Vout2 immediately previous to the connection switching is such that Vout2<V20 in the vicinity of the low potential side power supply VSS, the potential of the terminal 10 immediately following the connection switching is subjected to a strong voltage decreasing action to a potential lower than the voltage V20. If the voltage Vout2 is slightly higher such that Vout2>V20, the potential of the terminal immediately following the connection switching is subjected to a weak voltage decreasing action to a potential higher than the voltage V20. That is, the lower the output voltage Vout2 immediately before connection switching, the stronger is the voltage decreasing action subjected to the potential of the terminal 10 immediately following the connection switching, and the higher the voltage Vout2, the weaker is voltage decreasing action subjected to the potential of the terminal 10 immediately following the connection switching.

Hence, the charging action by the bootstrap immediately following the connection switching is stronger and weaker the lower and higher the output voltage Vout (=Vout2) immediately previous to the connection switching, respectively. The same applies for the voltage increasing action applied to the potential of the terminal 20, such that the discharge action by the bootstrap immediately following the connection switching is stronger and weaker the higher and lower the output voltage Vout (=Vout1) immediately previous to the connection switching, respectively.

In similar manner, in performing switch control, shown in FIG. 7, on the differential amplifier, shown in FIG. 5, the charging action by bootstrap immediately following the connection switching becomes stronger and weaker the lower and the higher the output voltage Vout (=Vout2) immediately previous to the connection switching, respectively, while the discharge action by bootstrap immediately following the connection switching becomes stronger and weaker the higher and the lower the output voltage Vout (=Vout1) immediately previous to the connection switching, respectively.

Thus, the differential amplifier, shown in FIG. 5, is able to effect high-speed driving, by the strong bootstrap operation, for large amplitude driving, and to effect driving with suppressed overshoot or undershoot, by the weak bootstrap operation, for small amplitude driving in the vicinity of an intermediate voltage.

Figure 8:
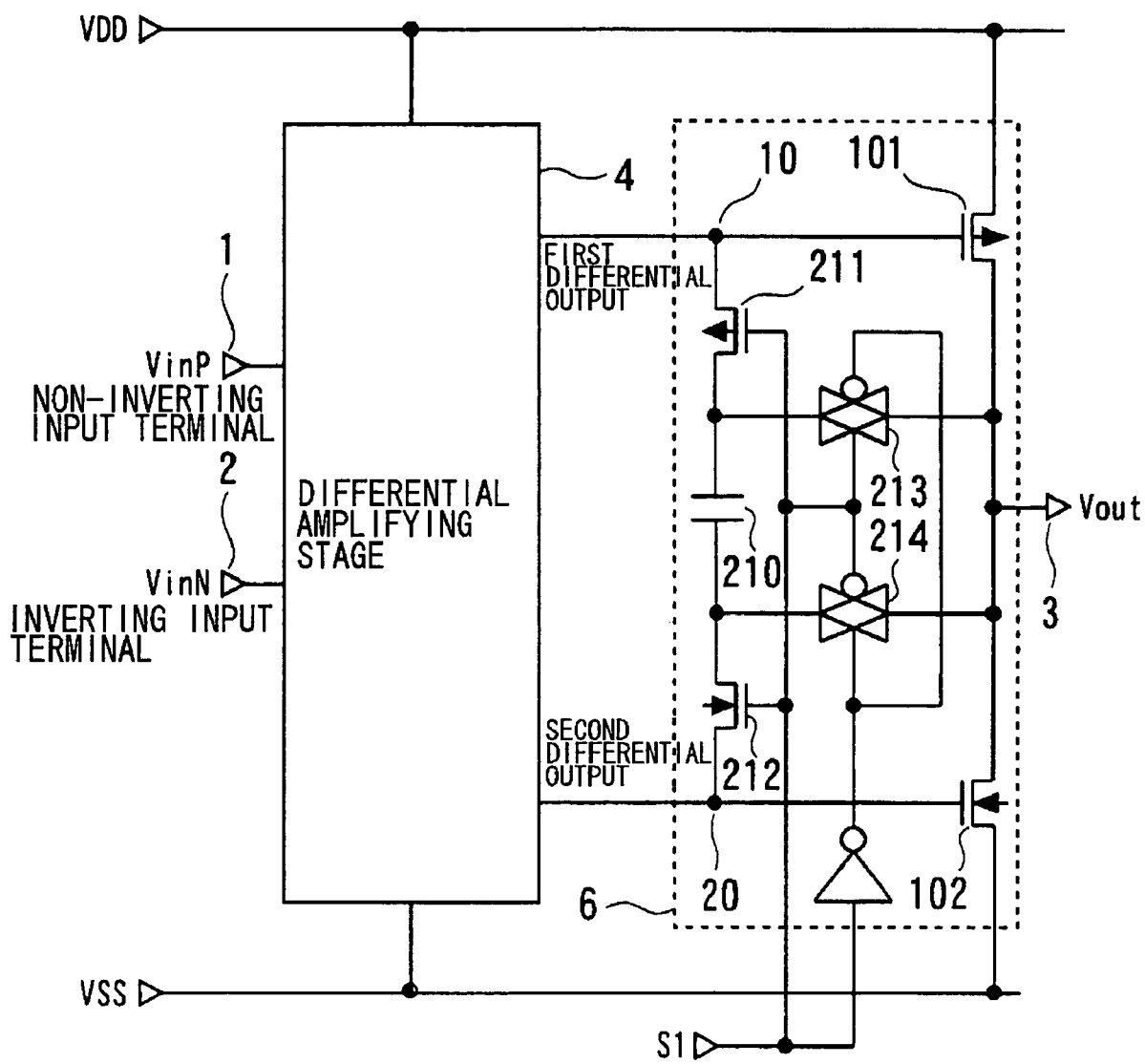
FIG. 8 shows a concrete configuration of the second embodiment of the present invention.

FIG. 8 shows a concrete example of the embodiment shown in FIG. 5. Referring to FIG. 8, showing the present embodiment, switches 211 and 212 are formed by a P-channel transistor and an N-channel transistor, the respective gates of which are supplied with an external signal S1, while switches 213 and 214 are each formed by a transfer gate switch supplied with the external signal S1 and an inverted version of the signal S1, respectively. Although parasitic capacitances C211 and C212 are not shown, these are immanent as parasitic capacitances across the drains and the sources of the transistors 211 and 212. In FIG. 8, the external signal S1 is controlled as shown in FIGS. 9 and 10.

Figure 9:
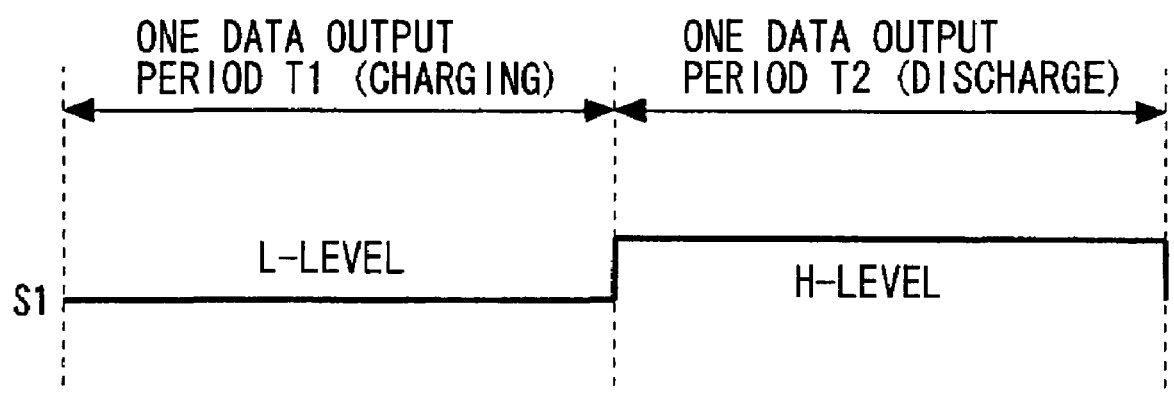
FIG. 9 shows an example of the timing of the signal S1 in the concrete configuration of the second embodiment of the present invention.

Referring to FIG. 9, the external signal S1 is changed, as a given data output period T1 for charging begins, from a high level to a low level, while being changed, as a given data output period T2 for discharge begins, from a low level to a high level. By so doing, the switches 211 and 214 are turned on and the switches 212 and 213 are turned off, during the data output period T1, while the switches 211 and 214 are turned off and the switches 212 and 213 are turned on, during the data output period T2, thus realizing the operation and favorable effect which are the same as those of the differential amplifier of FIG. 5 under switch control shown in FIG. 6.

Figure 10:
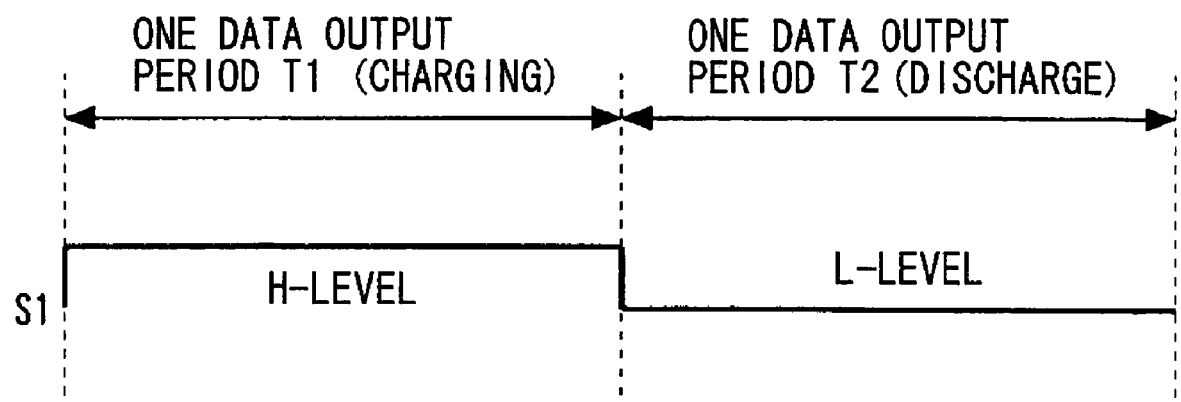
FIG. 10 shows another example of the timing of the signal S1 in the concrete configuration of the second embodiment of the present invention.

Referring to FIG. 10, the external signal S1 is changed, as a given data output period T1 for charging begins, from a low level to a high level, while being changed, as a given data output period T2 for discharge begins, from a high level to a low level. By so doing, the switches 211 and 214 are turned off and the switches 212 and 213 are turned on, during the data output period T1, while the switches 211 and 214 are turned on and the switches 212 and 213 are turned off during the data output period T2, thus realizing the operation and favorable effect which are the same as those of the differential amplifier of FIG. 5 under switch control shown in FIG. 7.

Figure 11:
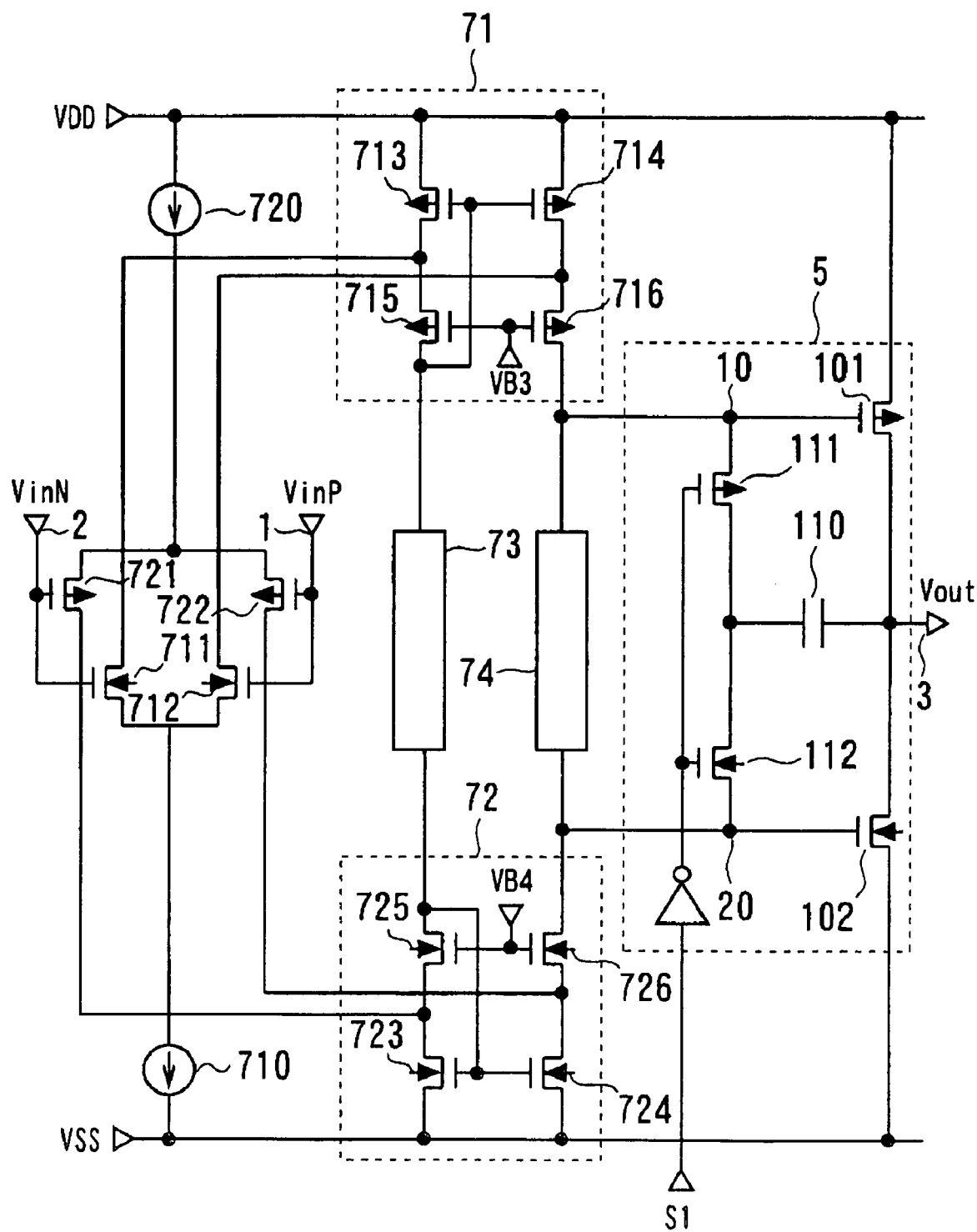
FIG. 11 shows the configuration of a third embodiment of the present invention.
Figure 29:
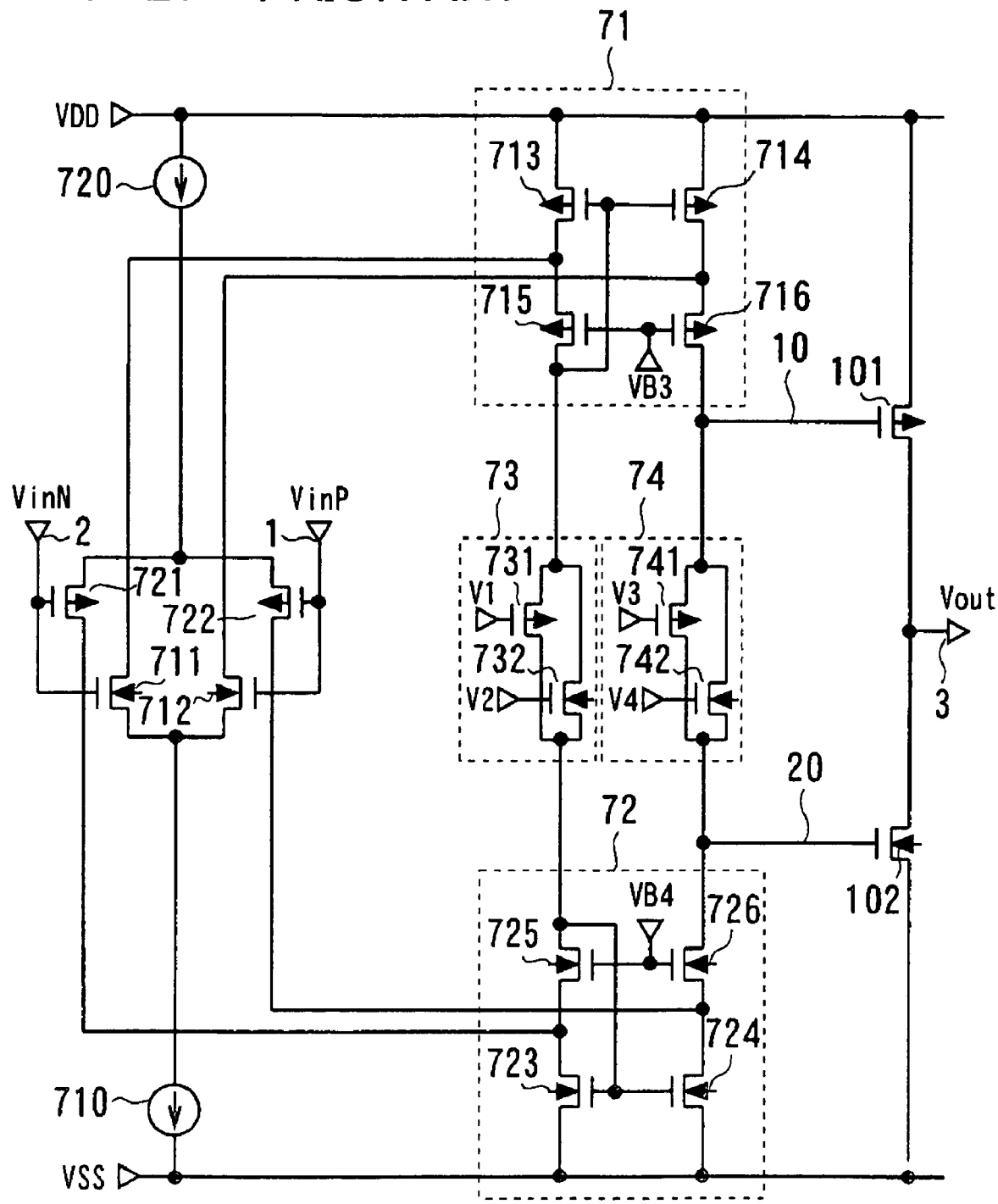
FIG. 29 shows an example of a conventional differential amplifier.
Figure 30:
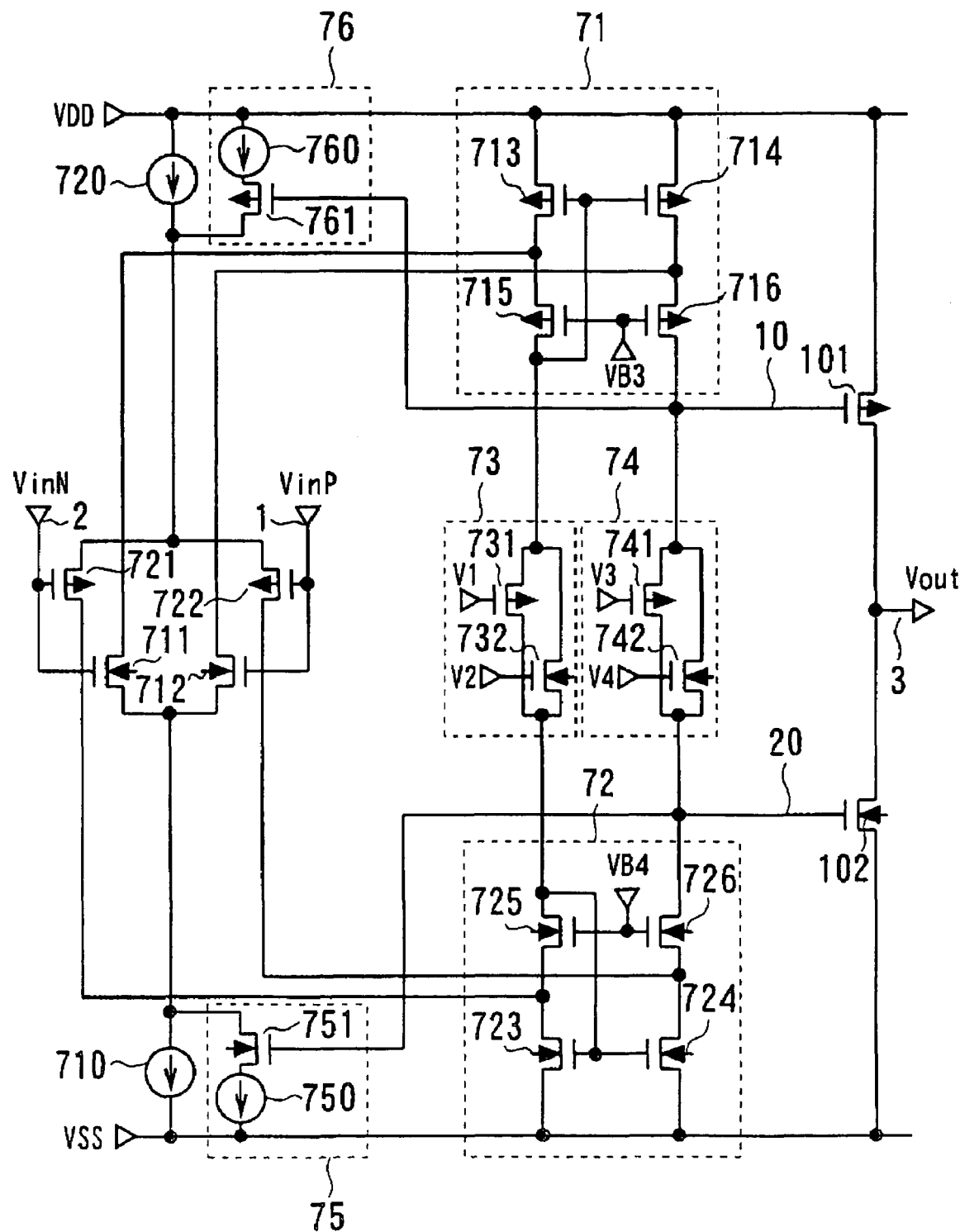
FIG. 30 shows another example of a conventional differential amplifier.

FIG. 11 is a diagram showing the configuration of a differential amplifier according to a third embodiment of the present invention. FIG. 11 shows an embodiment in which a differential amplifier shown in FIG. 29 is applied as the differential amplifying stage 4 shown in FIG. 3. Referring to FIG. 11, the configuration of the differential amplifying stage is now explained. The differential amplifying stage, shown in FIG. 11, is made up by an N-channel differential pair 711, 712, driven by a current source 710, a P-channel differential pair 721, 722, driven by a current source 720, a cascode type current mirror circuit 71, composed of transistors 713 to 716, a cascode type current mirror circuit 72, composed of transistors 723 to 726, and floating current sources 73 and 74. The concrete configuration of the floating current sources 73 and 74, not explained herein, is the same in structure and operation as that shown in FIG. 29. The VDD and the VSS are a high potential side power supply and a low potential side power supply, respectively. An output of the N-channel differential pair 711, 712 is supplied to the current mirror circuit 71, while an output of the P-channel differential pair 721, 722 is supplied to the current mirror circuit 72. The current mirror circuits 71 and 72 are connected by the floating current sources 73 and 74. A connection node of the transistor 716 and the floating current source 74 forms a differential first output terminal 10 of the differential amplifying stage, while a connection node of the transistor 726 and the floating current source 74 forms a differential second output terminal 20 of the differential amplifying stage. The transistors 712 and 722 are connected to the input terminal 1 to form a non-inverting input terminal, while the transistors 711 and 721 are connected to the input terminal 2 to form an inverting input terminal. The non-inverting input terminal 1 and the inverting input terminal 2 are supplied with voltages VinP and VinN, respectively. The detailed operation of the differential amplifying stage is similar to that explained with reference to FIG. 29.

The configuration of the output amplifying stage 5 of FIG. 11 is the same as that shown in FIG. 3. That is, the output amplifying stage 5 is made up by a P-channel transistor 101, connected across the output terminal 3 and the high potential side power supply VDD and having a gate connected to the first differential output terminal 10, an N-channel transistor 102, connected across the output terminal 3 and the low potential side power supply VSS and having a gate connected to the second differential output terminal 20, and a capacitor element 110, having one end connected to the output terminal 3 and having the other end connected to the terminals 10 and 20 through P-channel transistor switch 111 and N-channel transistor switch 112, respectively. The respective gates of the transistor switches 111 and 112 are supplied with am inverted version of the external signal S1. To the output terminal 3 is connected an external load (data line load), not shown.

In the configuration of the differential amplifier of FIG. 11, the differential amplifying stage 4 and the push-pull stage (transistors 101 and 102) are the same in structure as the differential amplifier of FIG. 29. The operation of the differential amplifier of FIG. 11 is now explained. Meanwhile, the following explanation is made of the operation of a voltage follower structure in which the inverting input terminal 2 and the output terminal 3 are connected common. In the voltage follower structure, an output voltage Vout is fed back as an input voltage VinN of the inverting input terminal, whereby it is possible to drive the output voltage Vout to a voltage equal to the voltage VinP of the non-inverting input terminal.

First, the operation of the differential amplifier of FIG. 11, in which the external signal S1 is fixed at a high level or at a low level, without dependency on whether the operation is the charging operation or the discharging operation, is explained. At this time, the capacitor element 110 is connected across the terminal 10 and the output terminal 3 or across the terminal 20 and the output terminal 3. However, since the connection state is fixed, the capacitor element 110 operates simply as a phase compensation capacitance. Thus, the operation of the differential amplifier, shown in FIG. 11, is similar to that of the differential amplifier of FIG. 29, that is, the output voltage Vout is changed at a constant slew rate against changes in the input signal VinP.

The operation of the differential amplifier, shown in FIG. 11, in which the connection state of the capacitor element 110 is fixed, is hereinafter explained. The operation of the differential amplifier of FIG. 11 at this time is such that a steady state is reached when the voltage VinP of the non-inverting input terminal is equal to the output voltage Vout. In the steady state, the current flowing in the differential transistor pairs of the same polarity is the same. The two channel current paths, flowing from the current mirror circuit 71 through the floating current sources 73 and 74 to the current mirror circuit 72, are controlled by the floating current sources 73 and 74 to respective constant current intensities.

If, in the data output period for charging, the voltage VinP of the non-inverting input terminal is changed to a certain high potential side voltage, the current flowing in the transistor 711 and that flowing in the transistor 712, in the N-channel differential pair 711, 712, are decreased and increased, respectively. As the current flowing through the transistor 711 is decreased, the current flowing in the transistor 713 is decreased, while the current flowing through the transistors 714 and 716 is also decreased by the current mirror circuit 71. Since the floating current source 74 tends to cause the same constant current as that in the steady state to flow at this time from the connection node to the transistor 716 (terminal 10) to the connection node to the transistor 726 (terminal 20), the potential of the terminal 10 is pulled down to enlarge the gate-to-source voltage of the transistor 101 to increase the charging current from the power supply VDD to the output terminal 3. On the other hand, if the voltage VinP of the non-inverting input terminal is changed to a certain high potential side voltage, the current flowing in the transistor 721 and that flowing in the transistor 722, in the P- channel differential pair 721, 722, are increased and decreased, respectively. As the current flowing through the transistor 721 is increased, the current flowing in the transistor 723 is also increased, while the current flowing through the transistors 724 and 726 is also decreased by the current mirror circuit 72. Since the floating current source 74 at this time tends to cause the same constant current as that in the steady state to flow from the connection node (terminal 10) to the transistor 716 towards the connection node to the transistor 726 (terminal 20), the potential of the terminal 20 is pulled down to decrease the gate-to-source voltage of the transistor 102 to decrease the discharge current from the output terminal 3 to the power supply VSS. By such action, the output voltage Vout is stabilized when it has increased to VinP to enter into the steady state.

In a data output period, when the voltage VinP of the non-inverting input terminal is changed to a certain voltage on the low potential side, the current flowing through the N-channel transistor pair 711, 712 is such that the current flowing through the transistor 711 is increased, while that flowing through the transistor 712 is decreased. With increase in the current flowing through the transistor 711, the current flowing through the transistor 713 is also increased, such that, by the current mirror circuit 71, the current flowing through the transistors 714 and 716 is increased. Since the floating current source 74 at this time tends to cause the same constant current as that in the steady state to flow from the connection node (terminal 10) to the transistor 716 towards the connection node to the transistor 726 (terminal 20), the potential of the terminal 10 is pulled up to decrease the gate-to-source voltage of the transistor 101 to decrease the charging current from the power supply VDD to the output terminal 3. On the other hand, the current flowing through the P-channel transistor pair 721, 722 is such that the current flowing through the transistor 721 is decreased, while that flowing through the transistor 722 is increased. With decrease in the current flowing through the transistor 721, the current flowing through the transistor 723 is decreased, such that, by the current mirror circuit 72, the current flowing through the transistors 724 and 726 is decreased. Since the floating current source 74 at this time tends to cause the same constant current as that in the steady state to flow from the connection node (terminal 10) to the transistor 716 towards the connection node to the transistor 726 (terminal 20), the potential of the terminal 20 is pulled up to enlarge the gate-to-source voltage of the transistor 102 to increase the discharge current from the output terminal 3 towards the power supply VSS. By such action, the output voltage Vout is stabilized to enter into the steady state when it has decreased to the voltage VinP.

The operation of the voltage follower structure in the differential amplifier of FIG. 11 in case the external signal S1 is controlled as in FIG. 4 is explained. As in FIG. 4, in a given data output period T1 for charging, the external signal S1 is changed from a low level to a high level, as the output period begins. In a given data output period T2 for discharge, the external signal S1 is changed from a high level to a low level, as the output period begins. Thus, the switches 111 and 112 are turned on and off, in the data output period T1, while the switches 111 and 112 are turned off and on, in the data output period T2. The operation by this switch control is the same as that of the differential amplifier of FIG. 1.

During transition from the output period T2 to the output period T1, the voltage VinP of the non-inverting input terminal is changed to a high potential side voltage, while the capacitor element 110 is changed over from the state in which it is connected across the terminal 20 and the output terminal 3 to the state in which it is connected across the output terminal 3 and the terminal 10, as the output period begins. Immediately after the connection switching, the potential of the terminal 10 is instantaneously pulled down by the bootstrap operation, whereby the gate-to-source voltage of the transistor 101 is enlarged to produce a momentary charging action for the output terminal 3.

As the output period T1 begins, the differential amplifying stage commences its operation responsive to the voltage change to the high potential side of the voltage VinP. However, there is a delay of response until the output is transmitted to the differential output terminals 10 and 20. The result is that the operation start timing of the output amplifying stage 5 by the output of the differential amplifying stage is delayed as compared to that of the bootstrap charging which is in operation instantaneously with the start of the time T1, such that the charging operation by the output of the differential amplifying stage is predominant over the bootstrap charging only when the bootstrap charging has proceeded partway. Consequently, the operation from the output period T2 to the output period T1 of the differential amplifier of FIG. 11 is such that, with the start of the output period T1, the charging operation for the output terminal 3 occurs instantaneously to raise the output voltage Vout a certain quantity, after which there occurs the charging operation with a constant slew rate. The stable steady state is established when the output voltage Vout has reached a voltage equal to the voltage VinP.

During transition from the output period T1 to the output period T2, the voltage VinP of the non-inverting input terminal is changed to a certain low potential side voltage, while the capacitor element 110 is changed over from the state in which it is connected across the terminal 10 and the output terminal 3 to the state in which it is connected across the terminal 20 and the output terminal 3, as the output period begins. Immediately after the connection switching, the potential of the terminal 20 is instantaneously pulled up by the bootstrap operation, whereby the gate-to-source voltage of the transistor 102 is enlarged to produce a momentary discharging action for the output terminal 3.

As the output period T2 begins, the differential amplifying stage commences its operation responsive to the voltage change to the low potential side of the voltage VinP. However, there is a delay of response until the output is transmitted to the differential output terminals 10 and 20. The result is that the operation start timing of the output amplifying stage 5 by the output of the differential amplifying stage is delayed as compared to that of the bootstrap discharging which is in operation instantaneously with the start of the time T2, such that the discharging operation by the output of the differential amplifying stage is predominant over the bootstrap discharging only when the bootstrap discharging has proceeded partway. Consequently, the operation from the output period T1 to the output period T2 of the differential amplifier of FIG. 11 is such that, with the start of the output period T2, the discharging operation for the output terminal 3 occurs instantaneously to pull down the output voltage Vout a certain quantity, after which there occurs the discharging operation with a constant slew rate. The stable steady state is established when the output voltage Vout has reached a voltage equal to the voltage VinP.

With the differential amplifier, described above, the operation and the favorable effect as explained with reference to FIGS. 1 and 3 may be realized under control by the external signal S1. That is, at the beginning phase of a given data output period for charging or discharge, the bootstrap operation is produced to realize the charging and the discharging operations faster than those possible conventionally. Moreover, the high-speed operation may be achieved without increasing the current consumption. It is noted that the high operating speed by the bootstrap operation is effective in the driving of large amplitudes, while being unneeded in the driving of small amplitudes. In the latter case, the switch state is not changed and the connection state of the capacitor element 110 may be maintained, whereby the bootstrap operation is not produced and hence the driving of small amplitudes may be performed with the usual differential amplifier. On the other hand, with the differential amplifier, shown in FIG. 11, the high-speed operation may be realized, as the power dissipation is suppressed, even though the charging/discharging operations are carried out frequently.

Figure 12:
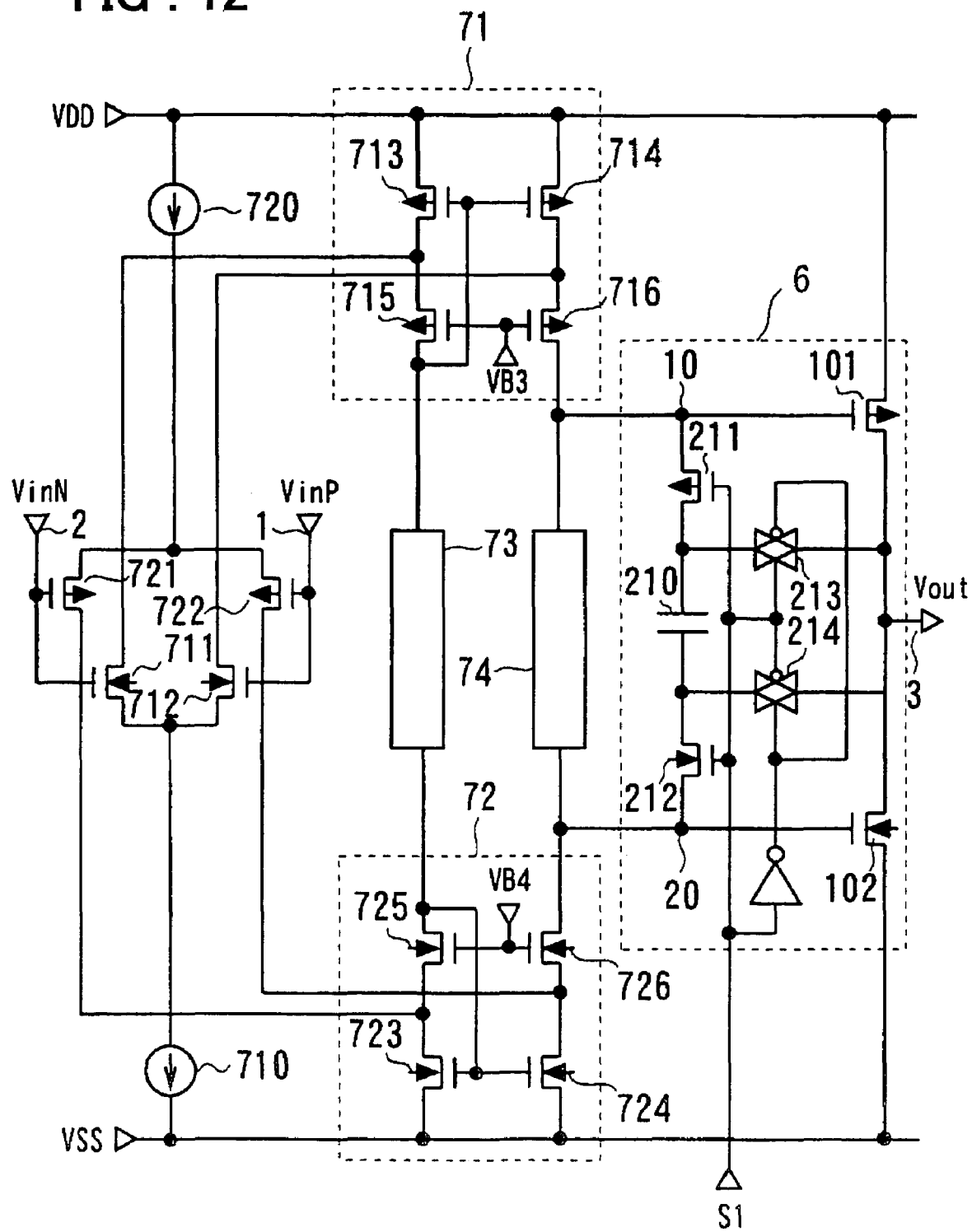
FIG. 12 shows the configuration of a fourth embodiment of the present invention.

FIG. 12 is a diagram showing the configuration of a fourth embodiment of the differential amplifier of the present invention. In the embodiment of FIG. 12, which is a concrete example of the differential amplifying stage 4 of FIG. 8, the present invention is applied to the differential amplifier of FIG. 29. The differential amplifying stage of FIG. 12 is similar in structure to the differential amplifying stage of FIG. 11 and hence is not explained specifically. The configuration of the output amplifying stage 6 of FIG. 12 is the same as that shown in FIG. 8. That is, the output amplifying stage is made up by a P-channel transistor 101, connected across the output terminal 3 and the high potential side power supply VDD and having a gate connected to the first differential output terminal 10, an N-channel transistor 102, connected across the output terminal 3 and the low potential side power supply VSS and having a gate connected to the second differential output terminal 20, and a capacitor element 210, having one end connected to the terminal 10 and the output terminal 3 through a P-channel transistor switch 211 and a transfer gate switch 213, and having the other end connected to the terminal 20 and the output terminal 3 through an N-channel transistor switch 212 and a transfer gate switch 214, respectively. The respective gates of the transistor switches 211 and 212 are supplied with the external signal S1, while the transfer gate switches 213 and 214 are supplied with the external signal S1 and the inverted version thereof. The ransistor switches 211 and 212 have drain-source parasitic capacitances, not shown. These parasitic capacitances are labeled C211 and C212. To the output terminal 3 is connected an external load (data line load), not shown.

The section of the differential amplifier of FIG. 12, comprising the differential amplifying stage and the push-pull output stage, including the differential amplifying stage and the transistors 101 and 102, is similar in structure to the differential amplifier of FIG. 29, as in FIG. 11. The following explanation is made of the operation of the voltage follower structure in the differential amplifier of FIG. 12 is explained. In case the external signal S1 is fixed at a high level or at a low level, without dependency on whether the operation is the charging operation or the discharging operation, the capacitor element 210 is connected across the terminal 10 and the output terminal 3 or across the terminal 20 and the output terminal 3. At this time, the capacitor element 210 operates simply as a phase compensation capacitance. Hence, the operation of the differential amplifier, shown in FIG. 12, is similar to that of the differential amplifier of FIG. 29, that is, the output voltage Vout is changed at a constant slew rate against changes in the input signal VinP.

The operation of the voltage follower structure in the differential amplifier of FIG. 12, in case the external signal S1 is controlled as shown in FIGS. 9 and 10, is explained. In the control of FIG. 9, in a given data output period T1 for charging and in a given data output period T2 for discharge, the external signal S1 is changed from a high level to a low level, and from a low level to a high level, as each of the output periods begins, respectively. In the control of FIG. 10, in a given data output period T1 for charging and in a given data output period T2 for discharge, the external signal S1 is changed from the low level to the high level and from the high level to the low level, as each of the output periods begins, respectively. Thus, in the control of FIG. 9 and in the control of FIG. 10, the on/off states of the switches 211 to 214 are controlled during the output periods T1 and T2, such that the operation similar to that explained in connection with the differential amplifier of FIGS. 5 and 8 are obtained. That is, during transition from the output period T2 to the output period T1, the voltage VinP of the non-inverting input terminal is changed to a high potential side voltage, while the connection state of the capacitor element 210 is changed over, as the output period begins. Immediately after the connection switching, the potential of the terminal 10 is instantaneously pulled down by the bootstrap operation, whereby the gate-to-source voltage of the transistor 101 is enlarged to produce a momentary charging action for the output terminal 3.

As the output period T1 begins, the differential amplifying stage commences its operation responsive to the change to the high potential side of the voltage VinP. However, there is a delay of response until the output is transmitted to the differential output terminals 10 and 20. The result is that the operation start timing of the output amplifying stage 6 by the output of the differential amplifying stage is delayed as compared to that of the bootstrap charging which is in operation instantaneously with the start of the time T1, such that the charging operation by the output of the differential amplifying stage is predominant over the bootstrap charging only when the bootstrap charging has proceeded partway. Consequently, the operation from the output period T2 to the output period T1 of the differential amplifier of FIG. 12 is such that, with the start of the output period T1, the charging operation for the output terminal 3 occurs instantaneously to raise the output voltage Vout a certain quantity, after which there occurs the charging operation with a constant slew rate. The stable steady state is established when the output voltage Vout has reached a voltage equal to the voltage VinP.

During transition from the output period T1 to the output period T2, the voltage VinP of the non-inverting input terminal is changed to a certain low potential side voltage, while the connection state of the capacitor element 210 is changed over, as the output period begins. Immediately after the connection switching, the potential of the terminal 20 is instantaneously pulled up by the bootstrap operation, whereby the gate-to-source voltage of the transistor 102 is enlarged to produce a momentary discharging operation.

As the output period T2 begins, the differential amplifying stage commences its operation responsive to the voltage change to the low potential side of the voltage VinP. However, there is a delay of response until the output is transmitted to the differential output terminals 10 and 20. The result is that the operation start timing of the output amplifying stage 6 by the output of the differential amplifying stage is delayed as compared to that of the bootstrap discharging which is in operation instantaneously with the start of the time T2, such that the discharging operation by the output of the differential amplifying stage is predominant over the bootstrap discharging only when the bootstrap discharging has proceeded partway. Consequently, the operation from the output period T1 to the output period T2 of the differential amplifier of FIG. 12 is such that, with the start of the output period T2, the discharging operation at the output terminal 3 occurs instantaneously to pull down the output voltage Vout a certain quantity, after which there occurs the discharging operation with a constant slew rate. The stable steady state is established when the output voltage Vout is equal to the voltage VinP.

With the differential amplifier of FIG. 12, described above, the operation and the favorable effect as explained with reference to FIGS. 5 and 8 may be realized under control by the external signal. That is, at the beginning phase of a given data output period for charging or discharge, the bootstrap operation is produced to realize the charging and the discharging operations faster than those possible conventionally. Moreover, the high-speed operation may be achieved without increasing the current consumption. It is noted that the high operating speed by the bootstrap operation is effective in the driving of large amplitudes, while being unneeded in the driving of small amplitudes. In the latter case, the switch state is not changed and the connection state of the capacitor element 210 may be maintained, whereby the bootstrap operation is not produced and hence the driving of small amplitudes may be performed with the usual differential amplifier. On the other hand, with the differential amplifier, shown in FIG. 12, the high-speed operation may be realized, as the power dissipation is suppressed, even though the charging discharging operations are carried out frequently.

Figure 13:
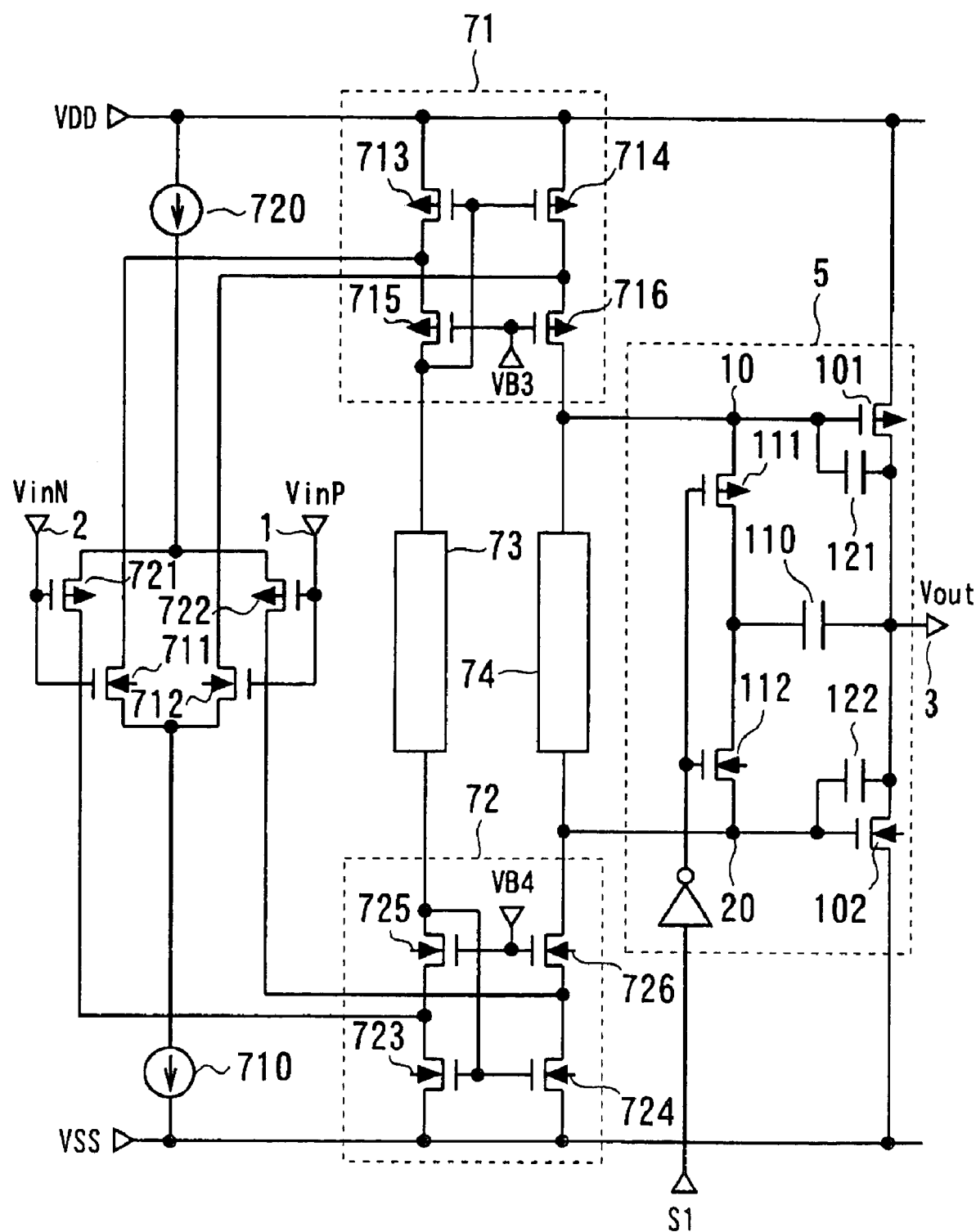
FIG. 13 shows an example of application of the third embodiment of the present invention.
Figure 14:
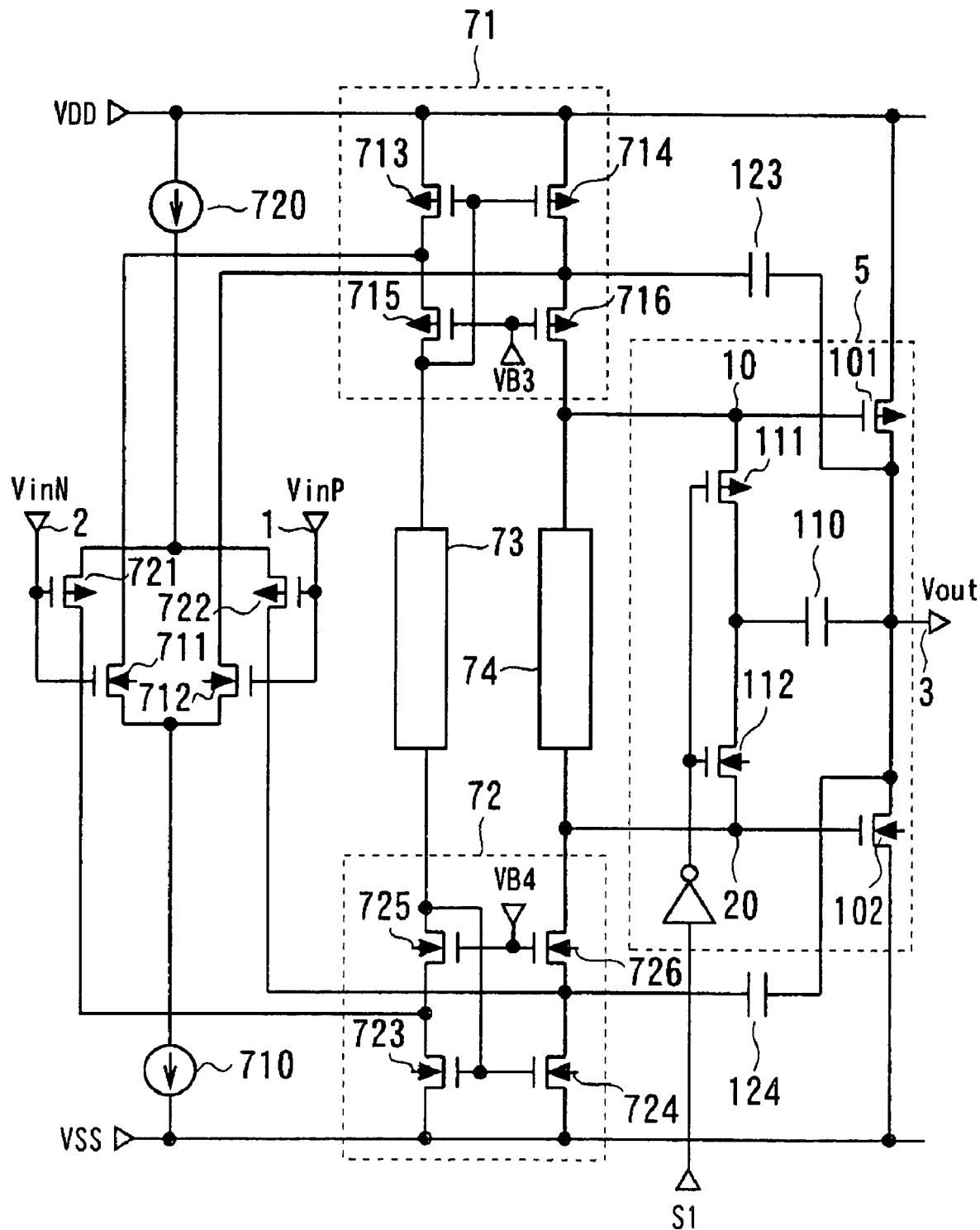
FIG. 14 shows another example of application of the third embodiment of the present invention.

FIGS. 13 and 14 each show an example of application of FIG. 11. In the circuit structure, shown in FIG. 13, a capacitor element 121 is provided across the terminal 10 and the output terminal 3, and another capacitor element 122 is provided across the terminal 20 and the output terminal 3. In the circuit structure, shown in FIG. 14, a further capacitor element 123 is provided across a connection node of transistors 714 and 716 and the output terminal 3, whilst a further capacitor element 124 is provided across a connection node of transistors 724 and 726 and the output terminal 3. The operation by the capacitor elements 121 and 122 and the capacitor elements 123 and 124 is hereinafter explained.

In the differential amplifier of FIG. 11, the capacitor element 110 operates not only as a bootstrap capacitance but also as a phase compensation capacitance. However, the capacitor element 110 is in a state in which it is connected across the terminal 10 and the output terminal 3 or in a state in which it is connected across the terminal 20 and the output terminal 3, such that at least one of the terminals 10 and 20 is not connected to the capacitor element 110. For example, if, in a given data output period, the output voltage Vout is changed quickly, responsive to changes in the voltage difference between VinP and VinN, the charging ability of the transistor 101 and the discharge ability of the transistor 102 must be promptly in equilibrium with each other in order for the output voltage Vout to reach the stable state promptly. To this end, the potential of each of the terminals 10 and 20, connected to the respective gates of the transistors 101 and 102, need to be stabilized promptly.

In the differential amplifier of FIG. 11, the sides of the terminals 10 and 20, to which the capacitor element 110 is connected, are readily stabilized, because the capacitor element 110 performs phase compensation. However, the sides of these terminals, to which the capacitor element 110 is not connected, tend to be unstable if there is no other member responsible for the phase compensation. Thus, there are occasions where the output voltage Vout undergoes slight oscillations immediately after the output voltage Vout has reached the voltage VinP.

Conversely, in FIGS. 13 and 14, the capacitor elements 121 and 122 and the capacitor elements 123 and 124 are provided, in order that the sides of the terminal 10 and 20 not connected to the capacitor element 110 may be stabilized readily. Although the capacitor elements 123 and 124 of FIG. 14 are not directly connected to the terminals 10 and 20, the capacitor elements 123 and 124 are operative to stabilize the terminals 10 and 20, because the capacitor element 123 stabilizes the changes in the current supplied by the transistor 716 to the terminal 10, while the capacitor element 124 stabilizes the changes in the current extracted by the transistor 726 from the terminal 20.

That is, FIGS. 13 and 14 are configured for suppressing oscillations of the output waveform to effect waveform shaping. Meanwhile, the capacitor elements 121 and 122 and the capacitor elements 123 and 124 are preferably formed so as to be smaller in capacitance values than the capacitor element 110. The reason is that, if the capacitance values of the capacitor elements 121 and 122 and the capacitor elements 123 and 124 are increased, the variations occurring at the terminals 10 and 20 at the time of bootstrap operation tend to be suppressed. On the other hand, if this is exploited and designing is made in consideration of the ratio of the capacitance values of the capacitor element 110 and the capacitor elements 121 and 122 and the ratio of the capacitance values of the capacitor element 110 and the capacitor elements 123 and 124, it is possible to control the voltage rise level or the voltage drop level of the output voltage Vout at the time of the bootstrap operation. It is noted that FIGS. 13 and 14 show representative connection examples of the auxiliary capacitor elements 121 and 122 and 123, 124, such that connection may be made by other methods. For example, auxiliary capacitor elements may also be provided across the terminal 10 and the high potential side power supply VDD or across the terminal 20 and the low potential side power supply VSS. It is also possible to provide auxiliary capacitor elements that permit connection switching such that these auxiliary capacitor elements are connected to the sides of the terminals 10 and 20 not connected to the capacitor element 110 responsive to the connection switching of the capacitor element 110.

Figure 36A:
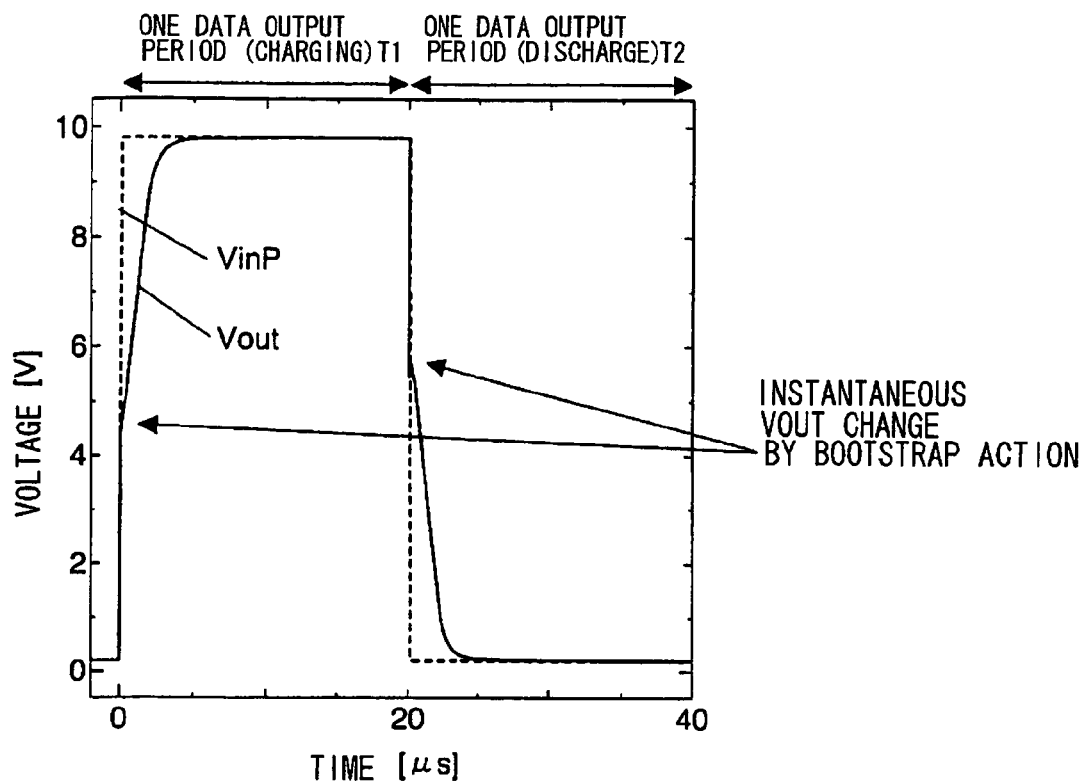
FIGS. 36A and 36B show an input/output voltage waveform of the embodiment of FIG. 14 (voltage follower configuration) by control of the signal S1, where
Figure 36B:
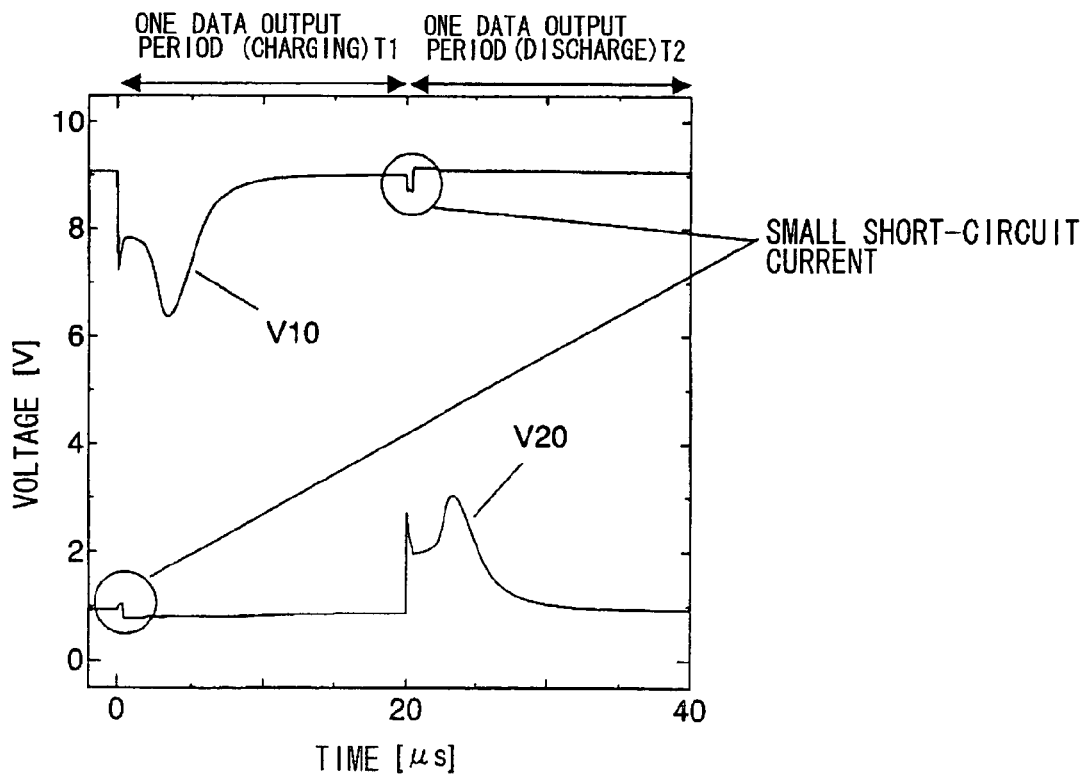

The operation of the differential amplifier of FIG. 14 is now explained with reference to a voltage waveform. Referring to FIG. 14, the auxiliary capacitor elements 123 and 124 are connected to a connection node between the first and second stages of the two-stage cascode current mirror and to the output terminal 3. FIG. 36A shows an input/output waveform (VinP, Vout) of the voltage follower configuration of FIG. 14 by the switch control of FIG. 4 (control by the signal S1). Referring to FIG. 36A, at the beginning of one output period T1 (charging), the output terminal voltage Vout rises to a certain voltage (close to 4.5V in the drawing) instantaneously (at a high slew rate), against the increase (rise) of the input terminal voltage VinP, by the bootstrap operation of the capacitor element 110, as explained above. The charging action by the transistor 101 then occurs, responsive to the outputting of the differential amplifying stage, that is, the output terminal voltage is increased to 10V as the slew rate is moderated, that is, with a less abrupt gradient. As the output period is changed over to the output period T2 (discharge), the output terminal voltage Vout instantaneously is lowered to a certain voltage (close to 5.5V in the drawing), against the decrease (fall) of the input terminal voltage VinP, by the bootstrap operation of the capacitor element 110. The discharge action by the transistor 102 then occurs, responsive to the output of the differential amplifying stage, such that the output terminal voltage is lowered to the low voltage side, as the slew rate is moderated, that is, with a less acute gradient. Meanwhile, the moderated slew rate (gradient) is approximately equal to the slew rate for the fixed connection of the capacitor element 110. FIG. 36(B) shows the voltage waveforms V10, V20 at the control terminals 10 and 20 of the push-pull output stage of FIG. 14, against changes in the output terminal voltage of FIG. 36A. From the curves of the voltage waveforms V10, V20, it may be confirmed whether or not redundant through-current (current flowing from VDD through the transistors 101 and 102 to the VSS and is also termed the short-circuit current) is produced by the bootstrap operation through the push-pull output stage of the differential amplifier of FIG. 14. Such short-circuit current is generated if, during the bootstrap operation immediately following the start of the output period, the voltages V10, V20 are changed simultaneously towards the low potential side and towards the high potential side, with respect to the potential for the stable state, respectively Although a slight short-circuit current is produced as indicated by circle marks in FIG. 36(B), the current value is only small, with the effect on the power dissipation being also small.

Figure 15:
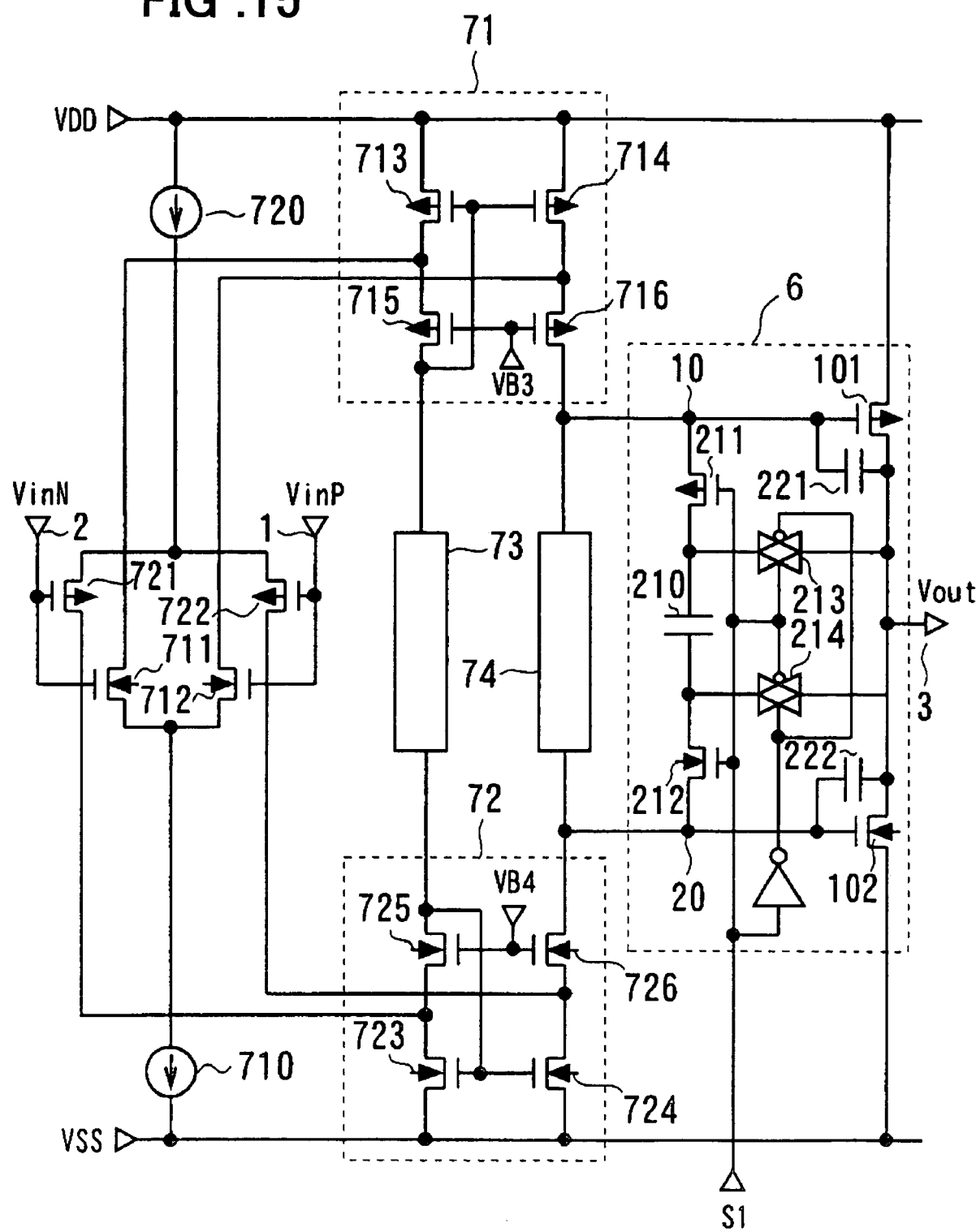
FIG. 15 shows an example of application of the fourth embodiment of the present invention.
Figure 16:
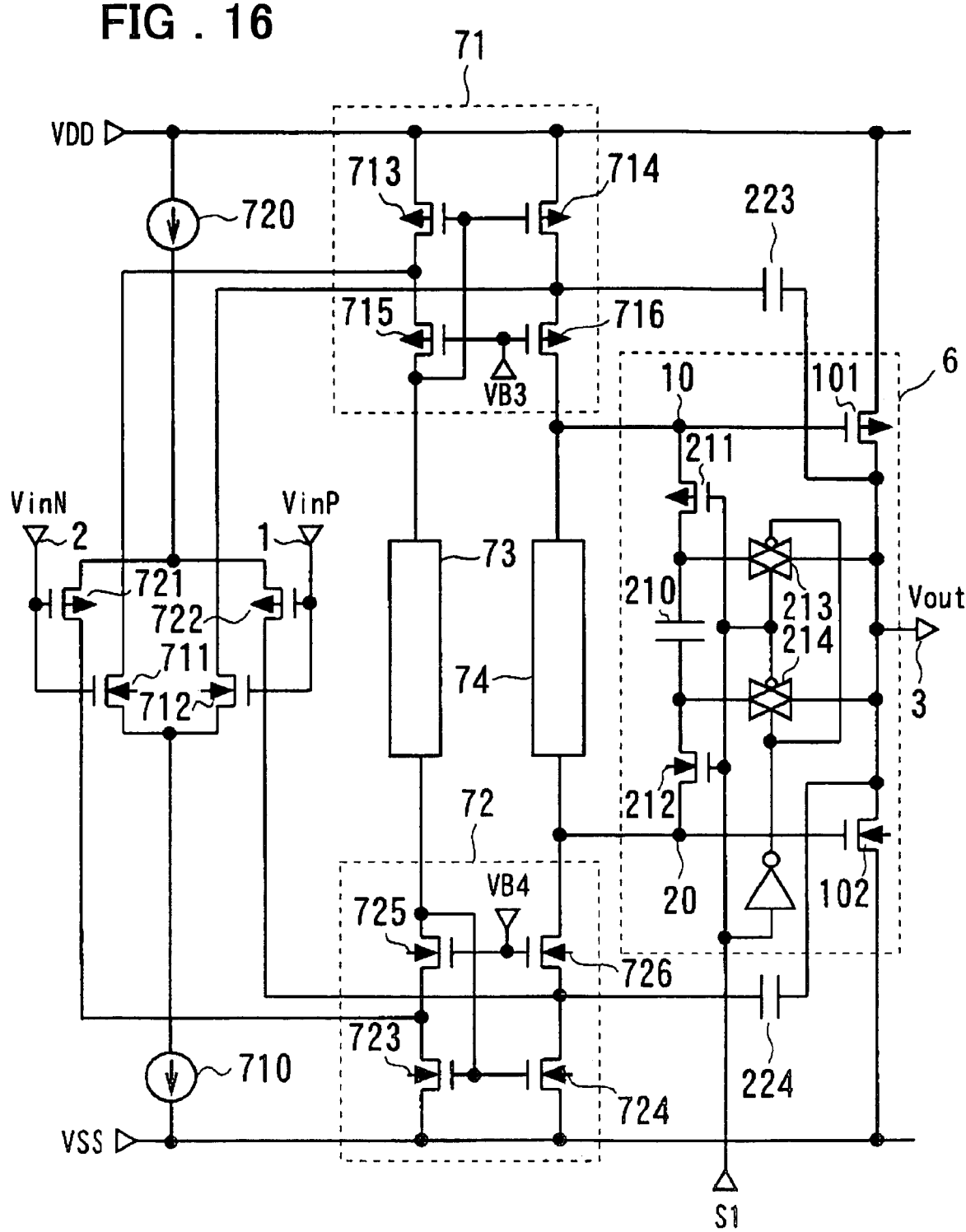
FIG. 16 shows another example of application of the fourth embodiment of the present invention.

FIGS. 15 and 16 each show an example of application of FIG. 12. In the circuit structure, shown in FIG. 15, a capacitor element 221 is provided across the terminal 10 and the output terminal 3, and another capacitor element 222 is provided across the terminal 20 and the output terminal 3.

In the circuit structure, shown in FIG. 16, a further capacitor element 223 is provided across a connection node of transistors 714 and 716 and the output terminal 3, whilst a further capacitor element 224 is provided across a connection node of transistors 724 and 726 and the output terminal 3. The operation by the capacitor elements 221, 222 and 223, 224 is the same as that shown in FIGS. 13 and 14 and is hereinafter explained only briefly. With the differential amplifier of FIG. 12, the capacitor element 210 operates not only as a bootstrap capacitance but also as a phase compensation capacitance. In order for the output voltage Vout to assume the stable state promptly when the output voltage Vout is changed quickly during a given data output period, responsive to changes in the voltage difference between VinP and VinN, the potentials of the terminals 10 and 20, connected to the gates of the transistors 101 and 102, must be stabilized promptly. However, at least one of the terminals 10 and 20 is not connected to the capacitor element 210.

Hence, in the structure shown in FIGS. 15 and 16, capacitor elements 221, 222 and the capacitor elements 223, 224 are provided, in order that the sides of the terminal 10 or 20 not connected to the capacitor element 110 may be stabilized readily. Although the capacitor elements 223, 224 of FIG. 16 are not directly connected to the terminals 10 and 20, the capacitor elements 223, 224 are operative to stabilize the terminals 10 and 20, because the capacitor elements 223, 224 stabilize the terminals 10 and 20 by the same operation as that of the capacitor elements 123 and 124 of FIG. 14.

That is, FIGS. 15 and 16 show the structure for suppressing oscillations of the output waveform to effect waveform shaping. Meanwhile, the capacitor elements 221, 222 and the capacitor elements 223, 224 are formed so as to be smaller in capacitance values than the capacitor element 210. The reason is that, if the capacitance values of the capacitor elements 221, 222 and the capacitor elements 223, 224 are increased, the variations occurring at the terminals 10 and 20 at the time of bootstrap operation tend to be suppressed. On the other hand, if this is exploited and designing is made in consideration of the ratio of the capacitance values of the capacitor element 210 and the capacitor elements 221, 222 and the ratio of the capacitance values of the capacitor element 210 and the capacitor elements 223, 224, it is possible to control the voltage rise level or the voltage drop level of the output voltage Vout at the time of bootstrap operation. It is noted that FIGS. 15 and 16 show representative connection examples of the auxiliary capacitor elements 221, 222 and 223, 224, such that connection may be made by other methods.

Figure 39A:
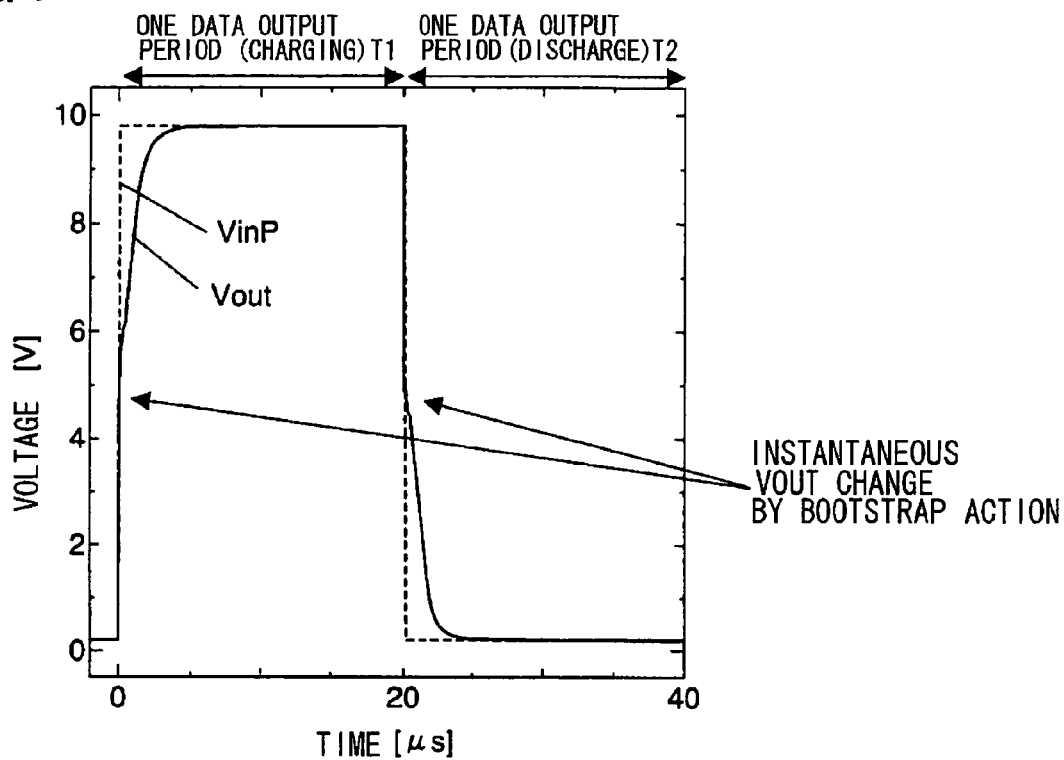
FIGS. 39A and 39B show an input/output voltage waveform of the embodiment of FIG. 16 (voltage follower configuration) by control of the signal S1, where
Figure 39B:
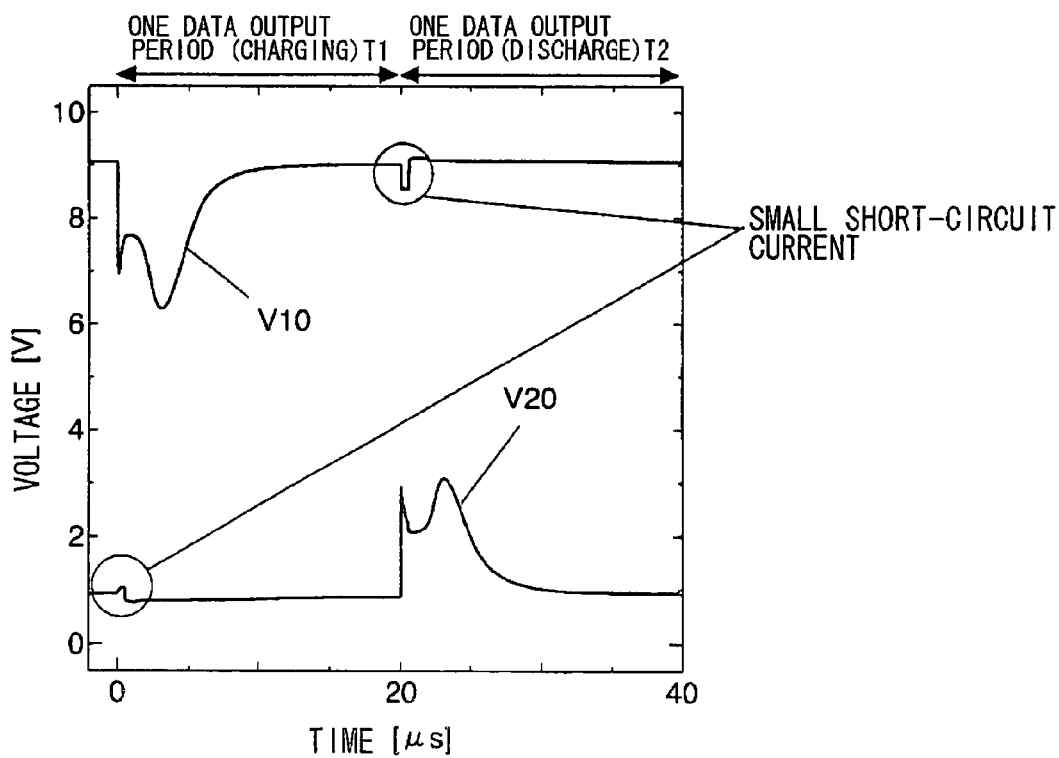

The operation of the differential amplifier of FIG. 16 is now explained with reference to a voltage waveform. Referring to FIG. 16, the auxiliary capacitor elements 223, 224 are connected between a connection node between the first and second stages of the two-stage cascode current mirror and the output terminal 3. FIG. 39A shows an input/output waveform (VinP, Vout) of the voltage follower configuration of FIG. 16 by the switch control of FIG. 9 (control by the signal S1). Referring to FIG. 39A, as the input terminal voltage VinP increases (rises), the output terminal voltage Vout rises instantaneously by the bootstrap operation of the capacitor element 210, as explained above. The output terminal voltage then rises at a moderated slew rate by the charging action of the transistor 101, based on the output of the differential amplifying stage. As the input terminal voltage VinP decreases (falls), the output terminal voltage Vout is decreased instantaneously, by the bootstrap operation of the capacitor element 210, and then is decreased, by the discharge action by the transistor 102, as the slew rate is moderated. The moderated slew rate (gradient) is approximately equal to the slew rate for the fixed connection of the capacitor element 210. FIG. 39(B) shows the voltage waveforms V10, V20 at the control terminals 10 and 20 of the push-pull output stage of FIG. 16, against changes in the output terminal voltage of FIG. 39A. From the curves of the voltage waveforms V10, V20, it may be confirmed, as in FIG. 36B, whether or not redundant short-circuit current is produced by the bootstrap operation through the push-pull output stage of the differential amplifier of FIG. 16. Although a slight short-circuit current is produced as indicated by circle marks in FIG. 39B, the current value is only small, with the effect on the power dissipation being also small.

Figure 42A:
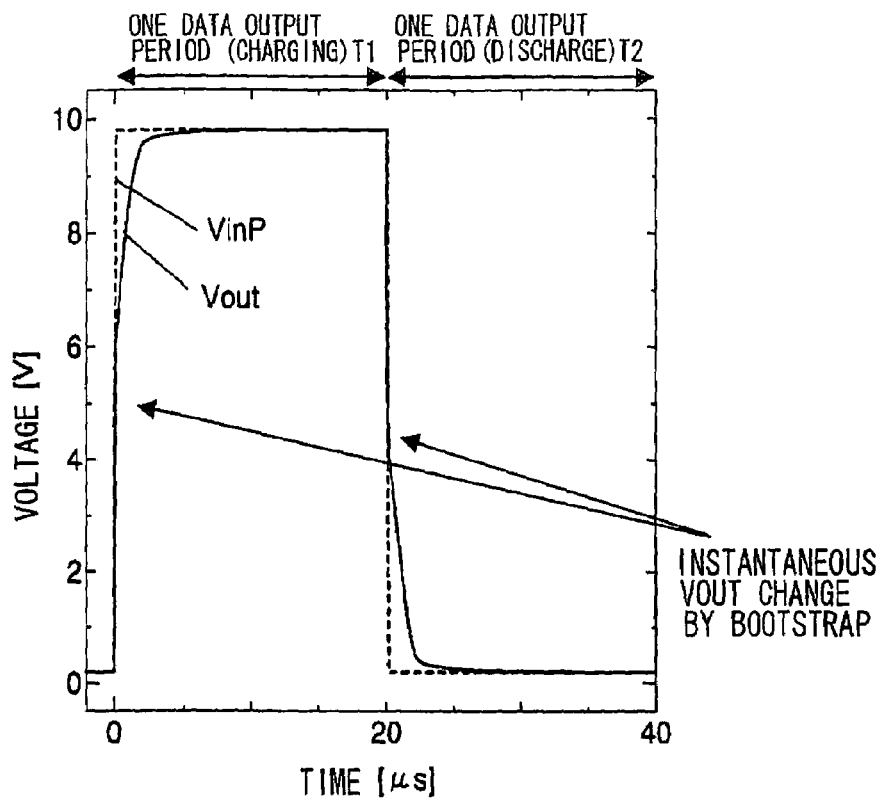
FIGS. 42A and 42B show an input/output voltage waveform of the embodiment of FIG. 16 (voltage follower configuration) by control of the signal S1 of FIG. 10, where
Figure 42B:
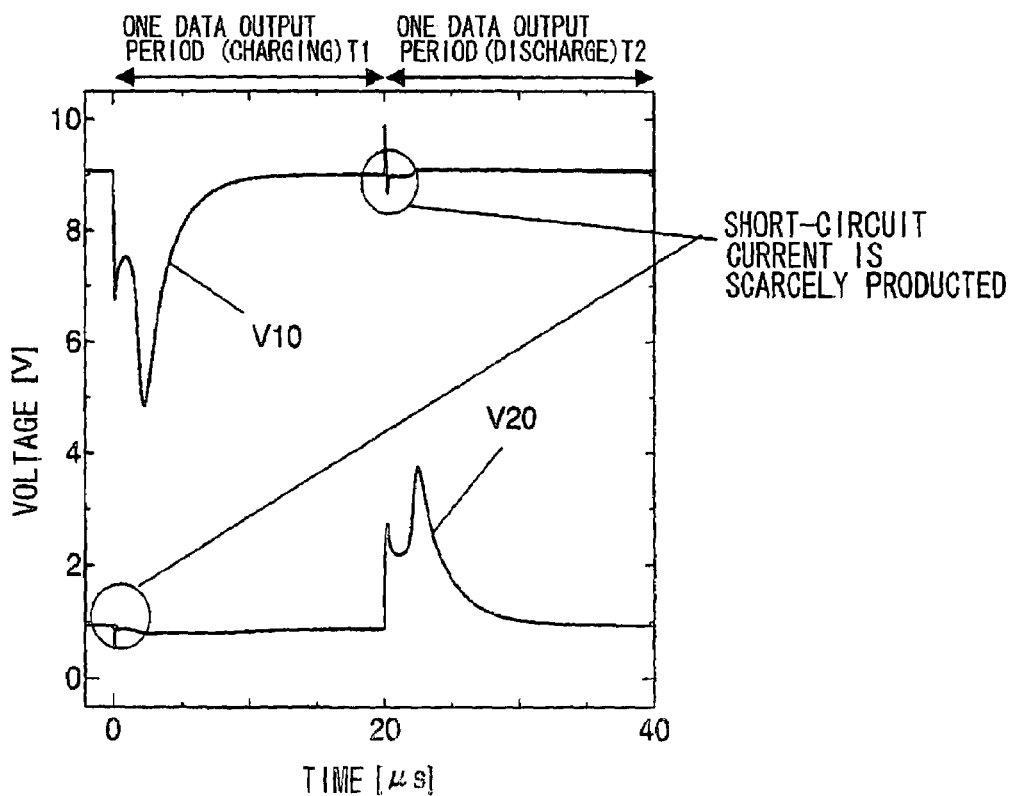

FIG. 42A shows an input/output waveform (VinP, Vout) of the voltage follower configuration of FIG. 16 by the switch control of FIG. 10 (control by the signal S1). Referring to FIG. 42A, as the input terminal voltage VinP increases (rises), the output terminal voltage Vout rises instantaneously by the bootstrap operation of the capacitor element 210, as explained above. The output terminal voltage then rises at a moderated slew rate by the transistor 101, based on the output of the differential amplifying stage. As the input terminal voltage VinP decreases (decays), the output terminal voltage Vout is decreased instantaneously, by the bootstrap operation of the capacitor element 210, and is then decreased, by the discharge action by the transistor 102, as the slew rate is moderated. The moderated slew rate (gradient) is approximately equal to the slew rate for the fixed connection of the capacitor element 210. FIG. 42(B) shows the voltage waveforms V10, V20 at the control terminals 10 and 20 of the push-pull output stage of FIG. 16, against changes in the output terminal voltage of FIG. 42A. From FIG. 42B, it may be seen that the short-circuit current by the bootstrap operation is scarcely produced and hence the effect on the power dissipation is negligibly small.

Figure 17:
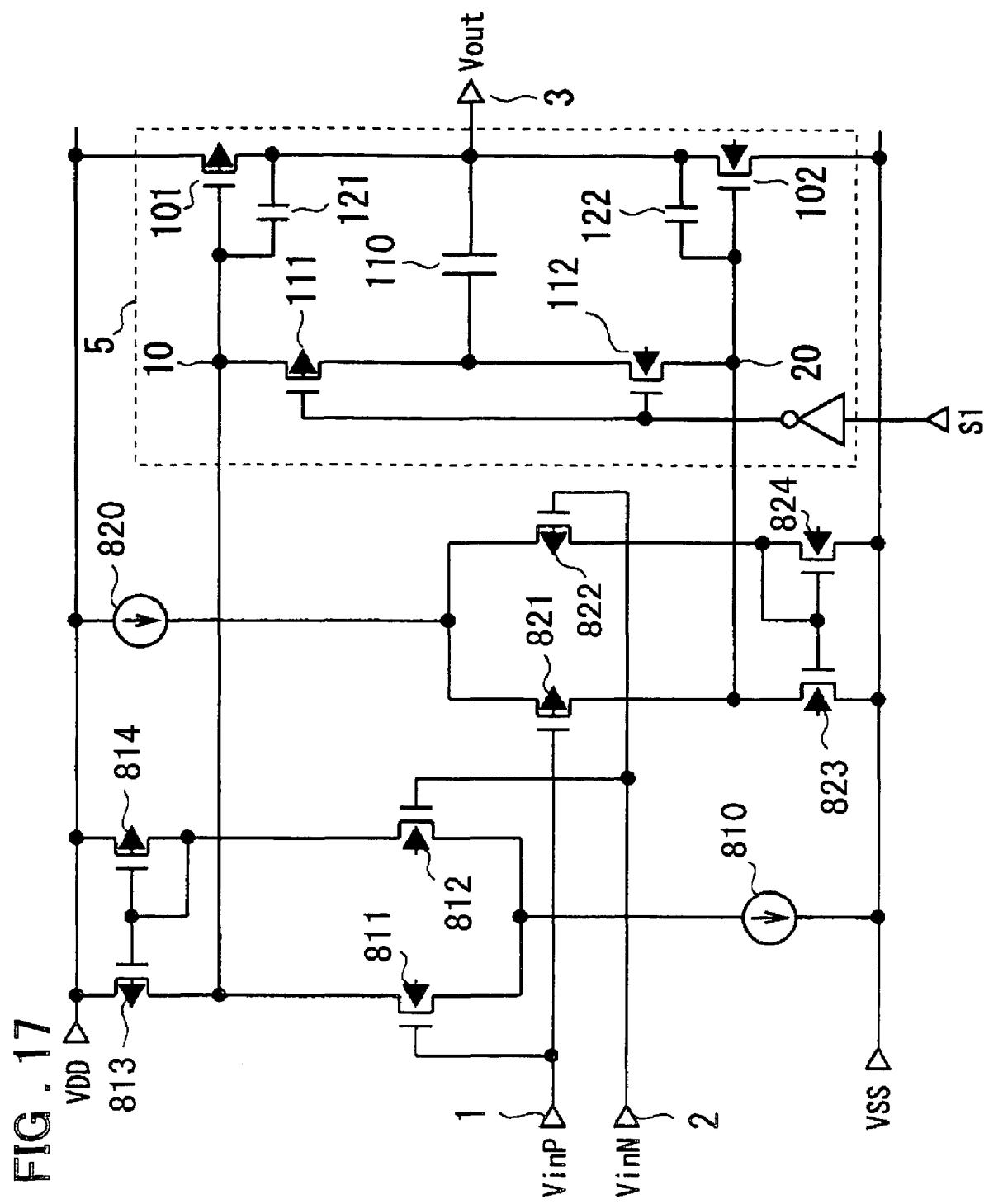
FIG. 17 shows the configuration of a fifth embodiment of the present invention.
Figure 31:
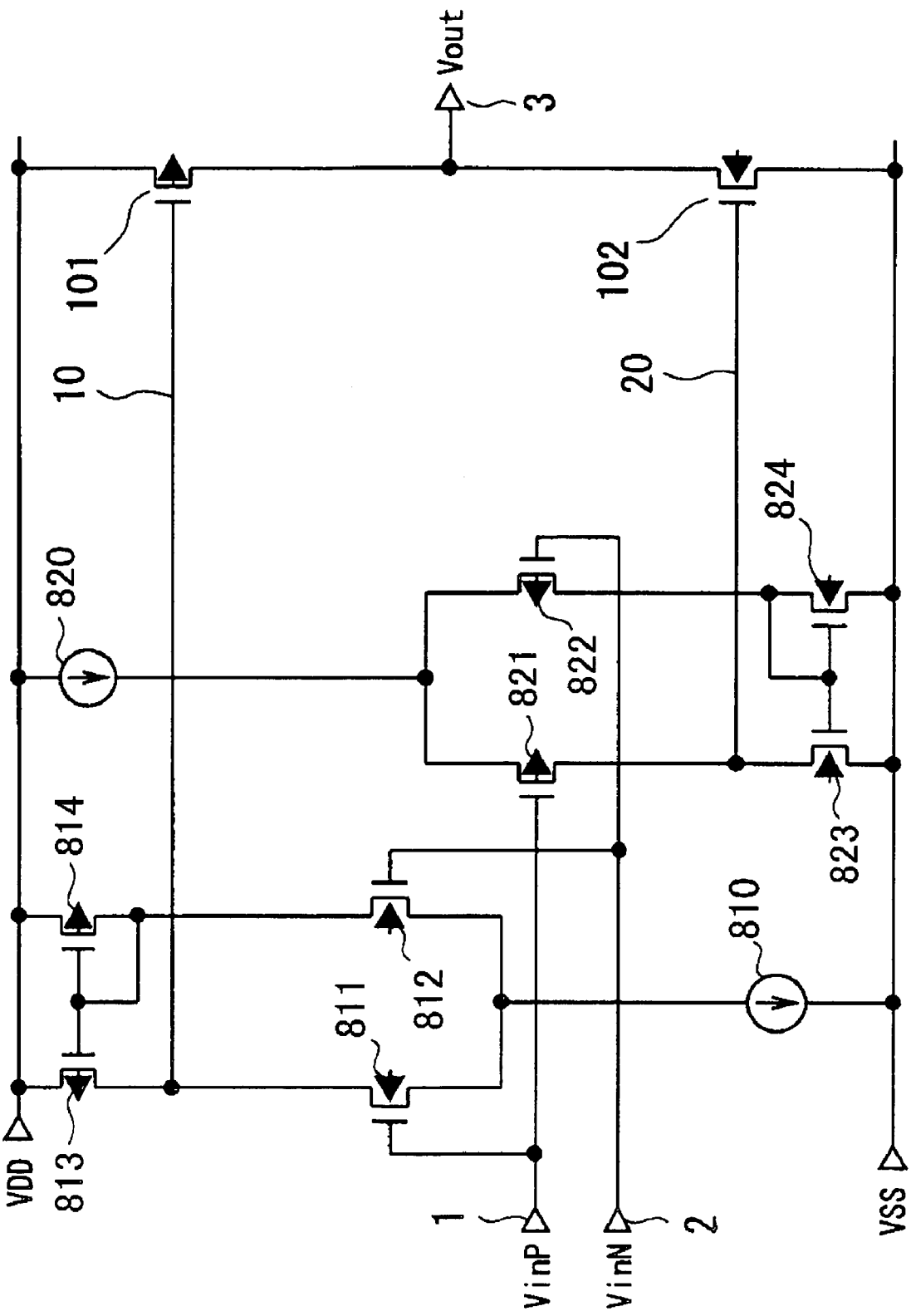
FIG. 31 shows a further example of a conventional differential amplifier.

A differential amplifier according to a further embodiment of the present invention is now explained. FIG. 17 shows an embodiment of FIG. 3, in which the present invention is applied to a differential amplifier of FIG. 31. The differential amplifier of FIG. 31 is not a rail-to-rail differential amplifier, however, it is a generally well-known simple differential amplifier. The present embodiment shows that the present invention is applicable to a differential amplifier other than the differential amplifier of FIG. 29.

The differential amplifier of FIG. 31 is now described briefly. In FIG. 31, the differential amplifying stage is made up by an N-channel differential pair 811, 812, driven by a current source 810, a P-channel differential pair 821, 822, driven by a current source 820, a current mirror 813, 814, connected to an output pair of the N-channel differential pair 811, 812 to form a load circuit, and a current mirror 823, 824, connected to an output pair of the P-channel differential pair 821, 822 to form a load circuit. A connection node of an input terminal of the current mirror 813, 814 (drain of the transistor 813) and an output terminal of the N-channel differential pair (drain of the transistor 811) forms a first differential output terminal 10 of the differential amplifying stage, while a connection node of an input terminal of the current mirror 823, 824 (drain of the transistor 823) and an output terminal of the P-channel differential pair (drain of the transistor 821) forms a second differential output terminal 20 thereof.

The gates of the transistors 811, 821 are connected common to form a non-inverting input terminal, while the gates of the transistors 812, 822 are connected common to form an inverting input terminal. The non-inverting input terminal 1 and the inverting input terminal 2 are supplied with voltages VinP, VinN, respectively.

The output amplifying stage is a push-pull output stage, formed by transistors 101 and 102, the sources of which are connected to the power supply VDD and to the power supply VSS, respectively, the drains of which are connected common to the output terminal 3, and the gates of which are connected to the first and second differential output terminals 10 and 20, respectively.

The operation of the differential amplifier of FIG. 31 is a steady-state operation when the voltage VinP of the non-inverting input terminal is equal to the voltage VinN of the inverting input terminal. The currents flowing through the differential transistor pairs of the same polarities are equal to each other. When the voltage VinP of the non-inverting input terminal is higher than the voltage VinN of the inverting input terminal, the current flowing through the transistor 811 of the N-channel differential pair 811, 812 is increased, while the current flowing through the transistor 812 is decreased. In the current mirror 813, 814, a mirror current of the current through the transistor 814 is caused to flow through the transistor 813, so that the current flowing through the transistor 813 is decreased. This pulls down the voltage of the first differential output terminal 10, that is, the gate voltage of the transistor 101, so that the charging current from the power supply VDD to the output terminal 3 is increased by the transistor 101. As to the currents flowing through the P-channel differential pair 821, 822, when the voltage VinP of the non-inverting input terminal is higher than the voltage VinN of the inverting input terminal, the current flowing through the transistor 821 is decreased, and the current flowing through the transistor 822 is increased, while the current flowing through the transistor 823, forming the current mirror circuit 823, 824, is increased. This pulls down the voltage at the second differential output terminal 20, that is, the gate voltage of the transistor 102, to decrease the discharge current from the output terminal 3 to the power supply VSS by the transistor 102. Accordingly the output voltage Vout is raised.

When the voltage VinP of the non-inverting input terminal is lower than the voltage VinN at the inverting input terminal VinN, the current flowing through the transistor 811 and the current flowing through the transistor 812 decrease and increase, respectively. The transistors 811, 812 form the N-channel differential pair 811, 812. The current flowing through the current mirror 813, 814 is increased. This pulls up the voltage at the first differential output terminal 10, that is, the gate voltage of the transistor 101, thus decreasing the charging current from the power supply VDD to the output terminal 3. As to the current following through the P-channel differential pair 821, 822, when the voltage VinP of the non-inverting input terminal is lower than the voltage VinN of the inverting input terminal, the current flowing through the transistor 821 and the current flowing through the transistor 822 increase and decrease, respectively. The current flowing through the transistor 823 of the current mirror 823, 824 is decreased. This pulls up the voltage at the second differential output terminal 20, that is, the gate voltage of the transistor 102, thus increasing the discharge current from the output terminal 3 to the power supply VSS. Accordingly the output voltage Vout is lowered.

Meanwhile, in the voltage range from the low potential side power supply VSS to the transistor threshold value of the N-channel differential pair 811, 812 and in the voltage range from the high potential side power supply VDD to the transistor threshold value of the P-channel differential pair 821, 822, against the power supply voltage range from the low potential side power supply VSS to the high potential side power supply VDD, the two differential pairs are unable to operate, and hence the dynamic range (input/output voltage range) is somewhat narrow.

FIG. 17 shows a structure in which the present invention is applied to a differential amplifier of FIG. 31 as explained above. The configuration of the output amplifying stage 5 of FIG. 17 is the same as that shown in FIG. 3. That is, the output amplifying stage is made up by a P-channel transistor 101, connected across the output terminal 3 and the high potential side power supply VDD and having a gate connected to the first differential output terminal 10, an N-channel transistor 102, connected across the output terminal 3 and the low potential side power supply VSS and having a gate connected to the second differential output terminal 20, and a capacitor element 110, having one end connected to the output terminal 3 and having the other end connected to the terminals 10 and 20 through a P-channel transistor switch 111 and an N-channel transistor switch 112, respectively. The respective gates of the transistor switches 111 and 112 are supplied with an inverted version of the external signal S1. Meanwhile, in the structure shown in FIG. 17, a capacitor element 121 is provided across the terminal 10 and the output terminal 3, while a capacitor element 122 is provided across the terminal 20 and the output terminal 3, for waveform shaping, as in FIG. 13. These auxiliary capacitor elements 121 and 122 may be connected by a connection method different from that shown in FIG. 17. For example, an auxiliary capacitor element and another auxiliary capacitor element may be provided across the terminal 10 and the high potential side power supply VDD and across the terminal 20 and the low potential side power supply VSS, respectively. It is also possible to provide auxiliary capacitor elements that permit connection switching such that these auxiliary capacitor elements may be connected to the sides of the terminals 10 and 20 not connected to the capacitor element 110, responsive to the connection switching of the capacitor element 110. To the output terminal 3 is connected an external load (data line load), not shown.

The operation of the differential amplifier of FIG. 17 is now explained. In case the external signal S1 is fixed at a high level or at a low level, without dependency on whether the operation is the charging operation or the discharging operation, the capacitor element 110 is connected across the terminal 10 and the output terminal 3 or across the terminal 20 and the output terminal 3. However, since the connection state is fixed, the capacitor element 110 operates simply as a phase compensation capacitance. Hence, the operation of the differential amplifier, shown in FIG. 17, is similar to that of the differential amplifier of FIG. 31, that is, the output voltage Vout is changed at a constant slew rate against changes in the differential voltage of the input signal voltages VinP and VinN. The operation of the differential amplifier, shown in FIG. 17, in case the external signal S1 is controlled as in FIG. 4, is the same as the operation of the differential amplifiers shown in FIG. 1 and 3. That is, the bootstrap operation is produced at the beginning of a given data output period for charging or discharge, under control by the external signal S1, thereby realizing the charging or discharging operations more speedily than is possible conventionally. Moreover, the high-speed operation may be achieved without increasing the current consumption, if the optimum connection method for auxiliary capacitor elements, as later explained, is taken into consideration. It is noted that the high operating speed by the bootstrap operation is effective in the driving of large amplitudes, while being unneeded in the driving of small amplitudes. In the latter case, the switch state is not changed and the connection state of the capacitor element 110 may be maintained, whereby the bootstrap operation is not produced and the driving of small amplitudes may be performed with the usual differential amplifier operation.

Figure 18:
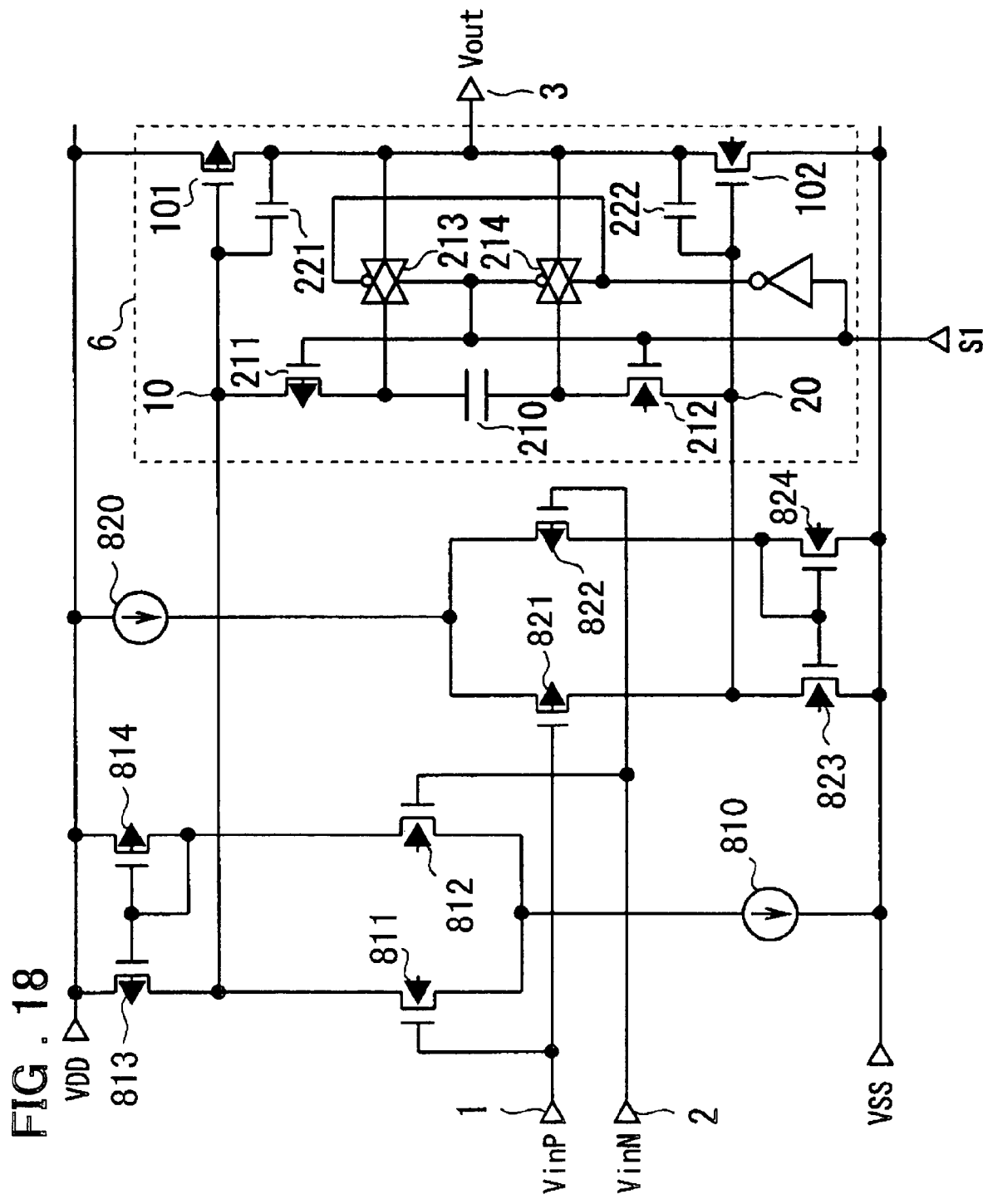
FIG. 18 shows the configuration of a sixth embodiment of the present invention.

A differential amplifier according to a sixth embodiment of the present invention is now explained. FIG. 18 again shows an embodiment of FIG. 8, in which the present invention is applied to a differential amplifier of FIG. 31. The configuration of the differential amplifying stage 6 of FIG. 18 is the same as that shown in FIG. 8 and includes a P-channel transistor 101, connected across the output terminal 3 and the high potential side power supply VDD and having a gate connected to a first differential output terminal 10, an N-channel transistor 102, connected across the output terminal 3 and the low potential side power supply VSS and having a gate connected to the second differential output terminal 20, and a capacitor element 210, having one end connected via a P-channel transistor switch 211 and a transfer gate switch 213 to the terminal 10 and to the output terminal 3 and having the other end connected via an N-channel transistor switch 212 and a transfer gate switch 214 to the terminal 20 and to the output terminal 3. The gates of the transistor switches 211 and 212 are supplied with the external signal S1, while the transfer gate switches 213 and 214 are supplied with the external signal S1 and an inverted version thereof.

FIG. 18 shows a structure in which, for waveform shaping, a capacitor element 221 is provided across the terminal 10 and the output terminal 3, and a capacitor element 222 is provided across the terminal 20 and the output terminal 3, as in FIG. 15. The capacitor elements 221, 222 may be connected by a method different from that shown in FIG. 18. The transistor switches 211 and 212 are provided with parasitic capacitances across both ends of the switches, in a manner not shown in the drawings. These parasitic capacitances are labeled C211, C212, respectively. To the output terminal 3 is connected an external load (data line load), not shown.

The operation of the differential amplifier of the present embodiment is now explained with reference to FIG. 18. If the external signal S1 is fixed at a high level or at a low level, without dependency on whether the operation is the charging operation or the discharging operation, the capacitor element 210 is connected across the terminal 10 and the output terminal 3 or across the terminal 20 and the output terminal 3. However, since the connection state is fixed, the capacitor element 210 operates simply as a phase compensation capacitance. Hence, the operation of the differential amplifier, shown in FIG. 18, is similar to that of the differential amplifier of FIG. 31, that is, the output voltage Vout is changed at a constant slew rate against changes in the difference voltage between the input signal voltages VinP and VinN.

The operation of the differential amplifier, shown in FIG. 18, in case the external signal S1 is controlled as in FIG. 9 or in FIG. 10, is the same as the operation of the differential amplifiers shown in FIGS. 5 and 8. That is, the bootstrap operation is produced at the beginning of a given data output period for charging or discharge, under control by the external signal S1, thereby realizing the charging and discharging operations more speedily than is possible conventionally. Moreover, the high-speed operation may be achieved without increasing the current consumption, if the optimum connection method for auxiliary capacitor elements, as later explained, is taken into consideration. It is noted that the high operating speed by the bootstrap operation is effective in the driving of large amplitudes (driving with large voltage changes of the output terminal voltage before and after switching between charging and discharge), while being unneeded in the driving of small amplitudes (driving with small voltage changes of the output terminal voltage before and after switching between charging and discharge). In the latter case, the switch state is not changed and the connection state of the capacitor element 210 may be maintained, whereby the bootstrap operation is not produced and hence the driving of small amplitudes may be performed with the usual differential amplifier operation. Moreover, with the differential amplifier of FIG. 18, the high operating speed may be raised, as the power dissipation is suppressed, even though the charging and discharging operations are carried out frequently. In FIG. 18, a floating current source (see 74 of FIG. 16) may be provided across the drains of the output transistors of the current mirror 813, 814 forming the load circuit.

The present invention, described above, may be applied not only to the differential amplifier shown in FIGS. 29 and 31, but also to various other differential amplifiers. That is, if the differential amplifying stage 4 is constructed in accordance with FIGS. 1, 3, 5 or 8, the favorable effect similar to that of the present invention may be achieved.

Figure 19:
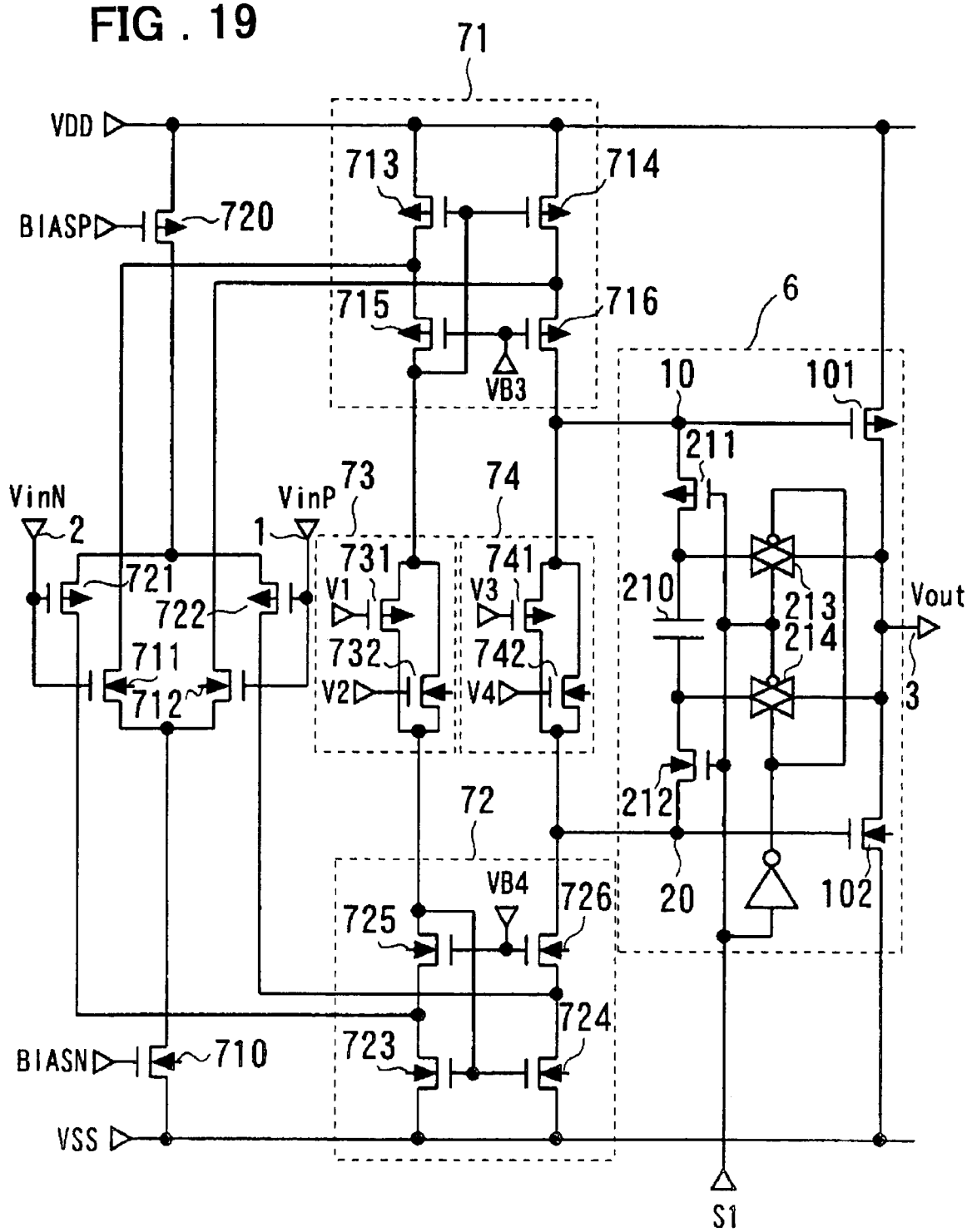
FIG. 19 shows a concrete example of the third embodiment of the present invention.

FIG. 19 further specifically shows the configuration of FIG. 12. The current sources 710, 720 may be constructed by an N-channel transistor and a P-channel transistor, respectively. The current to be flown through the differential pair may be controlled by applying the bias voltages BIASN, BIASP to the respective gates. The same may be said of the structure other than the structure shown in FIG. 12.

As a modification of FIG. 19, a differential amplifier may be constructed by a transistor, free of a back gate, formed on an insulating substrate, formed of, for example, glass or plastics.

The differential amplifiers, shown in FIGS. 1 to 18, may also be replaced by a transistor, free of a back gate, formed on an insulating substrate, formed of, for example, glass or plastics, whereby the favorable operation and effect similar to those explained with reference to FIGS. 1 to 18 may be achieved.

Figure 20:
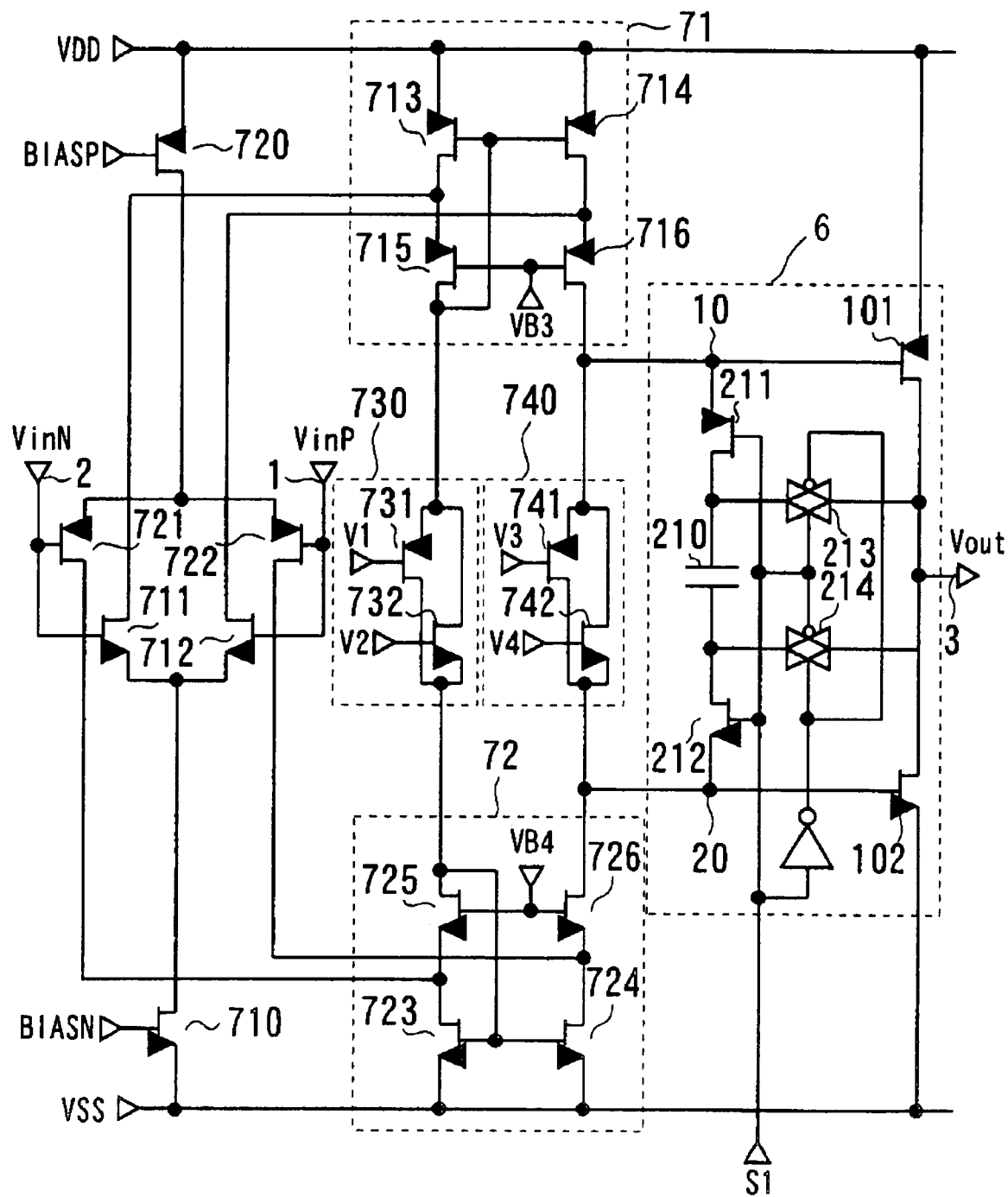
FIG. 20 shows a modification of FIG. 19.

FIG. 20 shows a modification of FIG. 19 and specifically shows a differential amplifier constructed by a connection node transistor, such as a bipolar transistor. In this case, the drain, source and the gate of the transistor of FIG. 19 correspond to the collector, emitter and the base of the connection node transistor. The differential amplifiers, shown in FIGS. 1 to 18, may similarly be replaced by the connection node transistors.

FIG. 20 shows a structure in which all of the transistors are replaced by connection node transistors. However, the connection node transistors may be used in combination with gate-insulated transistors. Although the current flows across the base and the emitter of the connection node transistor, the operation is almost unchanged from that of the differential amplifier formed by the gate-insulated transistors. The reason is briefly explained for the case in which the transistor 101 of the output stage amplifier stage is formed by the PNP connection node transistor and the transistor 102 is formed by the NPN connection node transistor.

When the potential of the base of the transistor 101 (terminal 10) and the potential of the base of the transistor 102 (terminal 20) are instantaneously changed by the bootstrap operation, the base current is instantaneously increased. With increase in the base current, the current flowing across the collector and the emitter is also increased. Hence, the high-speed operation by the bootstrap operation may be realized. Thus, with the differential amplifier of FIG. 20, the favorable effect such as that explained with reference to FIGS. 1 to 18 may be achieved.

Figure 21:
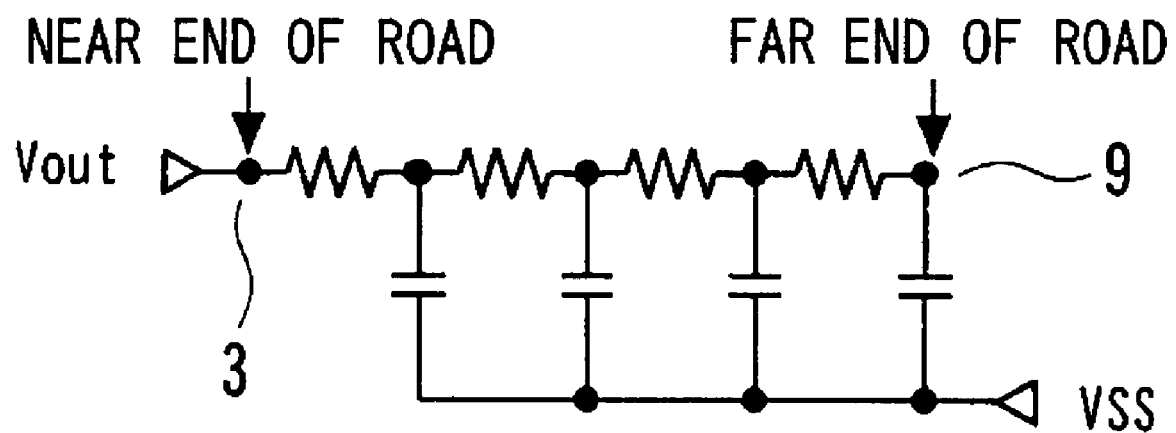
FIG. 21 shows an equivalent data line circuit used for simulation for the present invention.

The result of simulation according to an embodiment of the present invention is now explained. FIG. 21 is an equivalent circuit of a data line load used for simulation. With the data line load of the liquid crystal device, the total capacity of the interconnection and the interconnect resistance tend to be approximately 100 pF and tens of kΩ in case of a large format panel. The output terminal 3 of the differential amplifier of the present invention is connected to one end of the equivalent circuit of FIG. 21 (terminal 3) in order to effect simulation of the data line load of the large format panel.

In a comparative example for comparing the present invention to the conventional technique, the differential amplifier of FIG. 29, and the differential amplifier of FIG. 16, according to the present invention, each being of the voltage follower structure, were used for comparison for simulation.

In FIGS. 29 and 16, the transistors of the differential amplifying stage and the transistors 101 and 102 of the push-pull output stage were of the same device size, and the current consumption of FIGS. 29 was set so as to be equal to that of FIG. 16.

In FIG. 29, the phase compensation capacitances were arranged in the same way as in the capacitor elements 223, 224 of FIG. 16. The sum of the phase compensation capacitances of FIG. 29 was set so as to be approximately equal to the total capacitance values of the capacitor elements 210, 223, 224 of FIG. 16, and the phase allowance was set to be of the same order of magnitude, by way of carrying out the simulation.

As for the driving conditions, the power supply voltage was set to 10V, one data output period was set to 20 µs and 0.2V and 9.8V were alternately entered as the input voltage VinP of the non-inverting input terminal 1, in both FIGS. 29 and 16. In FIG. 16, the external signal S1 is controlled for switching the connection state of the capacitor element 210 every data output period.

Figure 22:
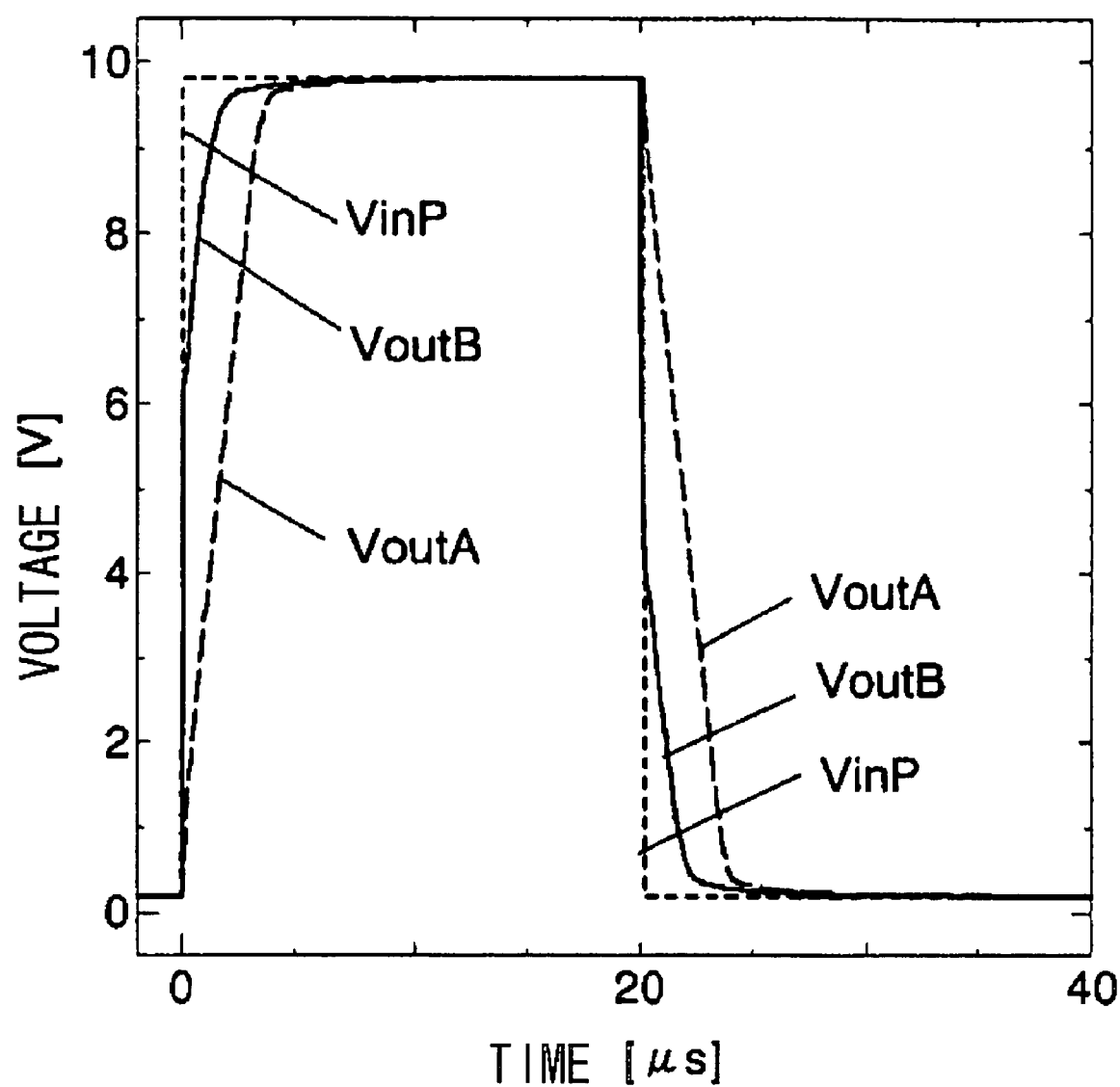
FIG. 22 shows an example of output terminal voltage waveforms in the fourth embodiment of the present invention.

FIG. 22 shows the result of comparison of the input/output voltage waveform when the data line load of FIG. 21 is driven by the differential amplifier of FIG. 29 and 16. In FIG. 22, VinP (dotted line) stands for a common input voltage waveform, VoutA (broken line) stands for the waveform of the output voltage of FIG. 29 (comparative example) and VoutB (solid line) stands for the output voltage waveform of FIG. 16 (inventive).

The output voltage waveform is the waveform of the voltage of the output terminal 3 (output terminal voltage), and shows the manner how the voltage in the vicinity of the data line load is changed. Since the voltage change in the remote end of the data line load (terminal 9) is determined by the time constant of the capacitance and the resistance of the load against changes in the voltage in the near end of the data line load, it is sufficient to compare the manner of voltage change in the near end of the data line load in order to compare the driving speed of the differential amplifiers.

Referring to FIG. 22, the output voltage waveform VoutA of the differential amplifier of FIG. 29 is increased or decreased at a constant slew rate with start of the data output period. On the other hand, the output voltage waveform VoutB of the differential amplifier of FIG. 16 is instantaneously changed to a level not less than one half of the voltage amplitude, directly after the start of the data output period, and subsequently is increased or decreased at a slew rate which is approximately the same as VoutA.

The instantaneous voltage change immediately following the start of the data output period is ascribable to the bootstrap operation caused by connection switching of the capacitor element 210. It is therefore apparent that VoutB is speedier than VoutA. This operation may be confirmed from the manner of change of the gate terminal voltages of the transistors 101 and 102 of the push-pull output stage.

Figure 23:
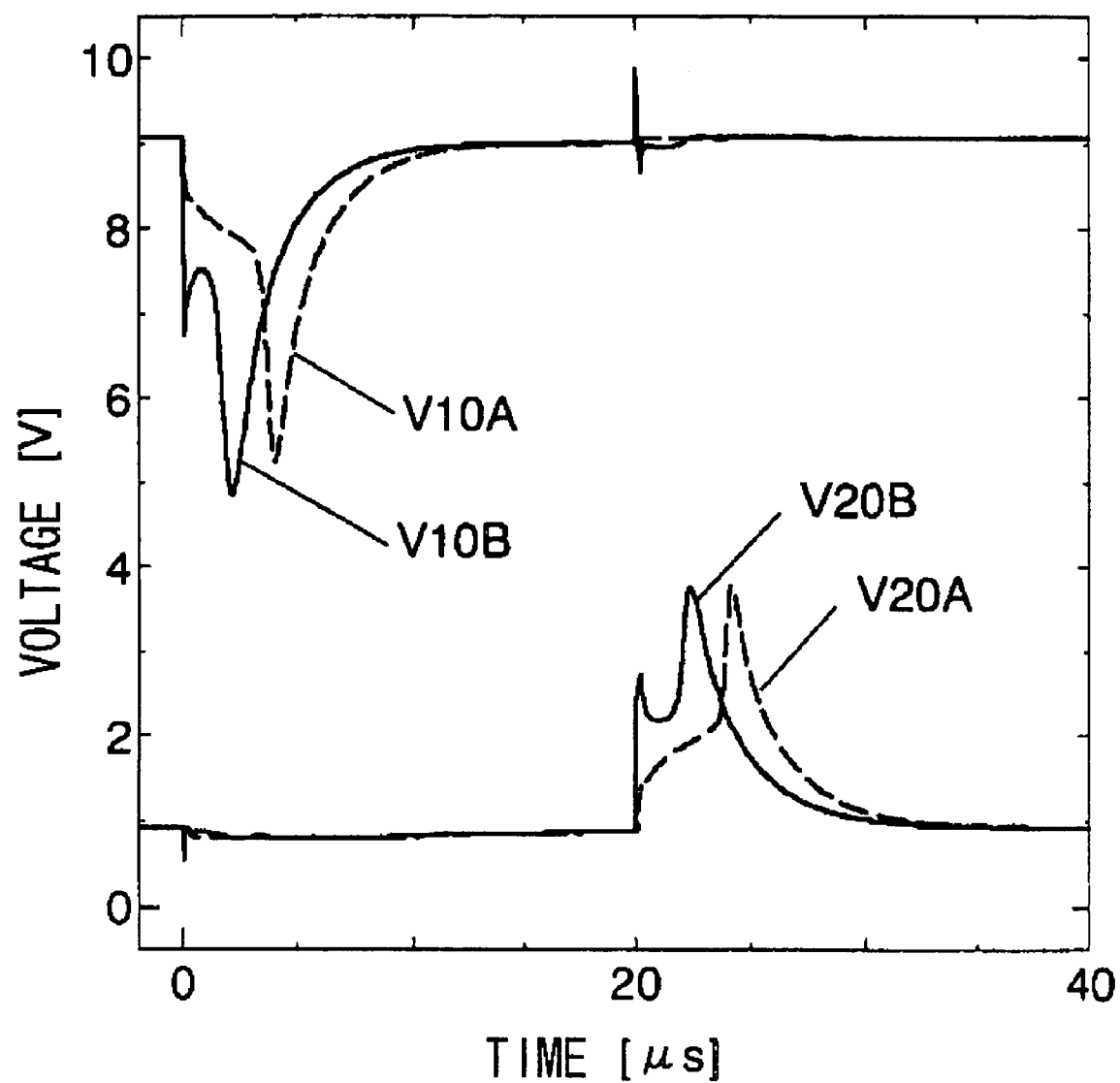
FIG. 23 shows an example of the voltage waveforms at terminals 10 and 20 in the fourth embodiment of the present invention.

FIG. 23 shows the manner of change of the gate terminal voltages of the transistors 101 and 102 of the push-pull output stages of FIGS. 29 and 16. The gate terminal voltage waveforms of the transistors 101 and 102 of FIG. 29 are labeled V10A, V20A (broken line) and the gate terminal voltage waveforms of the transistors 101 and 102 of FIG. 16 are labeled V10B, V20B (solid line). In the stable output state, V10A and V10B assume the value in the vicinity of 9V, while V20A, V20B assume the value in the vicinity of 1V. During the charging operation, V10A, V10B are lowered and the charging ability of the respective transistors 101 becomes higher the lower the changing voltage level. During the discharging operation, V20A, V20B are increased and the discharging ability of the respective transistors 102 becomes higher the higher the changing voltage level.

Referring to FIG. 23, V10A, V20A assume a peak value in the vicinity of 4.8 μs as from the start of each of the data output period of the charging and discharging operations, while V10B, V20B assume two peak values at two location, namely at a location directly following the beginning of the data output period and at a location in the vicinity of 2.4 μs as from the start of each of the data output period of the charging and discharging operations. The respective peak values occur where the charging ability or the discharge ability becomes locally maximum. The first peak values of V10B, V20B immediately after the start of the data output period are ascribable to the bootstrap operation caused by the connection switching of the capacitor element 210. These second peak values of V10B, V20B correspond to the peak values of the charging ability or the discharge ability following the switching from the bootstrap operation to the usual differential amplifier operation. Meanwhile, the time of occurrence of the second peak values of V10B, V20B as from the beginning of the data output period is approximately one-half of the time of occurrence of the peaks of V10A, V20A. Thus, it may be seen that, as a result of the bootstrap operation, the time of reaching the maximum charging or discharge ability as from the switching to the usual differential amplifier operation has been shortened. It may, therefore, be ascertained, from the manner of voltage changes of 10B, 20B, that the operation of the differential amplifier of FIG. 16 (inventive) is speedier than that of the differential amplifier of FIG. 29 (comparative).

Thus, from the results of simulation shown in FIGS. 22 and 23, it may be confirmed that, with the differential amplifier of FIG. 16 and that of FIG. 29, with the current consumption approximately equal to each other, the high-speed driving may be achieved in FIG. 16 by the bootstrap operation by connection switching of the capacitor element 210. It may also be seen from the comparison of output waveforms, shown in FIG. 22, the slew rate of the circuit of FIG. 29 needs to be doubled in order to realize the driving speed equivalent to that of FIG. 16. To this end, the current allowed to flow through the differential amplifying stage of FIG. 29 needs to be increased to a value several times larger, thus increasing the power dissipation. If conversely the driving speed of the differential amplifier of FIG. 16 is of the same order of magnitude as that in case of FIG. 29, the current caused to flow through the differential amplifying stage of FIG. 16 can be reduced and hence the power dissipation may be decreased. Although FIGS. 22, 23 show the results of circuit simulation in the circuit configuration of the embodiment shown in FIG. 16, the output voltage waveform for other embodiments of the present invention is the waveform approximately equal to that shown in FIG. 16. Meanwhile, the waveform of FIGS. 36, 39 and 42, already explained, is the output voltage waveform by the above simulation, such that a high-speed operation may be realized without increasing the current consumption, as discussed previously.

The effect by the connection configuration of the auxiliary capacitors for waveform shaping (second and third capacitances 121, 122 of FIG. 13 and second and third capacitances 123, 124 of FIG. 14) in the present embodiment is now explained. These auxiliary capacitors may optionally be constructed from capacitor elements, including the metal capacitances (interconnection capacitances) or gate capacitances.

In the present embodiment, the high-speed operation may be achieved by the bootstrap operation, without regard to the presence or absence of the auxiliary capacitors.

In the present embodiment, the short-circuit current tends to be generated, depending on the manner of connection of the auxiliary capacitors, thus affecting the power dissipation.

In case the auxiliary capacitors are provided across the output terminal 3 and the control terminals 10 and 20, as shown in FIGS. 13, 15, 17 and 18 for the present embodiment, a large short-circuit current is transiently generated, if the output terminal voltage Vout is abruptly changed by the bootstrap operation. It is noted however that such short-circuit current may be suppressed in case the switch control shown in FIG. 10 is carried out in the differential amplifier of FIG. 15 or 18, as will be explained subsequently.

If the auxiliary capacitors are provided across the output terminal 3 and terminals other than the control terminals 10 and 20, as shown in FIGS. 14 and 16 for the present embodiment, the short-circuit current can be suppressed to a sufficiently small value, if the output terminal voltage Vout is abruptly changed by the bootstrap operation.

Figure 43A:
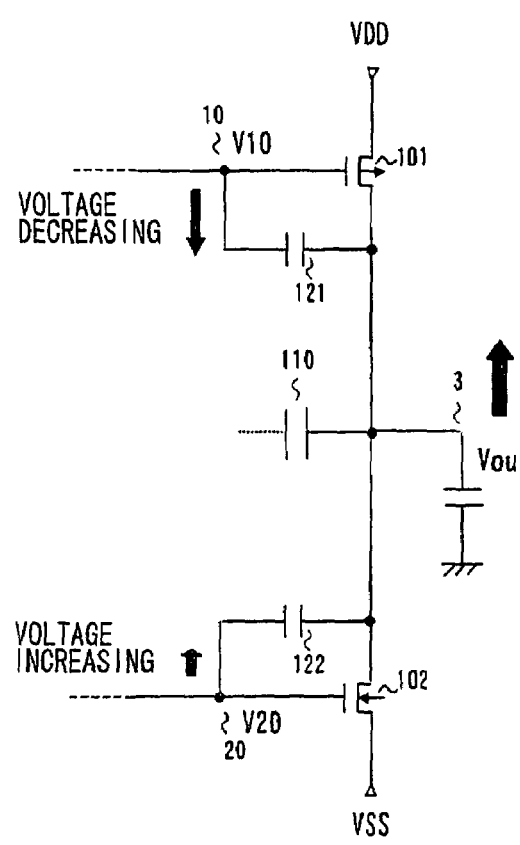
FIG. 43 illustrates the operation by the connection of second and third capacitors (auxiliary capacitors) of FIGS. 13 or 14.
Figure 43B:
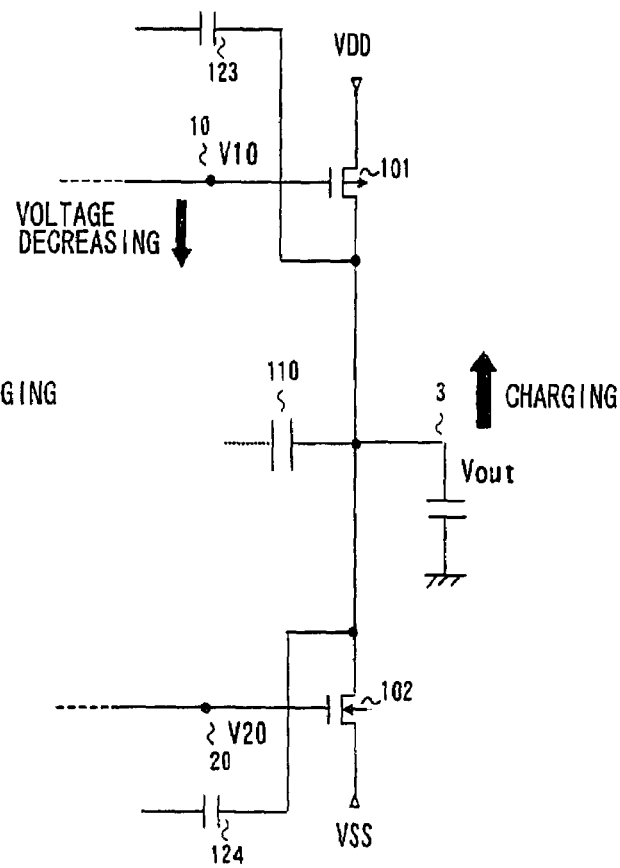

FIGS. 43A and 43B illustrate the operation by the connection of the second and third phase capacitors. Specifically, FIGS. 43A and 43B show the case for the auxiliary capacitors 121, 122 of FIG. 13 and for the auxiliary capacitors 123, 124 of FIG. 14, respectively. It is noted that FIGS. 43A and 43B show the operation directly after transition from the output period for discharge to that for charging.

Referring to FIG. 43A, the voltage V10 of the terminal 10 is subjected to the bootstrap operation, immediately after the switching (during the charging period), so that Vout is increased precipitously, under the voltage decreasing operation. In case the auxiliary capacitors 121, 122 are provided across the output terminal and the control terminals 10 and 20, and Vout is increased rapidly, the voltage V20 is subjected to the voltage increasing action, through the capacitance 122. Thus, a short-circuit current is transiently generated in the push-pull output stage (transistors 101 and 102) to flow from the high potential side power supply VDD to the low potential side power supply VSS. Thus, if the structure is used as a differential amplifier of low power dissipation, the connection of FIG. 43A is not desirable as the connection for the auxiliary capacitors. If the auxiliary capacitors 123, 124 are provided across the connection node between the output terminal and the multi-stage cascode type current mirror circuit, as shown in FIG. 43B, the voltage V20 at the terminal 20 is not varied through the capacitance 124, even if Vout is increased precipitously. There are occasions where the voltage V20 is slightly varied through the gate-to-source parasitic capacitance of the transistor 102, in case Vout is increased precipitously. However, such operation is negligible, and hence the short-circuit current is scarcely produced. The connection of FIG. 43B is therefore desirable as the connection of the auxiliary capacitors in case the structure is used as a differential amplifier of low power dissipation. Although the foregoing is the explanation of the operation by the connection of the auxiliary capacitors of FIGS. 13 and 14, the operation similar to that described above may be realized for other embodiments in case the connection of the auxiliary capacitors of FIGS. 13 and 14 is used.

However, even with the structure including two auxiliary capacitors, provided across the output terminal and the control terminals 10 and 20, the short-circuit current may be suppressed to a smaller value if the switch control of FIG. 10 (control of the signal S1) is executed in the differential amplifier of FIG. 8. The reason is that, in the bootstrap charging, the terminal voltage V20 is subjected to a voltage decreasing action, in the same manner as explained with reference to FIG. 40, and hence the voltage increasing action, if produced, may be canceled. Hence, in FIGS. 15 and 18, showing specified examples of the differential amplifier, shown in FIG. 8, the short-circuit current may be suppressed to a lower value in case of performing the switch control (control of signal S1) of FIG. 10. As a further connection example for auxiliary capacitors, it is also possible to connect one end of the auxiliary capacitance to the terminals 10 and 20 and to connect the other end across optional fixed power supply terminals, such as VDD or VSS terminals. In this case, variations in the voltages V10, V20 may be suppressed to a lower value, even if Vout is varied precipitously, by the bootstrap operation, so that the short-circuit current is not liable to be produced.

Figure 44A:
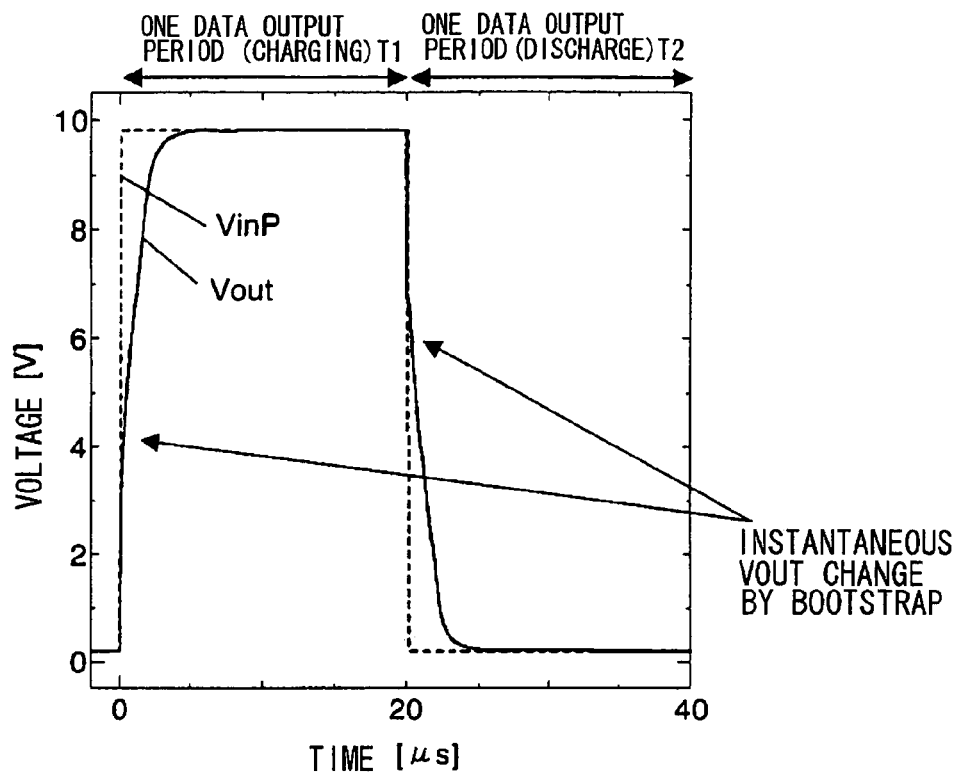
FIGS. 44A and 44B show an input/output voltage waveform of the embodiment of FIG. 13 (voltage follower configuration) by control of the signal S1 of FIG. 4, where
Figure 44B:
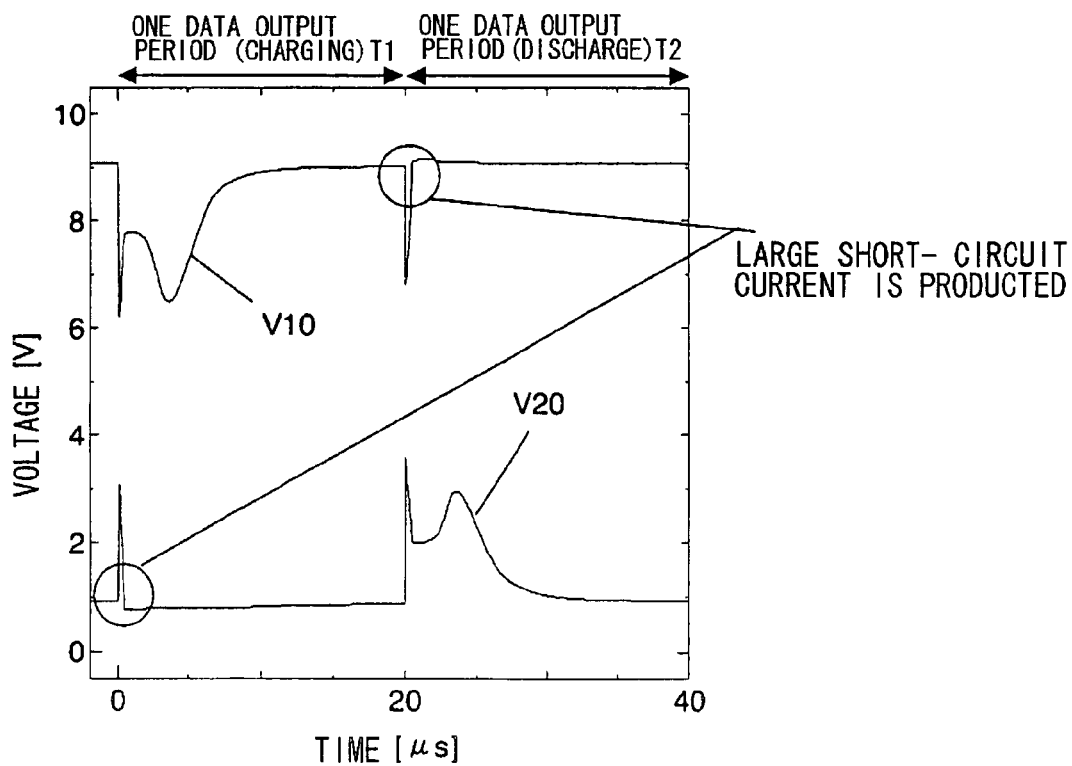

The operation of the differential amplifier of the, present invention, including two auxiliary capacitors across the output terminal and the control terminals 10 and 20, is now explained by referring to the input/output voltage waveform (simulation). FIG. 44A shows an input/output waveform (VinP, Vout) in which the switch control of FIG. 4 (control of the signal S1) is used and the differential amplifier of FIG. 13 is formed in a voltage follower configuration. Referring to FIG. 44A, the output terminal voltage Vout rises instantaneously against the increase (rise) of the input terminal voltage VinP, at the beginning of the output period T1 (charging), by the bootstrap operation of the capacitor element 110. The output terminal voltage Vout then rises to 10V by the transistor 101. In transition to the output period T2 (discharge), the output terminal voltage Vout decays instantaneously, against decrease (decay) of the input terminal voltage VinP, and then is lowered towards the low voltage side by the transistor 102. Hence, the high-speed operation by the bootstrap operation is realized. FIG. 44(B) shows the voltage waveforms V10, V20 at the control terminals 10 and 20 of the push-pull output stage in FIG. 13, against changes in the output terminal voltage Vout of FIG. 44A. From the state of the voltage waveforms V10, V20, it may be confirmed whether or not any wasteful short-circuit current flows in the push-pull output stage of the differential amplifier of FIG. 13. From FIG. 44B, it is seen that large short-circuit current is produced at a location indicated by circle marks. Hence, the power dissipation cannot be suppressed with the differential amplifier shown in FIG. 13.

Figure 45A:
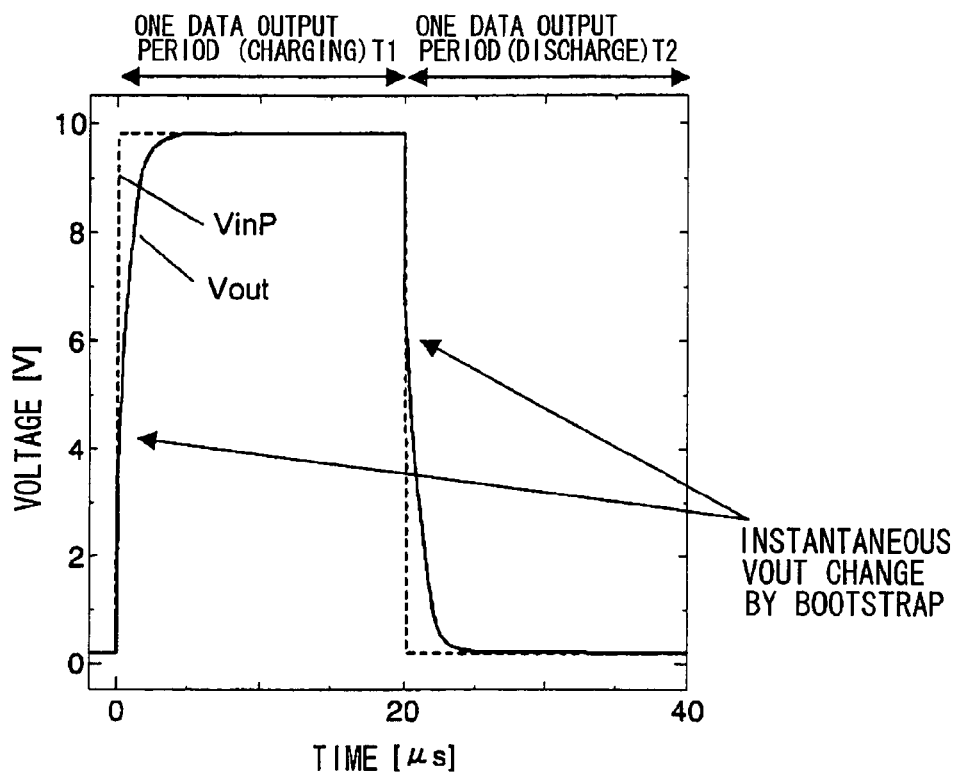
FIGS. 45A and 45B shows an input/output voltage waveform of the embodiment of FIG. 15 (voltage follower configuration) by control of the signal S1 of FIG. 9, where
Figure 45B:
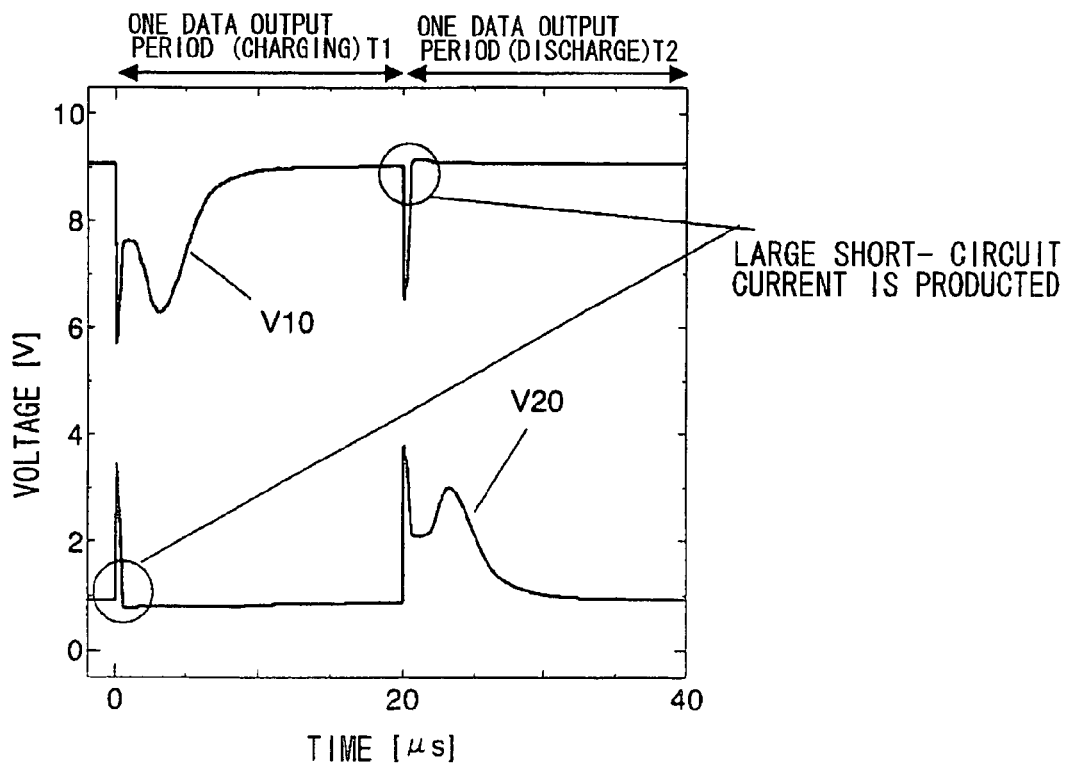

FIG. 45A shows the input/output waveform (VinP, Vout) with the switch control of FIG. 9 (control of the signal S1) for the differential amplifier of FIG. 15 in the voltage follower configuration. Referring to FIG. 45A, the output terminal voltage Vout rises instantaneously against the increase (rise) of the input terminal voltage VinP, at the beginning of the output period T1 (charging), by the bootstrap operation of the capacitor element 210. The output terminal voltage Vout then rises to 10V by the transistor 101. In transition to the output period T2 (discharge), the output terminal voltage Vout decays instantaneously, against decrease (decay) of the input terminal voltage VinP, by the bootstrap operation of the capacitor element 210 and then is lowered towards the low voltage side by the transistor 102. Hence, the high-speed operation by the bootstrap operation is realized. FIG. 45B shows the voltage waveforms V10, V20 at the control terminals 10 and 20 of the push-pull output stage in FIG. 15, against changes in the output terminal voltage Vout of FIG. 45A. From the state of the voltage waveforms V10, V20, it may be confirmed whether or not any wasteful short-circuit current flows in the push-pull output stage of the differential amplifier of FIG. 15. From FIG. 45B, it is seen that large short-circuit current is produced at a location indicated by circle marks. Hence, the power dissipation cannot be suppressed with the differential amplifier by the switch control shown in FIG. 9 (control of signal S1) shown in FIG. 15.

Figure 46A:
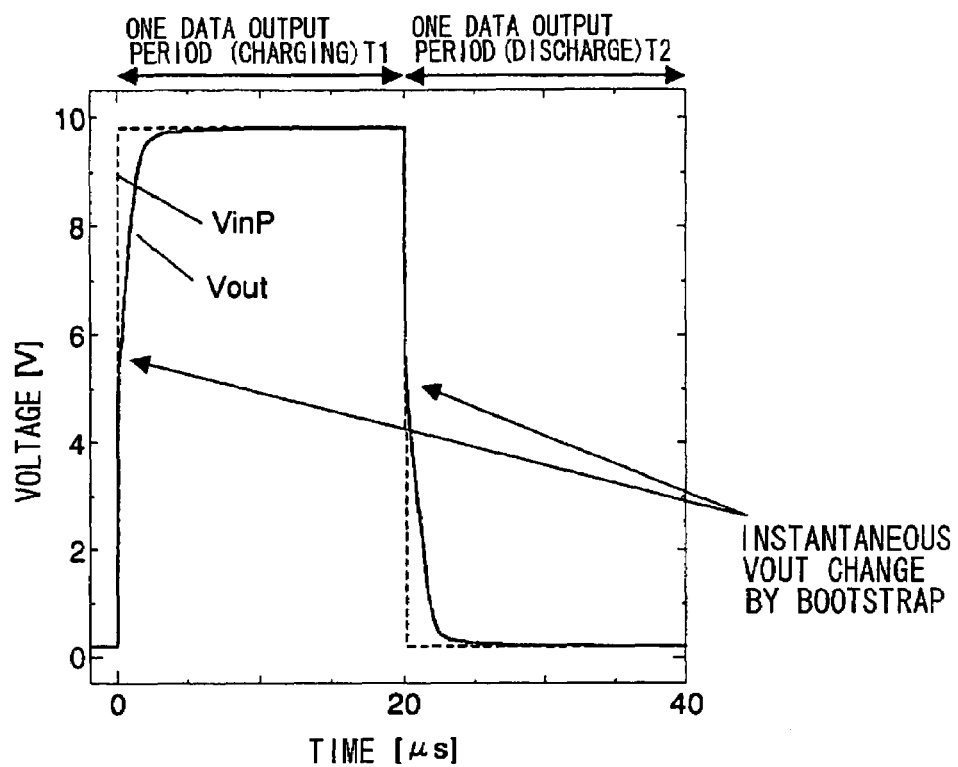
FIGS. 46A and 46B shows an input/output voltage waveform of the embodiment of FIG. 15 (voltage follower configuration) by control of the signal S1 of FIG. 10, where
Figure 46B:
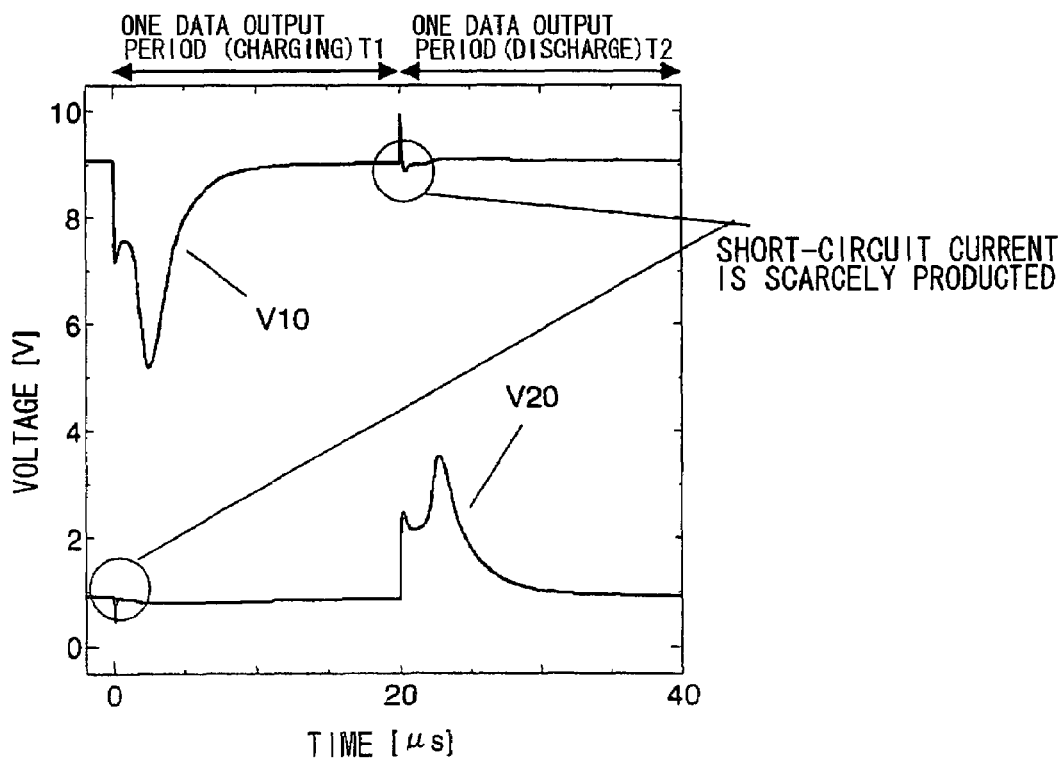

FIG. 46A shows the input/output waveform (VinP, Vout) with the switch control of FIG. 10 (control of the signal S1) for the differential amplifier of FIG. 15 in the voltage follower configuration. Referring to FIG. 46A, the output terminal voltage Vout rises instantaneously against the increase (rise) of the input terminal voltage VinP, at the beginning of the output period T1 (charging), by the bootstrap operation of the capacitor element 210. The output terminal voltage Vout then rises to 10V by the transistor 101. In transition to the output period T2 (discharge), the output terminal voltage Vout decays instantaneously, against decrease (decay) of the input terminal voltage VinP, and then is lowered towards the low voltage side by the transistor 102. Hence, the high-speed operation by the bootstrap operation is realized. FIG. 46B shows the voltage waveforms V10, V20 at the control terminals 10 and 20 of the push-pull output stage in FIG. 15, against changes in the output terminal voltage Vout of FIG. 46A. From the state of the voltage waveforms V10, V20, it may be confirmed whether or not any wasteful short-circuit current flows in the push-pull output stage of the differential amplifier of FIG. 15, as in FIG. 44B. From FIG. 46B, it is seen that short-circuit current is scarcely produced at a location indicated by circle marks. The reason is that, at the beginning of the charging period T1, the voltage decreasing action for the terminal voltage V20 by the bootstrap operation controls the voltage increasing action of V20 via the auxiliary capacitance 222, and that, at the beginning of the discharging period T2, the voltage decreasing action for the terminal voltage V10 by the bootstrap operation controls the voltage increasing action of V10 via the auxiliary capacitance 221. Thus, with the differential amplifier of FIG. 15 by the switch control shown in FIG. 10 (control of signal S1), a high-speed operation may be realized without increasing the power dissipation. Although the high speed operation may be realized with the differential amplifier of FIG. 17 or FIG. 18, including two auxiliary capacitors across the output terminal and the control terminals 10 and 20, the differential amplifier of FIG. 18 by the switch control of FIG. 10 (control by the signal S1) is desirable for suppressing the power dissipation.

Figure 47:
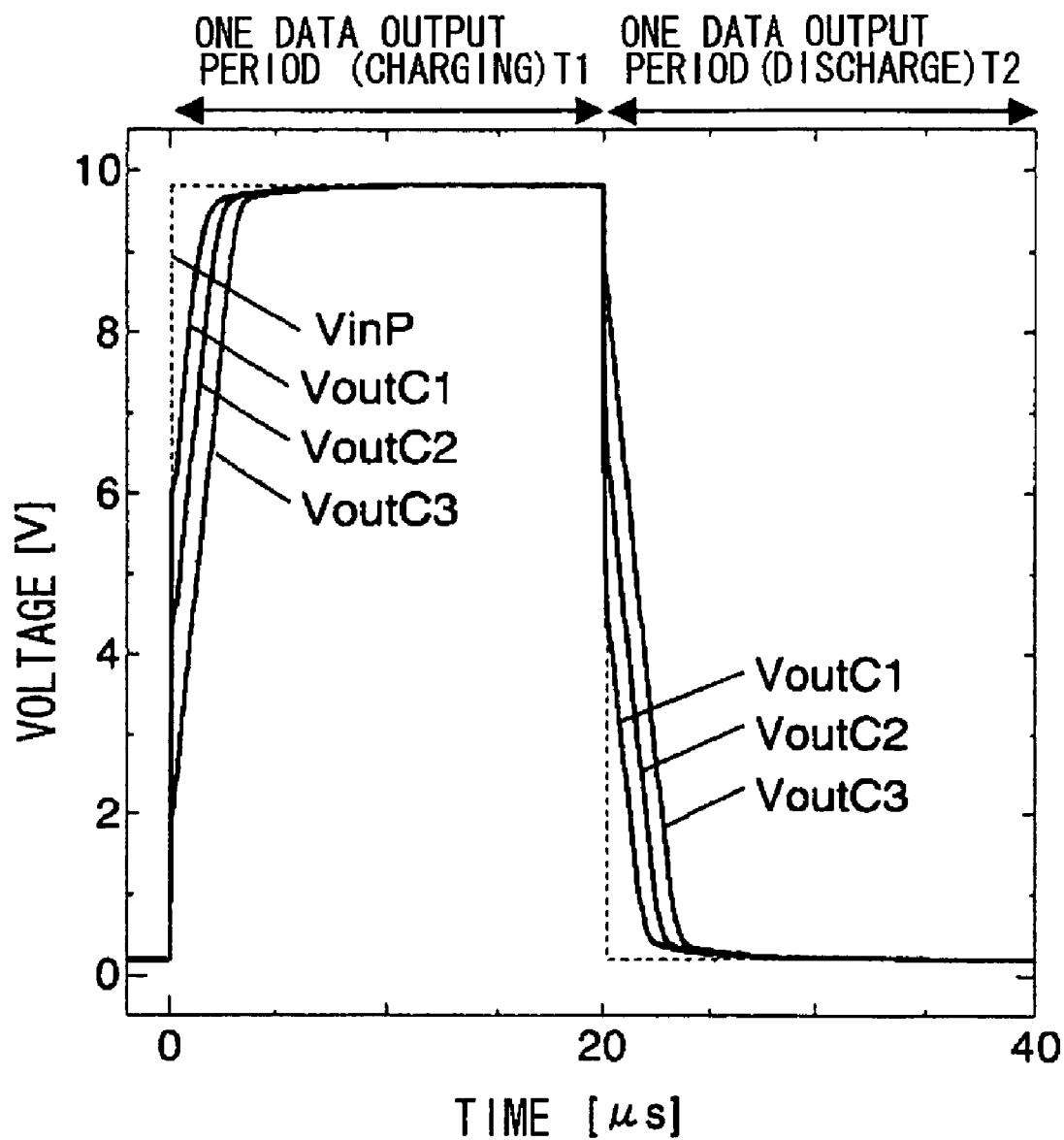
FIG. 47 shows an input/output voltage waveform of the embodiment of FIG. 16 (voltage follower configuration) by the control of signal S1 of FIG. 10, and specifically illustrates the operation in case of changing the capacitance ratio of the first capacitance (phase capacitor) and the second and third capacitances (auxiliary capacitors).

The operation by the capacitance ratio of the phase capacitor and the auxiliary capacitor for waveform shaping (second and third capacitors) is now explained. FIG. 47 shows the input/output waveform of the differential amplifier of FIG. 16 in the voltage follower configuration by the switch control (control of the signal S1) shown in FIG. 10. In FIG. 47, the output terminal voltage VoutC1 is for the capacitance ratio of the phase capacitor 210 to the auxiliary capacitors 223, 224 of 10:3, the output terminal voltage VoutC2 is for the capacitance ratio of the phase capacitor 210 to the auxiliary capacitors 223, 224 of 6:5, the output terminal voltage VoutC3 is for the capacitance ratio of the phase capacitor 210 to the auxiliary capacitors 223, 224 of 2:7.

As for the capacitance ratio of the phase capacitor 110 or 210 to the auxiliary capacitors, the larger the proportion of the phase capacitor, the larger is the instantaneous voltage variation of the voltage Vout at the beginning of the output period. Hence, the instantaneous voltage variation by the bootstrap operation may be controlled by adjusting the capacitance ratio of the phase capacitor 110 or 210 to the auxiliary capacitors.

Figure 24:
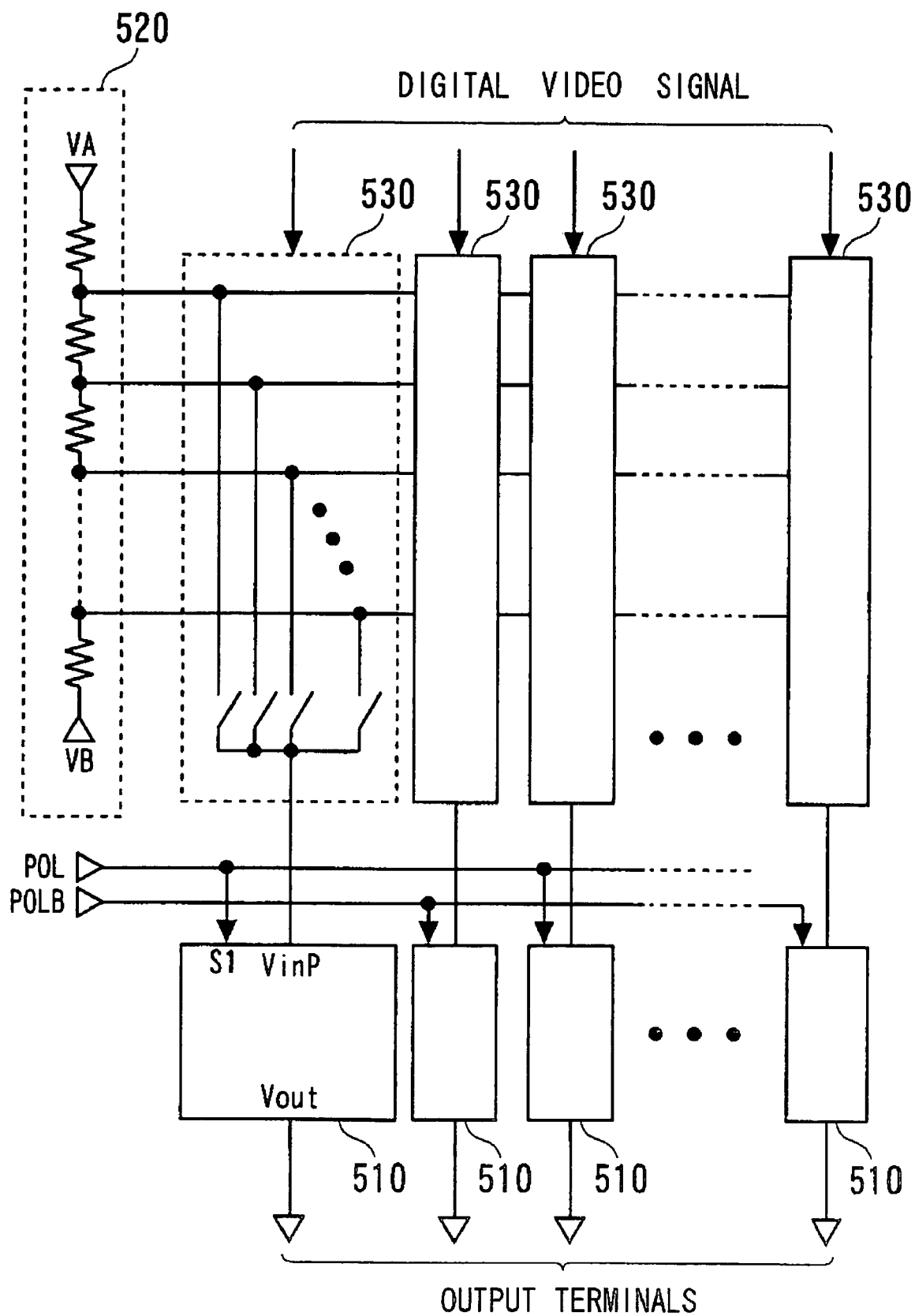
FIG. 24 shows the configuration of a seventh embodiment of the present invention.
Figure 25:
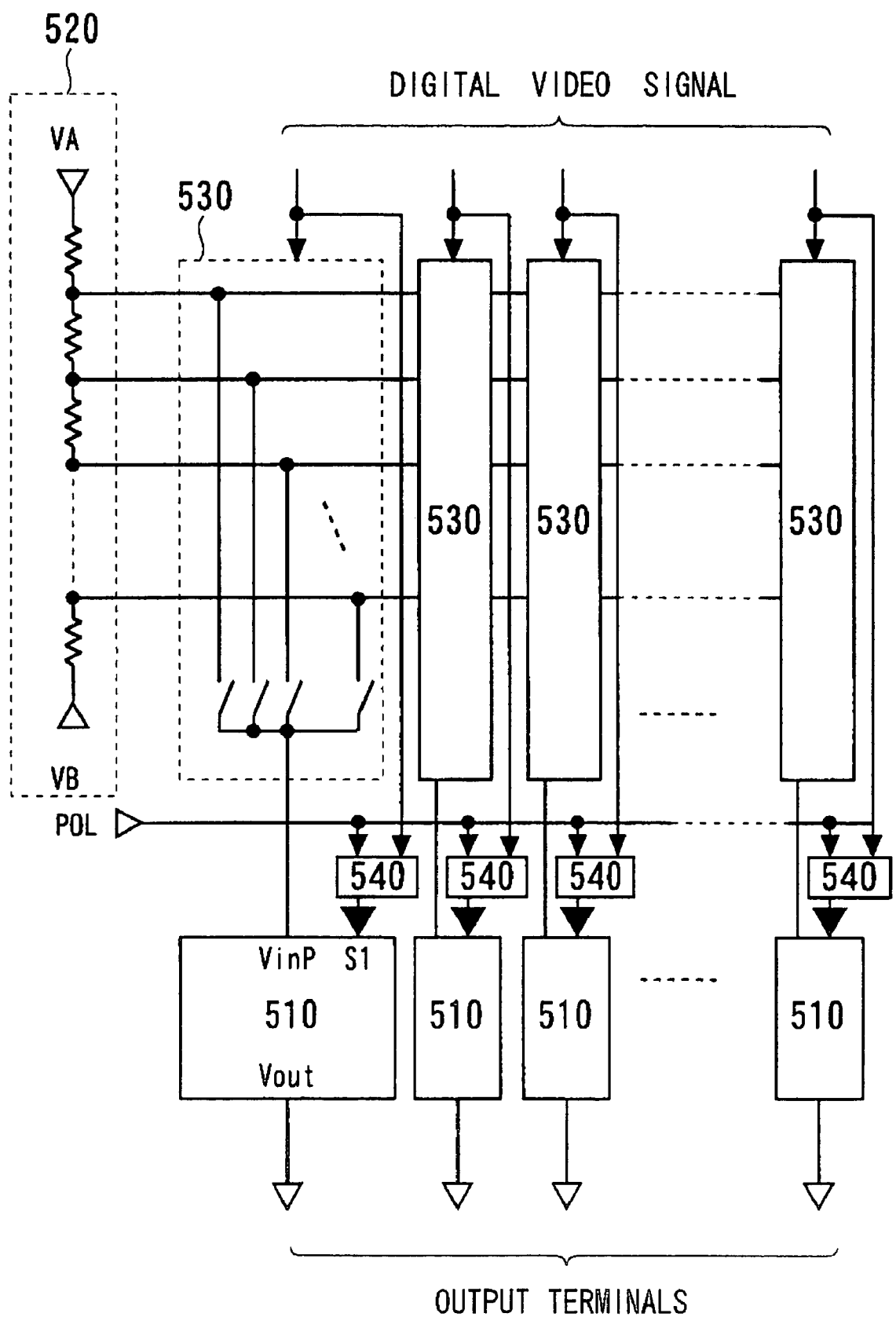
FIG. 25 shows the configuration of an eighth embodiment of the present invention.

A display device, according to an embodiment of the present invention, is hereinafter explained. FIGS. 24 and 25 illustrate an embodiment in which the differential amplifier according to the present invention is used as a buffer circuit 510 of a data driver of a liquid crystal display device. Before proceeding to the description with reference to FIGS. 24 and 25, the method for driving the liquid crystal display device is briefly explained. In the following, a dot inverting method and a common inverting method, as representative driving methods, are explained. In the driving method for the liquid crystal display device, an a.c. driving is used, in which, for preventing deterioration of the liquid crystal, the polarity of the voltage applied to both end electrodes of the liquid crystal (pixel electrode and the counter substrate electrode) is inverted, usually from one frame to another. In the dot inverting driving, as the counter substrate electrode voltage Vcom is kept constant, the grayscale voltage on the high potential side (positive polarity side) of the voltage Vcom and the grayscale voltage on the low potential side (negative polarity side) of the voltage Vcom are alternately applied to the pixel electrode. Hence, a power supply voltage approximately twice the maximum voltage applied to the liquid crystal is needed. Moreover, the polarity of the voltage applied to adjacent pixel electrodes is made different, to the maximum extent possible, in order to raise the display quality. Thus, with a data driver, performing dot inversion driving, the polarity of the grayscale voltage output from the adjacent buffer circuits is usually different. In addition, the polarity of the grayscale voltage, output from one buffer circuit, is inverted, every m data output periods, where the smaller the natural number m, the higher is the display quality.

On the other hand, in the common inverting driving, the polarity inversion is performed by alternately driving the common electrode (counter substrate electrode) voltage Vcom to two voltage levels, namely a high potential and a low potential, to enable the use of the grayscale voltage of the power supply voltage range approximately equal to the maximum voltage applied to the liquid crystal. It should be noted that, with the common inverting driving, in which at least the polarity of the same pixel row is equal, the display quality is inferior to that of the dot inversion driving. Thus, with the data driver, performing the common inversion driving, the grayscale voltage output from the adjacent buffer circuits is of the same polarity. The polarity of the grayscale voltage, output from one buffer circuit, is inverted, every m data output periods, where the smaller the natural number m, the higher is the display quality.

Although the two driving methods, namely the dot inverting driving and the common inverting driving, have so far been explained, these driving methods are used according to the respective features. For example, the dot inverting driving is widely employed for a liquid crystal display device of a large display format, where a high image quality is needed, while the common inverting driving is widely used for a liquid crystal display device for small portable equipment for which low power is required. In the following explanation, an illustrative structure as well as the operation and the favorable effect in applying the present invention are explained for respective liquid crystal display devices to which the respective driving methods are applied.

FIG. 24 illustrates the structure in which the differential amplifier of the present invention is used as a plural number of buffer circuits 510 of a data driver of the liquid crystal display device by dot inversion driving. Meanwhile, the differential amplifier of the present invention, applied to the buffer circuits 510, is of the voltage follower configuration, in which an input signal is supplied to a non-inverting input terminal and an output terminal is coupled in a feedback fashion to an inverting input terminal.

Referring to FIG. 24, the data driver is made up at least by a grayscale voltage generating circuit 520, a plural number of decoders 530 (selection circuits) and the buffer circuits 510. The grayscale voltage generating circuit 520 is formed by a resistor string connected across a power supply VA and a power supply VB. A plural number of grayscale voltages are output from respective taps of the resistor string. The decoder 530 is supplied with plural grayscale voltages and a digital video signal, to select the grayscale voltage which is in keeping with the digital video signal, to output the so selected grayscale voltage to the buffer circuits 510. The buffer circuits 510 are supplied with a polarity signal POL or an inverted version POLB thereof and with the grayscale voltage output from the decoder 530 to perform current amplification on the input grayscale voltage VinP to output the resulting signal to an output terminal. An output terminal of each buffer circuit 510 is connected to a data line of a display unit. The decoders 530 and the buffer circuits 510 are provided for each output terminal. The grayscale voltage generating circuit 520 may be used common for all output terminals. The video signal, entered to the decoders 530, are digital video signal, preferably processed by a data register, a latch or a level shifter.

The buffer circuits 510 are explained in more detail. In the dot inversion driving, the grayscale voltage, output from adjacent buffer circuits 510, differ in polarity, such that, in a given data output period, an odd-numbered buffer circuit and an even-numbered buffer circuit of FIG. 24 are of positive and negative polarities, respectively. Moreover, the polarities are inverted every m data output period. It is when the output voltage of the buffer circuit 510 is of large amplitude in the dot inversion driving at the time of polarity inversion that the driving speed is slowed down. If the polarity remains the same during consecutive output periods, the driving speed is faster, because the output voltage is changed only to a small extent.

Thus, in the embodiment shown in FIG. 24, the polarity signal POL or the inverted version POLB thereof is used as the external signal S1 for the differential amplifier of the present invention, in order to effect high speed driving for the large amplitude of the output voltage of the buffer circuit 510. The external signal S1 and an output voltage waveform of the buffer circuit 510 are explained with reference to FIGS. 26 and 27.

Figure 26:
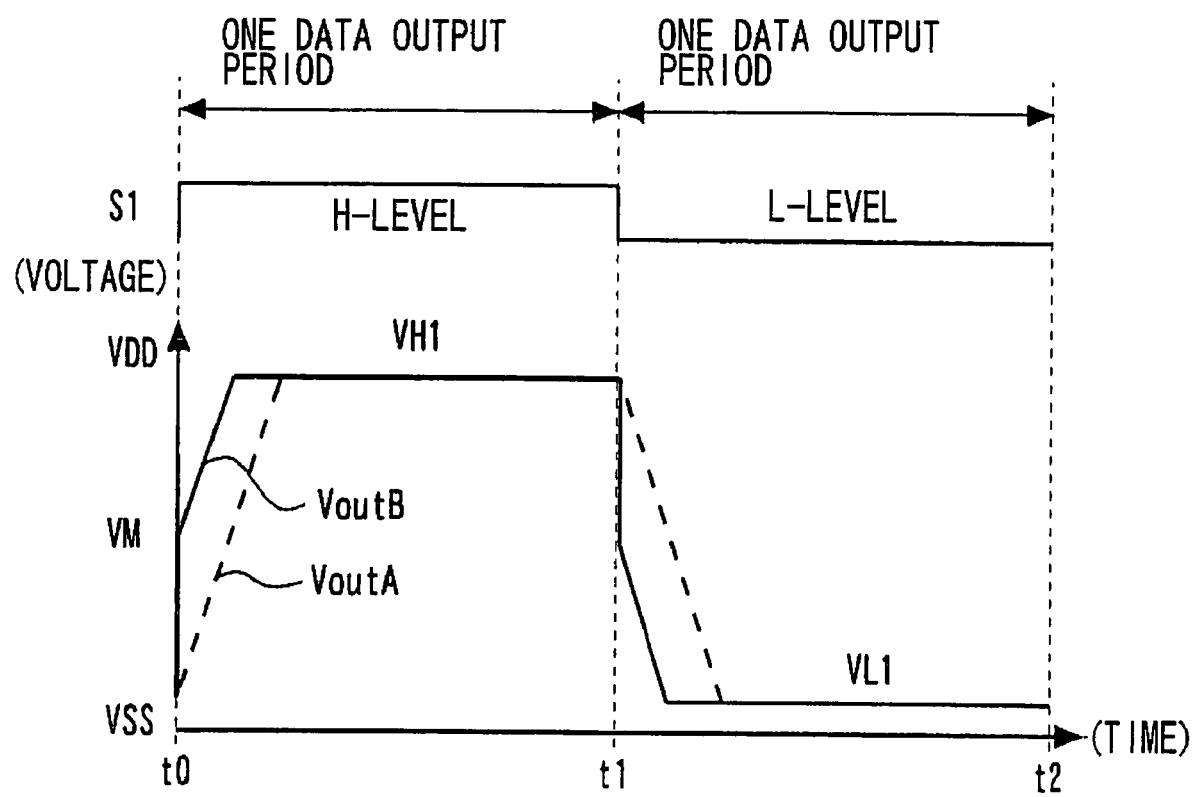
FIG. 26 shows an example of the timing of the signal S1 and an output terminal voltage waveform in the seventh and eighth embodiments of the present invention.
Figure 27:
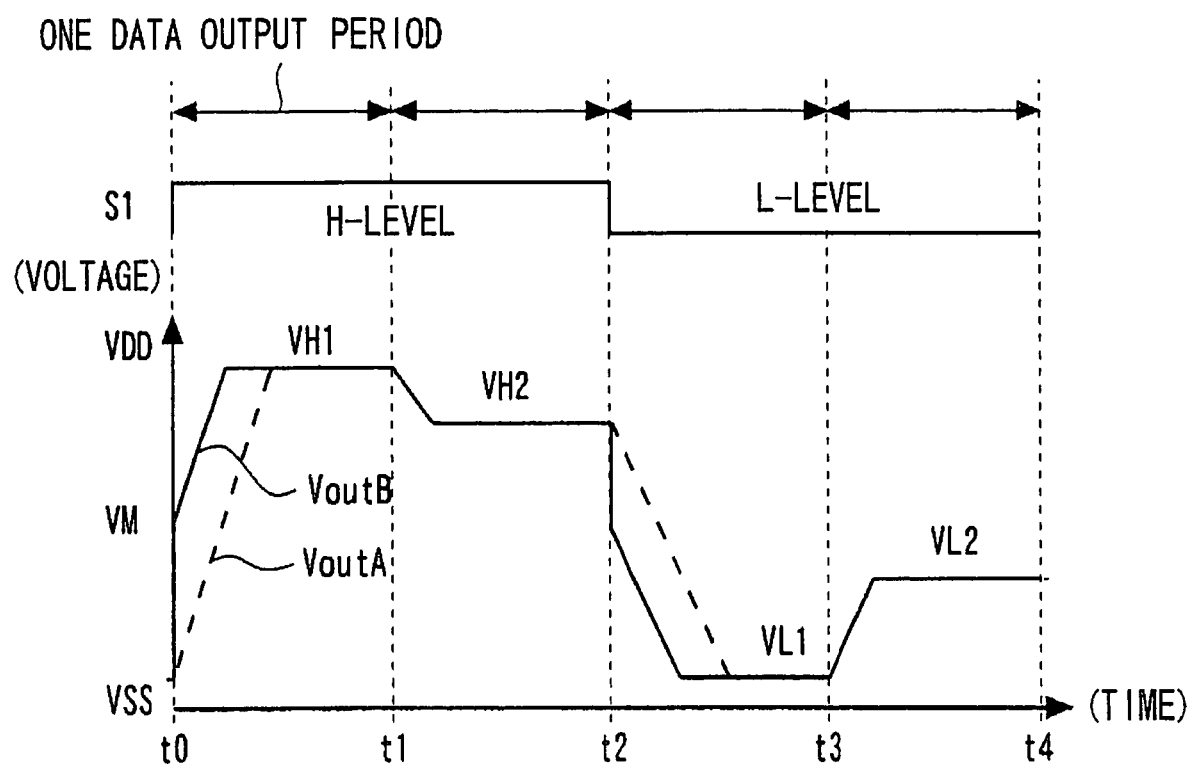
FIG. 27 shows another example of the timing of the signal S1 and an output terminal voltage waveform in the seventh and eighth embodiments of the present invention.

The voltage waveforms of FIGS. 26 and 27 schematically show an output voltage waveform of the buffer circuit 510 in which the results of the simulation of FIG. 22 are taken into consideration. It is noted that VoutA and VoutB represent the waveforms of the conventional differential amplifier and the inventive differential amplifier, respectively. A voltage VM in the drawings corresponds to the voltage of the counter substrate electrode Vcom.

FIG. 26 shows a voltage waveform in an embodiment where the polarity is inverted every data output period where m=1. This voltage waveform is such a one when the voltages VH1, VL1 are driven at a positive polarity and at a negative polarity, respectively. Since the polarity is inverted every data output period, the charging and discharging operations occur alternately.

The output terminal voltage VoutA of a conventional differential amplifier is varied at a constant slew rate with the beginning of a data output period. Conversely, the output terminal voltage VoutB of the present invention is instantaneously changed to a preset voltage level, by the bootstrap operation, with the beginning of a data output period, after which it is changed with a slew rate of the same order of magnitude as that for the voltage VoutA. Thus, with the buffer circuit 510, employing the differential amplifier of the present invention, a higher speed driving than is possible with the conventional circuit may be achieved.

FIG. 27 is a waveform diagram showing a voltage waveform in an embodiment in which the polarity is inverted every two data output periods (m=2). The voltage waveform is an output voltage waveform in which voltages VH1, VH2 are consecutively driven at a positive polarity and in which VL1, VL2 are consecutively driven at a negative polarity.

At a time t0, the polarity changes over from the negative to the positive and hence the charging operation occurs. Conversely, at a time t2, the polarity changes over from the positive to the negative and hence the discharging operation occurs. With both VoutA and VoutB, the voltage amplitude (voltage variation) is larger. At a time t1 and at a time t3, the polarity is not changed. With both VoutA and VoutB, the voltage amplitude (voltage variation) is small.

Referring to FIG. 27, the output voltage waveform VoutA of the conventional differential amplifier is varied at a substantially constant slew rate, without dependency on the voltage amplitude (voltage variation) with the beginning of each data output period. The output voltage waveform VoutB of the differential amplifier of the present invention is instantaneously changed up to a preset voltage level, by the bootstrap operation, at time t0 and time t2, with the beginning of each the corresponding data output period, after which it is varied with a slew rate of the same order of magnitude as that for VoutA. At a time t1 and a time t3, the output voltage waveform VoutB is varied at a constant slew rate, with the beginning of each the corresponding data output period.

Thus, with the buffer circuit 510 of the present invention, a higher driving speed than is possible with the conventional differential amplifier may be realized in the data output period in which the voltage amplitude becomes larger.

Thus, with the data driver of FIG. 24, in which the inventive differential amplifier is applied to the buffer circuit 510 in the dot inversion driving, a high-speed operation by the bootstrap operation may be achieved. If the differential amplifier, scarcely suffering from the short-circuit current, according to the present invention, is used, a high speed operation may be realized, without increasing the power dissipation (power dissipation of the differential amplifier excluding the data line charging/discharge). On the other hand, if a sufficient driving speed is realized, the current consumption and hence the power dissipation of the differential amplifier may be reduced.

FIG. 25 shows a structure in which the differential amplifier of the present invention is used as a buffer circuit 510 of the data driver of the liquid crystal display device for common inversion driving. Meanwhile, the differential amplifier of the present invention, applied to the buffer circuit 510, is of the voltage follower configuration. Referring to FIG. 25, the data driver is composed at least of a grayscale voltage generating circuit 520, a decoder 530 (selection circuit), a buffer circuit 510 and a decision circuit 540. The grayscale voltage generating circuit 520 and the decoder 530 are of the same structure as those shown in FIG. 24 and hence the explanation therefor is omitted for simplicity.

The decision circuit 540 is supplied with the polarity signal POL and with digital video signal, and outputs a decision signal, for discriminating whether the grayscale voltage supplied to the buffer circuit 510 is on the higher potential side or on the lower potential side with respect to a mid voltage VM of the power supply voltage range, to the buffer circuit 510. Meanwhile, the digital video signal, supplied to the decision circuit 540, may be only upper bits, or may even be the MSB in the simplest case.

Turning to the buffer circuit 510, the grayscale voltages output from adjacent buffer circuits 510 in the common inversion driving are of the same polarity, such that the outputs of the buffer circuits of FIG. 25 are all of the same polarity. The polarity of the respective buffer circuits 510 is inverted every m output periods. In the common inversion driving, the driving speed is slowed down when the output voltage of the buffer circuit 510 is of a large amplitude. This is determined by the polarity signal POL and by the digital video signal.

Thus, with the structure shown in FIG. 25, a decision signal of the decision circuit 540 for verifying whether the grayscale voltage is on the high potential side or on the low potential side is used as the external signal S1 of the differential amplifier of the present invention, in order to effect high speed driving in case of the output voltage of the buffer circuit 510 being of the larger amplitude (the voltage magnitude being larger). The external signal S1 and the output signal waveform of the buffer circuit 510 are now explained with reference to FIGS. 26 and 27.

The voltage waveforms of FIGS. 26 and 27 schematically show output voltage waveforms of the buffer circuit 510 in which the results of the simulation of FIG. 22 are taken into consideration. It is noted that VoutA and VoutB represent the waveforms of the differential amplifier of a comparative example (differential amplifier not having the bootstrap operation of the present invention) and the inventive differential amplifier, respectively. In FIGS. 26 and 27, the voltage VM corresponds to a mid voltage of the power supply voltage range. If the total number of the grayscale levels is 64, 31 grayscale levels of the voltage may be allocated to the voltage VM.

FIG. 26 shows a voltage waveform of an embodiment in which the decision signal (S1) of the decision circuit 540 is inverted in consecutive data output periods. During the time of t0 to t1, the output voltage waveform drives the high potential side voltage VH1 and, during the time of t1 to t2, the output voltage waveform drives the low potential side voltage VL1.

FIG. 27 shows a voltage waveform of an embodiment in which the decision signal (S1) of the decision circuit 540 is inverted irregularly in the consecutive data output periods. During the time of t0 to t2, the output voltage waveform drives the high potential side voltages VH1 and VH2 in succession and, during the time of t2 to t4, the output voltage waveform drives the low potential side voltages VL1 and VL2 in succession.

At time t0 and at time t2, the decision signal is inverted, so that the grayscale voltage is changed from the low potential side to the high potential side or vice versa. At this time, the voltage amplitudes of VoutA and VoutB are increased. At time t1 and at time t3, the voltage amplitude is small.

Thus, in both FIGS. 26 and 27, the output voltage waveform VoutA of the differential amplifier of the comparative example is varied at a substantially constant slew rate, at the beginning of each data output period, without dependency on the voltage amplitude (voltage variation).

When the grayscale voltage changes from the low potential side voltage (less than the voltage Vm) to the high potential side voltage(not less than Vm) or from the high potential side voltage to the low potential side voltage, the output voltage waveform VoutB of the differential amplifier of the present invention is instantaneously changed up to a preset voltage level, by the bootstrap operation, immediately following the beginning of each the corresponding data output period, after which it is varied with a slew rate of the same order of magnitude as that for VoutA.

Thus, with the buffer circuit 510 of the present invention, a higher driving speed than is possible with the buffer circuit of the comparative example (circuit not having the bootstrap operation of the present invention) may be realized in the data output period in which the voltage amplitude becomes larger.

Thus, with the data driver of FIG. 25, in which the inventive differential amplifier is applied to the buffer circuit 510 in the common inversion driving, a high-speed operation by the bootstrap operation may be achieved. If the differential amplifier, scarcely suffering from the short-circuit current, according to the present invention, is used, a high speed operation may be realized, without increasing the power dissipation (power dissipation of the differential amplifier excluding the data line charging/discharge), even in case the data line driving frequency is increased and the charging/discharging operations are carried out frequently. On the other hand, if a sufficient driving speed is realized, the current consumption and hence the power dissipation of the differential amplifier may be lower.

The structure shown in FIGS. 24 and 25 represents an embodiment of the data driver and is not limited to dot inversion driving or to common inversion driving. For example, in FIG. 25, the function equivalent to that of the decision circuit 540 may be used for dot inversion driving.

Figure 28:
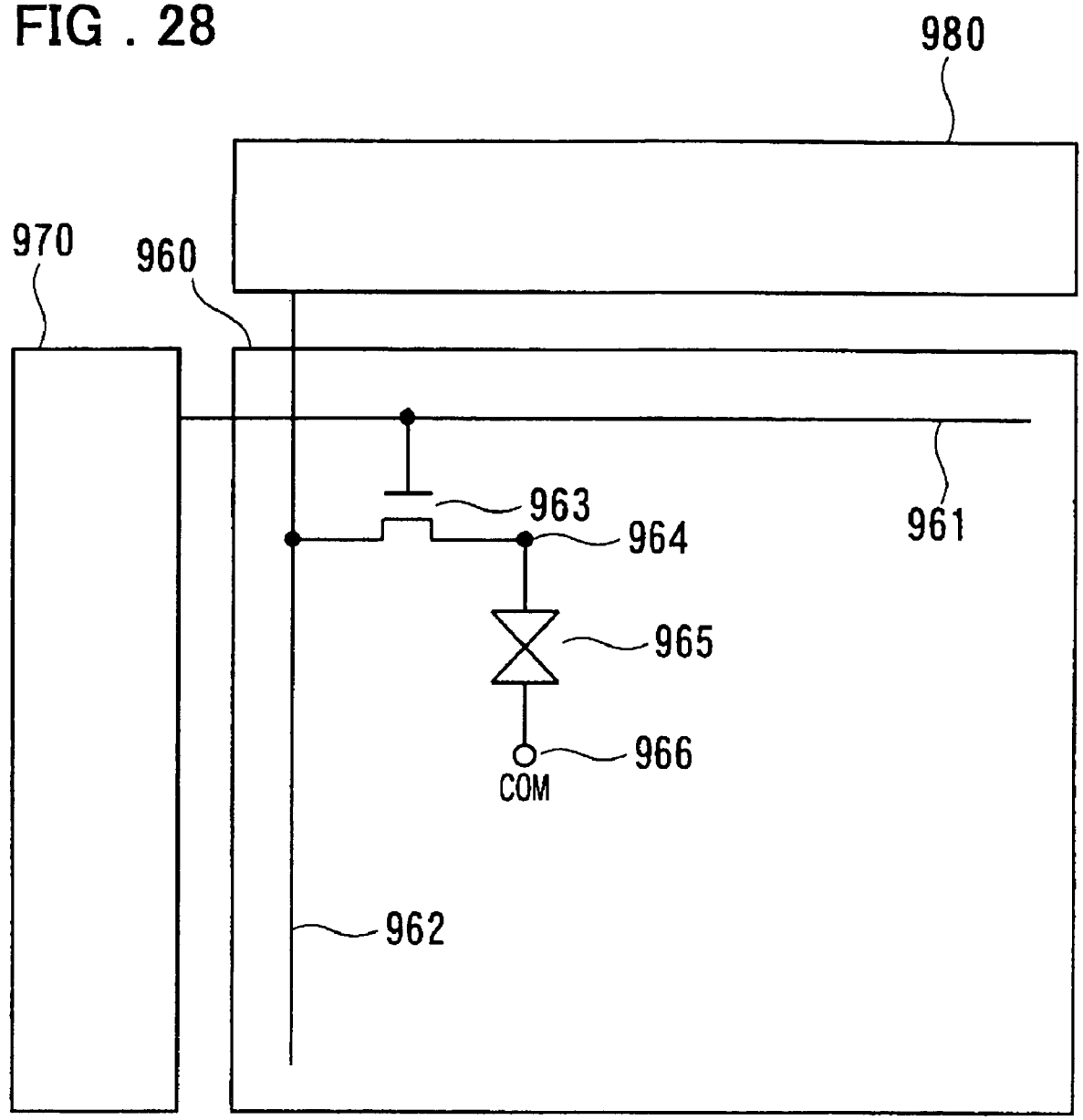
FIG. 28 shows the configuration of a display device.

The data driver of FIGS. 24 and 25 may be used as a data driver 980 of the liquid crystal display device shown in FIG. 28. By the data driver 980, provided with the differential amplifier, having the bootstrap operation according to the present invention, the liquid crystal display device with a large display format, in which the data line load presents a large capacitance, may be driven easily. Meanwhile, the liquid crystal display device, shown in FIG. 28, may have a data driver 980 formed as discrete chips as silicon LSIs, which are connected to a display unit 960. Alternatively, the data driver may be formed as one with the display unit 960, by forming a circuit on an insulating substrate, such as a glass substrate, using a polycrystalline silicon TFT (thin-film transistor).

The differential amplifier according to the present invention may be applied to any type of the data drivers of the display device, including the above type data driver, for improving the performance of the display device. For example, the differential amplifier according to the present invention may be applied to a display device, such as an organic EL display of the active matrix driving system, outputting multi-valued level voltage signals to the data line for display, in addition to the liquid crystal display device.

Figure 48:
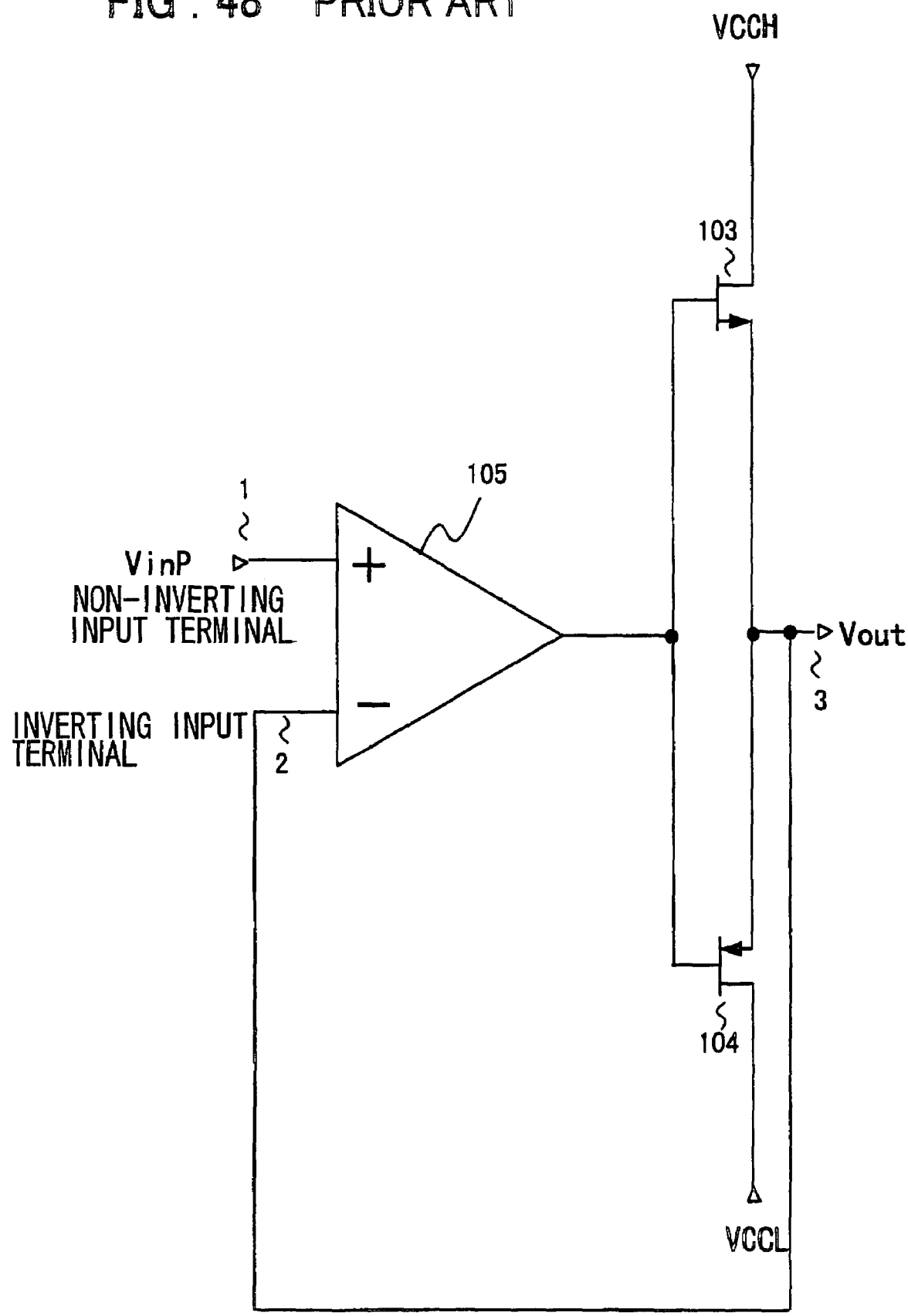
FIG. 48 shows the configuration of a conventional amplifier.

A further embodiment of the present invention is now explained. FIG. 48 shows the configuration of a known output circuit. This output circuit includes a high-gain operational amplifier 105 in a negative feedback loop to diminish the cross-over distortion of the class B output stage. An NPN bipolar transistor 103 and a PNP bipolar transistor 104 are connected in series across a positive polarity power supply VCCH and a negative polarity power supply VCCL. An output of the operational amplifier 105 is connected common to the bases of the transistors, the emitters of which are connected common and connected to an output terminal Vout. An input signal VinP is entered to a non-inverting terminal of the operational amplifier 105, having an inverting input terminal 2 connected to the output terminal Vout, in a voltage follower configuration. The high speed driving of the output circuit is controlled by the slew rate of the operational amplifier 105.

Figure 49:
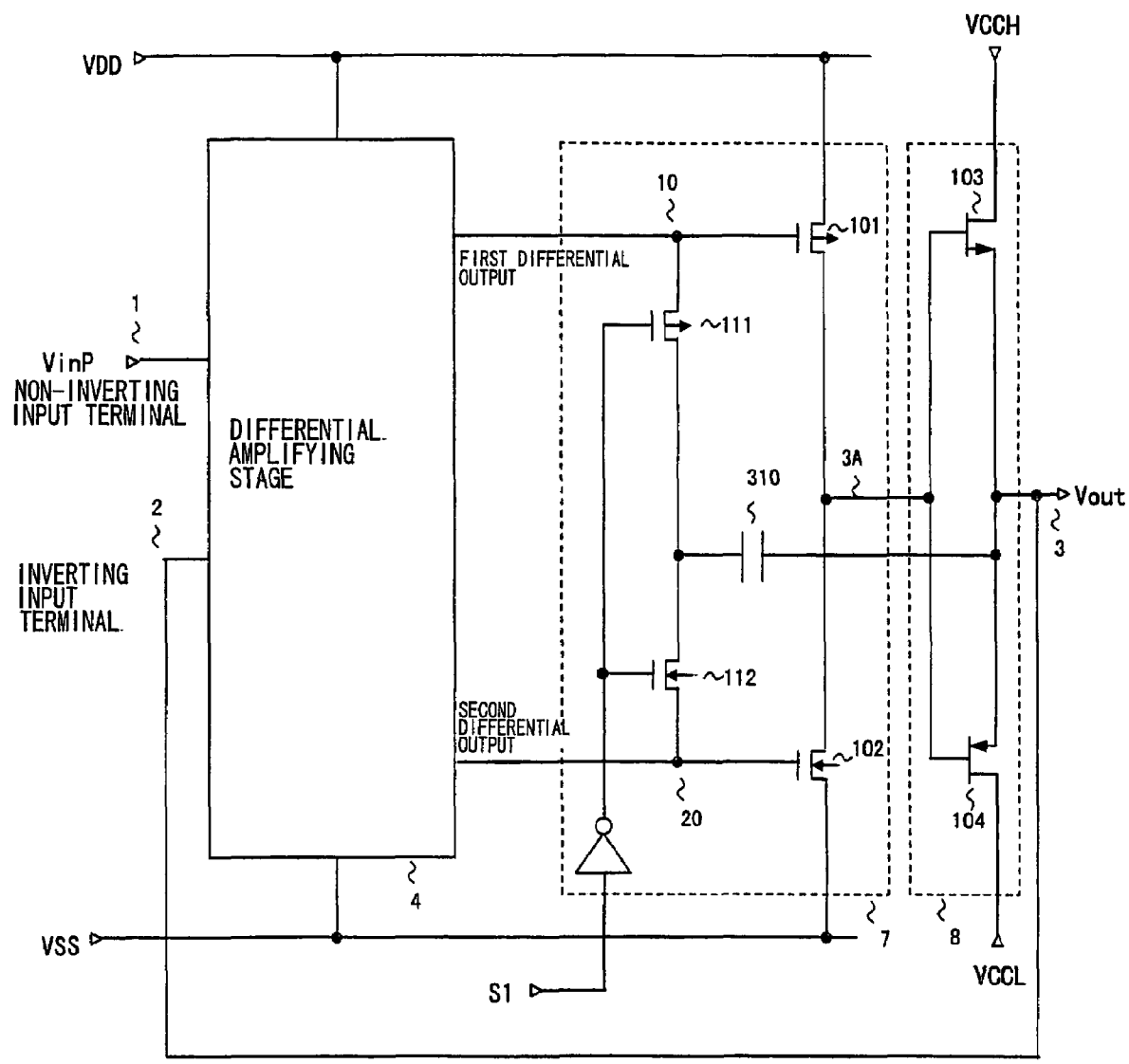
FIG. 49 shows an embodiment where the present invention has been applied to the amplifier of FIG. 48.

FIG. 49 shows a circuit structure corresponding to the output circuit of FIG. 48 to which an embodiment of the present invention is applied. The operational amplifier 105 of FIG. 48 is made up by a differential amplifying stage 4 and a liaison stage circuit 7 for receiving a first differential output and a second differential output from the differential amplifying stage 4. An output signal 3A of the liaison stage circuit 7 is coupled common to the bases of the NPN bipolar transistor 103 and the PNP bipolar transistor 104 together forming an output stage circuit 8. The differential amplifying stage 4 is of the same structure as the differential amplifying stage 4 of FIG. 1, while the liaison stage circuit 7 is of the same structure as that of the output driving stage 5 provided with the capacitor connection control circuit of FIGS. 1 and 3. That is, the liaison stage circuit 7 includes a P-channel transistor 101 and an N-channel transistor 102, connected in series across the high potential side power supply VDD and the low potential side power supply VSS to form a liaison stage. The first differential output from the differential amplifying stage 4 is connected to the gate of the P-channel transistor 101, while the second differential output from the differential amplifying stage 4 is connected to the gate of the N-channel transistor 102. As a capacitor connection control circuit, there is provided a capacitor element 310, having one end connected to the output terminal 3. A switch (P-channel transistor) 111 is connected across the other end of a capacitor element 310 and the gate of the P-channel transistor 101, and a switch (N-channel transistor) 112 is connected across the other end of the capacitor element 310 and the gate of the N-channel transistor 102. An inverted version of the control signal S1 is coupled to the gates of the P-channel transistor 111 and the N-channel transistor 102. The control signal S1 is controlled e.g. in accordance with FIG. 4. With the above-described configuration of the present embodiment, the destination for connection is changed over by the switches 111 and 112 turned on/off by the control signal S1. The voltage at the node 3A is instantaneously raised or lowered to a preset potential, at a high slew rate, by the bootstrap operation of the capacitor element 310. The node voltage may then be raised or lowered with a moderated slew rate based on the output of the differential amplifying stage 4 of the voltage follower configuration, thereby enabling high speed driving. There may be provided a plural number of liaison stages (P-channel transistors 101 and the N-channel transistors 102). By providing a plural number (odd-number) of liaison stages (inverters), the control of the switches 111 and 112 is performed in accordance with FIG. 2 in case the differential output voltages of the differential amplifying stage 4 (differential voltages of the first and second differential outputs) are antiphase with respect to the output terminal voltage of the output terminal 3. By providing an even number of liaison stages (inverters), the control of the switches 111 and 112 is the reverse of the control of FIG. 2 in case the differential output voltage of the differential amplifying stage 4 (differential voltage of the first and second differential outputs) are in phase with respect to the output terminal voltage of the output terminal 3. Meanwhile, the NPN bipolar transistor 103 and the PNP bipolar transistor 104, forming the output stage circuit 8, may also be constructed by an N-channel transistor and a P-channel transistor, respectively. As an alternative exemplary configuration of the liaison circuit 7, the liaison circuit 7 may be of the same structure as the output stage circuit 6 of FIGS. 5 and 8. As described above, the present invention may be applied to an optional push-pull output circuit.

The differential amplifier, explained in the above embodiments, is constructed by an MOS transistor. For use in a driving circuit for a liquid crystal display device, the differential amplifier may also be constructed by a MOS transistor (TFT) formed e.g. by polycrystalline silicon. The differential amplifier may also be a differential amplifier or a bipolar transistor as explained in the above embodiments. In such case, the P-channel transistor is a pnp transistor, while the N-channel transistor is an npn transistor. Although the above-described embodiments are directed to an IC, a discrete device configuration may, of course, be used.

In the above embodiment, the some advantageous and concrete effects attained by the present invention have been described with reference to the example of the differential amplifier configured as a voltage follower with a gain=1 using the wave form diagram. However, in the present invention, the gain of the differential amplifier is not limited to one, i.e., the same effects as described in the above may well be attained by a differential amplifier with a gain of an arbitrary value.

Another embodiment of the present invention will now be described. The differential amplifiers according to the above described embodiments are adapted so as to carry out the connection switching of respective capacitor elements 110 and 210 between the control terminals 10 and 20 of the transistors 101 and 102 constituting an output stage and the output terminal 3. However, the present invention is not restricted to the above described configuration. In another embodiment of the present invention, the capacitor elements 110 and 210 may be connected to one of output pair of the differential pair.

Figure 50:
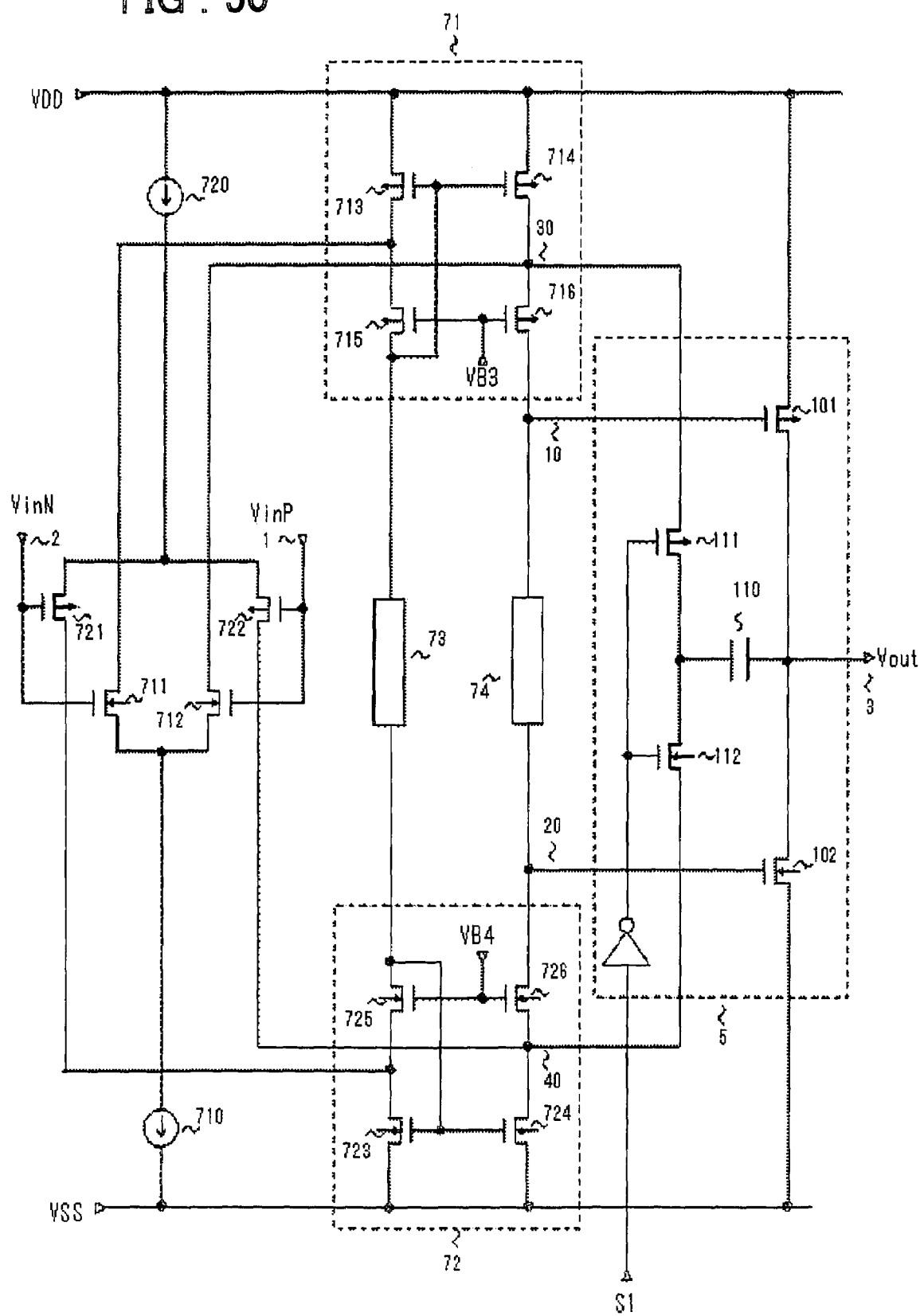
FIG. 50 is a diagram showing a configuration of another embodiment of the present invention.

More specifically, referring to FIG. 50 which is a diagram showing the configuration of another embodiment which is a modification of the embodiment described with reference to FIG. 11, one end of the switch 111 is connected to the output end 30 of the transistor 712 constituting one of the output pairs of the differential pair comprising transistors 711 and 712, whereas the one end of the switch 111 in the embodiment shown in FIG. 11, is connected to the control terminal 10. The terminal 30 is also a connection node of transistors 714 and 716 constituting a cascode current mirror circuit 71. One end of the switch 112 is connected to the output end 40 of the transistor 722 constituting one of the output pairs of the differential pair comprising transistors 721 and 722, whereas the one end of the switch 112 in the embodiment shown in FIG. 11, is connected to the control terminal 20. Referring to FIG. 50, the circuit configuration other than the connections of one ends of switches 121 and 122 is identical with that of the embodiment shown in FIG. 11. The switches 111 and 112 are on/off controlled as shown in FIG. 4 by the control signal S1, i.e., in the same way as with the embodiment shown in FIG. 11. Accordingly, when the switching from the output period T2 to the output period T1 is performed, the potential at the terminal 30 is instantaneously lowered by the bootstrap operation.

The source-to-gate voltage of the transistor 716 constituting the cascode current mirror circuit 71 is reduced, so that the current flowing through the transistor 716 is reduced, On the other hand, since the floating current source 74 is adapted to cause the constant current to flow from the connection node (terminal 10) at which the cascode current mirror circuit 71 and the floating current source 74 are connected to the connection node (terminal 20) at which the cascode current mirror circuit 72 and the floating current source 74 are connected, the potential at the terminal 10 is lowered. With the configuration shown in FIG. 50, the charging operation by the transistor 101 can be temporally accelerated by lowering the potential at the terminal 10 through the bootstrap operation by the capacitor 110, in the same fashion as with the embodiment shown in FIG. 11.

When the switching from the output period T1 to the output period T2 is performed, the potential at the terminal 40 is instantaneously raised by the bootstrap operation of the capacitor 110, thereby pulling up the voltage of the terminal 40. Thus, the source-to-gate voltage of the transistor 726 constituting the cascode current mirror circuit 72 is reduced, so that the current flowing through the transistor 726 is reduced while the floating current source 74 is adapted to cause the constant current to flow between terminals 10 and 20 and that the potential at the terminal 20 is raised. So, with the configuration shown in FIG. 50, the potential at the terminal 20 is increased through the bootstrap operation by the capacitor 110 to accelerate the discharging operation by the transistor 102 temporally in the same fashion as with the embodiment shown in FIG. 11.

Figure 51:
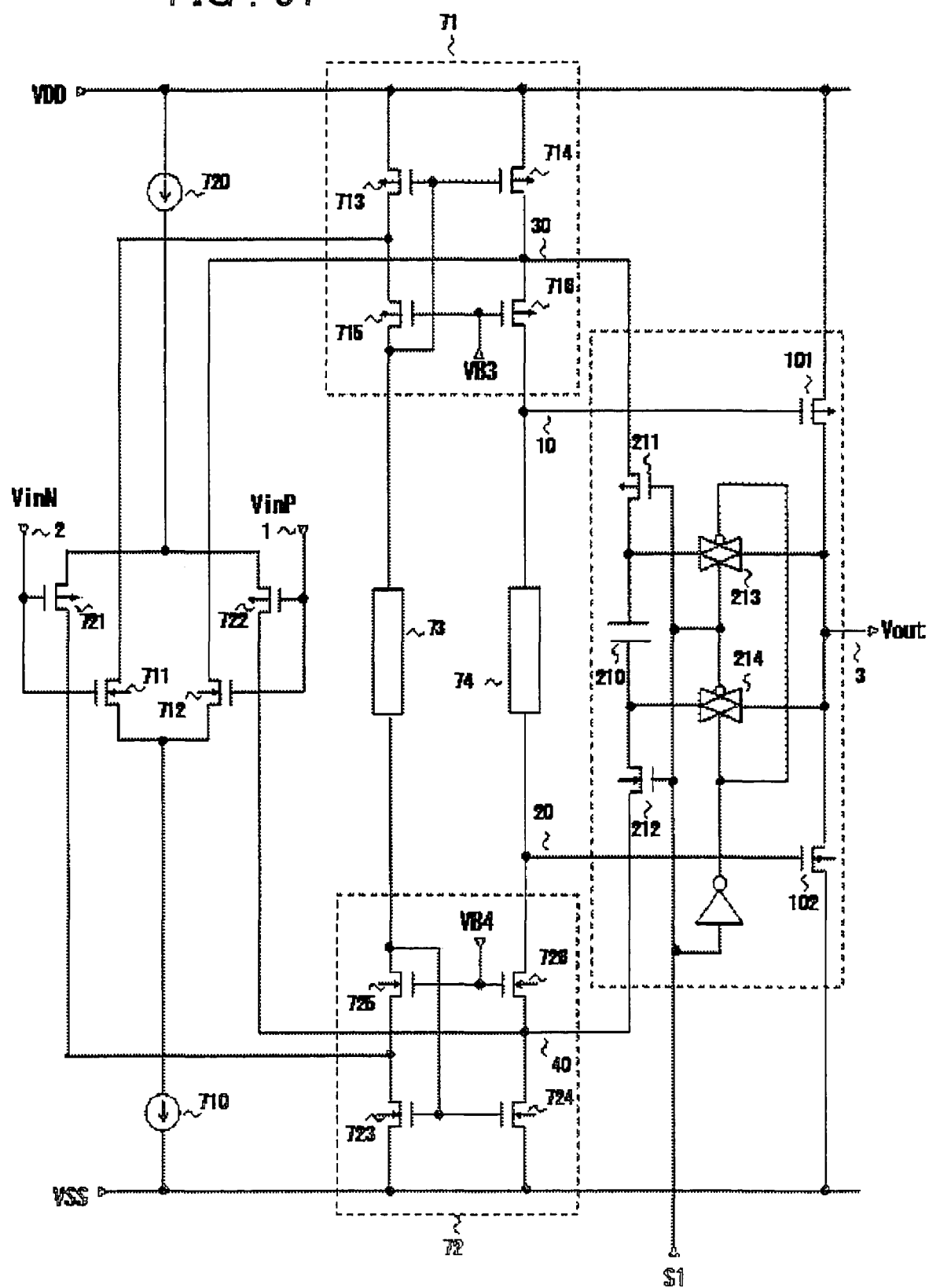
FIG. 51 is a diagram showing a configuration of still another embodiment of the present invention.

Yet another embodiment of the present invention will now be described. FIG. 51 shows still another embodiment of the present invention which is a modification of the embodiment shown in FIG. 12. Referring to FIG. 51, one end of the switch 211 is connected to the output end 30 of the transistor 712 constituting one of the output pairs of the differential pair comprising transistors 711 and 712, whereas the one end of the switch 211 in the embodiment shown in FIG. 12, is connected to the control terminal 10. The terminal 30 is also a connection node of transistors 714 and 716 constituting a current mirror circuit 71. One end of the switch 212 is connected to the output end 40 of the transistor 722 constituting one of the output pairs of the differential pair comprising transistors 721 and 722, whereas the one end of the switch 212 in the embodiment shown in FIG. 11, is connected to the control terminal 20. Referring to FIG. 51, the circuit configuration other than the connections of one ends of switches 211 and 212 is identical with that of the embodiment shown in FIG. 12. The switches 211 and 212 are on/off controlled by the control signal S1 as shown in FIG. 9 or FIG. 10, i.e., in the same way as with the embodiment shown in FIG. 12. Accordingly, when the switching from the output period T2 to the output period T1 is performed, the potential at the terminal 30 is instantaneously lowered through the bootstrap operation by the capacitor 210, so that the potential at the terminal 10 is lowered. Thus, the charging operation by the transistor 101 can be temporally accelerated.

When the switching from the output period T1 to the output period T2 is performed, the potential at the terminal 40 is instantaneously raised owing to the bootstrap operation by the capacitor 210, so that the potential at the terminal 20 is pulled up. Thus, the discharging operation by the transistor 102 can be temporally accelerated.

As described above, the terminal, the potential of which is to be instantaneously changed with bootstrap operation by the connection switching of the capacitor element, may be either the control terminal of the transistor constituting the output stage or one output terminal of the differential pair. In case the load circuit of the differential pair is composed by the multiple cascode current mirror circuit, a connection node between the multiple stage of the multiple cascode current mirror circuit may be adopted as the terminal, the potential of which is to be instantaneously changed with bootstrap operation by the connection switching of the capacitor element.

Meanwhile, in the circuit configuration shown in FIGS. 50 and 51, by adding capacitor elements (121,122), (123, 124), (221,222), or (223, 224) as shown in FIGS. 13 to 16 respectively, the same advantageous effects as those of the embodiments shown in FIGS. 13 to 16 may as a matter of course be obtained.

According to the present invention, described above, the state in which a capacitor element is connected across one control terminals of two transistors of the push-pull output stage of the differential amplifier and an output terminal may be switched to the state in which the capacitor element is connected across the other control terminals of the two transistors and the output terminal, or vice versa, thereby producing the bootstrap operation to realize high speed driving without increasing the power dissipation. In this manner, a driving circuit of low power dissipation and high driving speed may be provided which may be used with advantage for e.g. a data driving device for a display device.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
   a differential amplifying stage including: a non-inverting input terminal; an inverting input terminal; a first differential output terminal; and a second differential output terminal; and
   an output amplifying stage including: an output terminal;
   a first transistor connected across said output terminal and a first power supply and having a control terminal connected to said first differential output terminal;
   a second transistor connected across said output terminal and a second power supply and having a control terminal connected to said second differential output terminal;
   a capacitor element; and
   a capacitor connection control circuit for interchangeably switching at least between a first connection state in which said capacitor element is connected across said output terminal and said control terminal of said first transistor and a second connection state in which said capacitor element is connected across said output terminal and said control terminal of said second transistor.

2. The differential amplifier according to claim 1, wherein said first transistor and the second transistor are of first and second conductivity types, respectively.

3. The differential amplifier according to claim 1, wherein said capacitor connection control circuit includes a circuit for performing control so as to switch, between a first connection state in which a first terminal and a second terminal of said capacitor element are connected to a control terminal of said first transistor and to said output terminal, respectively, and a second connection state in which the first terminal and the second terminal of said capacitor element are connected to a control terminal of said second transistor and to said output terminal, respectively.

4. The differential amplifier according to claim 1, wherein said capacitor connection control circuit includes a circuit for performing control so as to switch, between a first connection state in which a first terminal and a second terminal of said capacitor element are connected to a control terminal of said first transistor and to said output terminal, respectively, and a second connection state in which said first terminal and the second terminal of said capacitor element are connected to said output terminal and to the control terminal of said second transistor.

5. The differential amplifier according to claim 1, wherein said capacitor element performs phase compensation in addition to bootstrap operation.

6. The differential amplifier according to claim 1, further comprising second and third capacitor elements each having one end connected to said output terminal and having the other end connected to a preset terminal of said differential amplifying stage.

7. The differential amplifier according to claim 1, further comprising second and third capacitor elements each having one end connected to said output terminal and having the other end connected to control terminals of said first and second transistors.

8. The differential amplifier according to claim 1, wherein said capacitor connection control circuit includes:
   a first capacitor element;
   a first switch inserted across a first terminal of said first capacitor element and the control terminal of said first transistor; and
   a second switch inserted across said first terminal of said first capacitor element and the control terminal of said second transistor;
   a second terminal of said first capacitor element being connected to said output terminal; wherein
   during a charging period of said output terminal, said first switch and said second switch are turned on and off, respectively; and
   during a discharging period of said output terminal, said first switch and said second switch are turned off and on, respectively.

9. The differential amplifier according to claim 1, wherein said capacitor connection control circuit includes:
   a first capacitor element;
   a first switch inserted across the first terminal of said first capacitor element and the control terminal of said first transistor;
   a second switch inserted across the second terminal of said first capacitor element and the control terminal of said second transistor;
   a third switch inserted across a first terminal of said first capacitor element and said output terminal; and
   a fourth switch inserted across the second terminal of said first capacitor element and said output terminal; wherein
   during a charging period of said output terminal, said first and fourth switches are turned on and said second and third switches are turned off; and
   during a discharging period of said output terminal, said first and fourth switches are turned off and said second and third switches are turned on.

10. The differential amplifier according to claim 1, wherein said capacitor connection control circuit includes:
    a first capacitor element;
    a first switch inserted across the first terminal of said first capacitor element and the control terminal of said first transistor;
    a second switch inserted across the second terminal of said first capacitor element and the control terminal of said second transistor;

a third switch inserted across the first terminal of said first capacitor element and said output terminal; and a fourth switch inserted across the second terminal of said first capacitor element and said output terminal; wherein during a charging period of said output terminal, said first and fourth switches are turned off and said second and third switches are turned on; and during a discharging period of said output terminal, said first and fourth switches are turned on and said second and third switches are turned off.

11. The differential amplifier according to claim 1, wherein said differential amplifying stage includes:

a first current source connected to a high potential side power supply;

a first differential pair composed by a transistor pair of a first conductivity type, driven by said first current source, and differentially receiving the voltage from an input pair constituting said non-inverting input terminal and the inverting input terminal;

a first load circuit connected to an output pair of said first differential pair;

a second current source connected to a low potential side power supply;

a second differential pair composed by a transistor pair of a second conductivity type, driven by said second current source, and differentially receiving the voltage from an input pair constituting said non-inverting input terminal and the inverting input terminal; and a second load circuit connected to an output pair of said second differential pair;

output terminals of said first and second load circuits being second and first differential output terminals of said differential amplifying stage.

12. The differential amplifier according to claim 11, wherein said first load circuit is constituted by a first current mirror circuit formed by a transistor of a second conductivity type; and wherein said second load circuit is constituted by a second current mirror circuit formed by a transistor of a first conductivity type.

13. The differential amplifier according to claim 11, wherein said first load circuit is constituted by a first cascode type current mirror circuit formed by transistors of a second conductivity type; and wherein said second load circuit is constituted by a second cascode type current mirror circuit formed by transistors of a first conductivity type.

14. The differential amplifier according to claim 13, wherein an output pair of said first differential pair is connected to a connection node of two vertically disposed transistor pairs forming said first cascode type current mirror circuit; and wherein an output pair of said second differential pair is connected to a connection node of two vertical transistor pairs forming said second cascode type current mirror circuit.

15. The differential amplifier according to claim 13, wherein said first and second cascode type current mirror circuits have input side transistors coupled together via a first floating current source and output side transistors coupled together via a second floating current source; and wherein control terminals of said second and first transistors of said output amplifying stage are connected to a connection node of the output terminal of said first cascode type current mirror circuit and said second floating current source and to a connection node of the output terminal of said second cascode type current mirror circuit and said second floating current source.

16. A differential amplifier comprising:

a differential amplifying stage for differentially receiving an input signal and differentially amplifying the input signal;

an output stage including an output transistor pair for charging or discharging an output terminal, based on differential outputs of said differential amplifying stage;

a capacitor element; and a switching control circuit for performing control so that one of two terminals of said capacitor element is connected to said output terminal and the other of said terminals is interchangeably connected to one or the other of control terminals of said output transistor pair; wherein in changing the differential outputs of said differential amplifying stage, the connection of said capacitor element is changed over before the differential outputs from said differential amplifying stage at said control terminals of said output transistor pair are finally determined, whereby the voltage of the control terminal of one of the transistors of said output transistor pair which is switched from an off state to an on state is changed in a direction which turns on said one transistor to accelerate charging or discharging of said output terminal by said one transistor.

17. The differential amplifier according to claim 16, wherein at least one transistor forming said differential amplifying stage and/or said output amplifying stage is a MOS transistor.

18. The differential amplifier according to claim 16, wherein at least one transistor forming said differential amplifying stage and/or said output amplifying stage is a thin-film transistor.

19. The differential amplifier according to claim 16, wherein at least one transistor forming said differential amplifying stage and/or said output amplifying stage is a junction type transistor.

20. A data driver for a display device comprising a differential amplifier according to claim 1 as a buffer unit.

21. A data driver for a display device comprising a differential amplifier according to claim 1 as a buffer unit, wherein control for connection switching of said capacitor element is managed depending on a polarity signal.

22. A display device comprising a differential amplifier according to claim 1 as a circuit driving a data line.

23. A data driver for a display device comprising a differential amplifier according to claim 16 as a buffer unit.

24. A data driver for a display device comprising a differential amplifier according to claim 16 as a buffer unit, wherein control for connection switching of said capacitor element is managed depending on a polarity signal.

25. A display device comprising a differential amplifier according to claim 16 as a circuit driving a data line.

26. An output circuit comprising:

a first transistor connected across a high potential power supply and an output terminal, said first transistor having a control terminal and charging said output terminal based on a signal supplied to said control terminal thereof;

a second transistor connected across said output terminal and a low potential power supply, said second transistor having a control terminal and discharging said output terminal based on a signal supplied to said control terminal thereof;

a first capacitor element; and a switching control circuit receiving a control signal and performing switching a first control so as to connect said first capacitor element across said output terminal and the control terminal of said first transistor and a second control so as to connect said first capacitor element across said output terminal and the control terminal of said second transistor, based on the control signal.

27. The output circuit according to claim 26, wherein, in switching the charging/discharging operation of said output terminal, said switching control circuit switches the connection state of said first capacitor element, based on the input control signal, whereby the voltage at a control terminal of one of said first and second transistors which is switched from an off state to an on state is changed in a direction of turning said one transistor on to accelerate the charging or discharging of said output terminal by said one transistor upon start of said switching.

28. The output circuit according to claim 26, wherein the change in the voltage at said control terminal caused by switching the connection state of said first capacitor element is a constant voltage not dependent on the voltage at said output terminal.

29. The output circuit according to claim 26, wherein the change in the voltage at said control terminal caused by switching the connection state of said first capacitor element is a voltage dependent on the voltage at said output terminal just before said switching.

30. The output circuit according to claim 26, wherein, if, by said control signal, the voltage change in said output terminal in switching between the charging and the discharge at said output terminal is relatively large, switching control of the connection state of said first capacitor element is performed, based on said control signal, and wherein, if the change in the voltage at said output terminal is relatively small, the switching control of the connection state of said first capacitor element is not performed.

31. A differential amplifier comprising:

a differential amplifying stage including first and second input terminals and first and second output terminals, said differential amplifying stage differentially receiving and differentially amplifying a signal between said first and second input terminals; and said output circuit according to claim 26 as an output amplifying stage; wherein first and second output terminals of said differential amplifying stage are connected to the control terminals of said first and second transistors of said output circuit.

32. The differential amplifier according to claim 31, wherein said differential amplifying stage includes:

a first current source connected to a high potential side power supply;

a first differential pair, composed by a transistor pair of a first conductivity type, driven by said first current source and differentially receiving the voltage from an input pair;

a first load circuit connected to an output pair of said first differential pair;

a second current source connected to a low potential side power supply;

a second differential pair, composed by a transistor pair of a second conductivity type, driven by said second current source and differentially receiving the voltage from the input pair;

a second load circuit connected to an output pair of said second differential pair;

output terminals of said first and second load circuits being second and first output terminals of said differential amplifying stage.

33. The differential amplifier according to claim 32, wherein said first and second load circuits being first and second current mirror circuits, respectively.

34. The differential amplifier according to claim 32, wherein said first load circuit is formed by a first cascode type current mirror circuit formed by transistors of a second conductivity type;

said second load circuit is formed by a second cascode type current mirror circuit formed by transistors of a first conductivity type;

inputs of said first and second cascode type current mirror circuits are connected via a first floating current source;

outputs of said first and second cascode type current mirror circuits are connected via a second floating current source;

an output pair of said first differential pair is connected to a connection node of two vertical transistor pairs forming said first cascode type current mirror circuit; and wherein an output pair of said second differential pair is connected to a connection node of two vertical transistor pairs forming said second cascode type current mirror circuit.

35. The differential amplifier according to claim 32, further comprising second and third capacitor elements across said output terminal and an output of said output pair of said second differential pair and across said output terminal and an output of said output pair of said first differential pair, respectively.

36. The differential amplifier according to claim 11, further comprising:

a coupling circuit for coupling the output terminal of said first load circuit and the output terminal of said second load circuit.

37. The differential amplifier according to claim 32, further comprising:

a coupling circuit for coupling the output terminal of said first load circuit and the output terminal of said second load circuit.

38. The differential amplifier according to claim 36, wherein said coupling circuit includes at least one floating current source connected across the output terminal of said first load circuit and the output terminal of said second load circuit.

39. The differential amplifier according to claim 37, wherein said coupling circuit includes at least one floating current source connected across the output terminal of said first load circuit and the output terminal of said second load circuit.

40. An amplifier comprising:

a differential amplifying stage including: an inverting input terminal; a non-inverting input terminal; a first output terminal; and a second output terminal and differentially receiving and differentially amplifying a signal between said inverting input terminal and the non-inverting input terminal;

a push-pull output stage circuit including an input terminal; and an output terminal; and said output circuit according to claim 26, as a liaison stage circuit between said differential amplifying stage and said push-pull output stage circuit;

said first and second output terminals of said differential amplifying stage being connected to control terminals of said first and second transistors of said output circuit constituting said liaison stage circuit;

an output terminal of said output circuit, constituting said liaison stage circuit, being connected to an input terminal of said push-pull output stage circuit; wherein said switching control circuit, in said output circuit constituting said liaison stage circuit performs control so that said first capacitor element of said output circuit is connected across an output terminal of said push-pull output stage circuit and the control terminal of said first transistor or across said output terminal of said push-pull output stage circuit and the control terminal of said second transistor.

41. The amplifier according to claim 40, wherein an output signal of said output terminal of said push-pull output stage circuit is fed back as input to the inverting input terminal of said differential amplifying stage, and wherein a signal is supplied to the non-inverting input terminal of said differential amplifying stage.

42. A differential amplifier comprising:
a differential amplifying stage including: a non-inverting input terminal; an inverting input terminal; a first differential output terminal; and a second differential output terminal; and
an output amplifying stage including: an output terminal;
a first transistor connected across said output terminal and a first power supply for charging said output terminal based on a signal from said first differential output terminal;
a second transistor connected across said output terminal and a second power supply for discharging said output terminal based on a signal from said second differential output terminal;
a capacitor element; and
a capacitor connection control circuit for interchangeably switching at least between a first connection state in which said capacitor element is connected across said output terminal and said first differential output terminal and a second connection state in which said capacitor element is connected across said output terminal and said second differential output terminal.

43. The differential amplifier according to claim 42, wherein said first transistor and the second transistor are of first and second conductivity types, respectively.

44. The differential amplifier according to claim 42, wherein said capacitor connection control circuit includes a circuit for performing control so as to switch, between a first connection state in which a first terminal and a second terminal of said capacitor element are connected to said first differential output terminal and to said output terminal, respectively, and a second connection state in which the first terminal and the second terminal of said capacitor element are connected to said second differential output terminal and to said output terminal, respectively.

45. The differential amplifier according to claim 42, wherein said capacitor connection control circuit includes a circuit for performing control so as to switch, between a first connection state in which a first terminal and a second terminal of said capacitor element are connected to said first differential output terminal and to said output terminal, respectively, and a second connection state in which said first terminal and the second terminal of said capacitor element are connected to said output terminal and to said second differential output terminal, respectively.

46. The differential amplifier according to claim 42, wherein said capacitor element performs phase compensation in addition to bootstrap operation.

47. The differential amplifier according to claim 42, further comprising second and third capacitor elements each having one end connected to said output terminal and having the other end connected to said first and second differential output terminal.

48. The differential amplifier according to claim 42, wherein said capacitor connection control circuit includes:
a first capacitor element;
a first switch inserted across a first terminal of said first capacitor element and said first differential output terminal; and
a second switch inserted across said first terminal of said first capacitor element and said second differential output terminal;
a second terminal of said first capacitor element being connected to said output terminal; wherein
during a charging period of said output terminal, said first switch and said second switch are turned on and off, respectively; and
during a discharging period of said output terminal, said first switch and said second switch are turned off and on, respectively.

49. The differential amplifier according to claim 42, wherein said capacitor connection control circuit includes:
a first capacitor element;
a first switch inserted across the first terminal of said first capacitor element and said first differential output terminal;
a second switch inserted across the second terminal of said first capacitor element and said second differential output terminal;
a third switch inserted across a first terminal of said first capacitor element and said output terminal; and
a fourth switch inserted across the second terminal of said first capacitor element and said output terminal; wherein
during a charging period of said output terminal, said first and fourth switches are turned on and said second and third switches are turned off; and
during a discharging period of said output terminal, said first and fourth switches are turned off and said second and third switches are turned on.

50. The differential amplifier according to claim 42, wherein said capacitor connection control circuit includes:
a first capacitor element;
a first switch inserted across the first terminal of said first capacitor element and said first differential output terminal;
a second switch inserted across the second terminal of said first capacitor element and said second differential output terminal;
a third switch inserted across the first terminal of said first capacitor element and said output terminal; and
a fourth switch inserted across the second terminal of said first capacitor element and said output terminal; wherein
during a charging period of said output terminal, said first and fourth switches are turned off and said second and third switches are turned on; and
during a discharging period of said output terminal, said first and fourth switches are turned on and said second and third switches are turned off.

51. The differential amplifier according to claim 42, wherein said differential amplifying stage includes:
   a first current source connected to a high potential side power supply;
   a first differential pair composed by a transistor pair of a first conductivity type, driven by said first current source, and differentially receiving the voltage from an input pair constituting said non-inverting input terminal and the inverting input terminal;
   a first load circuit connected to an output pair of said first differential pair and constituted by a first cascode type current mirror circuit;
   a second current source connected to a low potential side power supply and constituted by a second cascode type current mirror circuit;
   a second differential pair composed by a transistor pair of a second conductivity type, driven by said second current source, and differentially receiving the voltage from an input pair constituting said non-inverting input terminal and the inverting input terminal; and
   a second load circuit connected to an output pair of said second differential pair;
   wherein the output ends of said first and second load circuit are connected to control terminals of said second and first transistors respectively;
   wherein the output pair of said first differential pair is connected to one of connection nodes at which adjacent current mirror circuits provided in said first cascode current mirror circuit are connected each other, with the output side of said one connection node being said second differential output terminal; and
   wherein the output pair of said second differential pair is connected one of connection nodes at which adjacent current mirror circuits provided in said second cascode current mirror circuit are connected each other, with the output side of said one connection node being said first differential output terminal.

52. The differential amplifier according to claim 51, wherein said first and second cascode type current mirror circuits have input side transistors coupled together via a first floating current source and output side transistors coupled together via a second floating current source; and
   wherein control terminals of said second and first transistors of said output amplifying stage are connected to a connection node of the output terminal of said first cascode type current mirror circuit and said second floating current source and to a connection node of the output terminal of said second cascode type current mirror circuit and said second floating current source.

53. A differential amplifier including:
   a differential amplifying stage; and
   an output amplifying stage;
   wherein said differential amplifying stage comprises:
   a first current source connected to a high potential side power supply;
   a first differential pair composed by a transistor pair of a first conductivity type, driven by said first current source, and differentially receiving the voltage from an input pair constituting said non-inverting input terminal and the inverting input terminal;
   a first load circuit connected to an output pair of said first differential pair and constituted by a first cascode current mirror circuit;
   a second current source connected to a low potential side power supply;
   a second differential pair composed by a transistor pair of a second conductivity type, driven by said second current source, and differentially receiving the voltage from an input pair constituting said non-inverting input terminal and the inverting input terminal; and
   a second load circuit connected to an output pair of said second differential pair and constituted by a first cascode current mirror circuit; and
   wherein said output amplifying stage comprises:
   an output terminal;
   a first transistor connected across said output terminal and a first power supply for charging the output terminal based on an output of said second load circuit;
   a second transistor connected across said output terminal and a second power supply for discharging the output terminal based on an output of said first load circuit;
   at least a capacitor element; and
   a capacitor connection control circuit for interchangeably switching at least between a first connection state in which said capacitor element is connected across said output terminal and one of connection nodes at which adjacent current mirror circuits constituting said second cascode current mirror circuit are connected each other, and a second connection state in which said capacitor element is connected across said output terminal and one of connection nodes at which adjacent current mirror circuits constituting said first cascode current mirror circuit are connected each other.

54. A data driver for a display device comprising a differential amplifier according to claim 42 as a buffer unit.

55. A data driver for a display device comprising a differential amplifier according to claim 42 as a buffer unit, wherein control for connection switching of said capacitor element is managed depending on a polarity signal.

56. A display device comprising a differential amplifier according to claim 42 as a circuit driving a data line.

57. The output circuit of claim 26, wherein,
   said switching control circuit receives the control signal to perform i) the first control, under a first control signal condition, so as to connect said first capacitor element across said output terminal and the control terminal of said first transistor and ii) the second control, under a second control signal condition, so as to connect said first capacitor element across said output terminal and the control terminal of said second transistor.

* * * * *